United States Patent
Adams et al.

(10) Patent No.: US 11,668,731 B2
(45) Date of Patent: *Jun. 6, 2023

(54) FORCE DEFLECTION AND RESISTANCE TESTING SYSTEM AND METHOD OF USE

(71) Applicant: Modus Test, LLC, Richardson, TX (US)

(72) Inventors: Lynwood Adams, Rockwall, TX (US); Jack Lewis, Royse City, TX (US)

(73) Assignee: Modus Test, LLC, Richardson, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 17/712,392

(22) Filed: Apr. 4, 2022

(65) Prior Publication Data

US 2022/0221489 A1 Jul. 14, 2022

Related U.S. Application Data

(63) Continuation of application No. 16/882,917, filed on May 26, 2020, now Pat. No. 11,313,880, which is a (Continued)

(51) Int. Cl.
*G01R 31/04* (2006.01)
*G01R 1/073* (2006.01)
(Continued)

(52) U.S. Cl.
CPC ....... *G01R 1/07328* (2013.01); *G01R 1/0466* (2013.01); *G01R 1/07314* (2013.01); (Continued)

(58) Field of Classification Search
CPC .............. G01R 1/07328; G01R 1/0466; G01R 1/07314; G01R 31/2879; G01R 31/2886; (Continued)

(56) References Cited

U.S. PATENT DOCUMENTS

2005/0035754 A1* 2/2005 Ho ..................... G01R 31/2896 324/756.05
2016/0209443 A1* 7/2016 Adams ............... G01R 31/2886
(Continued)

*Primary Examiner* — Raul J Rios Russo
(74) *Attorney, Agent, or Firm* — Brownwinick Law Firm; Christopher A. Proskey

(57) ABSTRACT

A testing system for electrical interconnects having a removable device under test printed circuit board (DUT PCB) that electrically connects with the electrical testing components of the system. A removable top plate is placed on top of the DUT PCB and is locked in place by a plurality of locking posts that selectively connect to cam surfaces in the top plate that pull the top plate down sandwiching the DUT PCB between the top plate and the electrical testing components of the system. An actuator is also presented that presses the device under test into the electrical interconnect at increments where tests are performed on one, some or all of the contact points of the electrical interconnect. This information is then analyzed and graphed to assist with determine the optimum force and/or height to use during actual use.

47 Claims, 46 Drawing Sheets

Related U.S. Application Data continuation of application No. 16/181,846, filed on Nov. 6, 2018, now Pat. No. 10,705,120, which is a continuation of application No. 15/462,383, filed on Mar. 17, 2017, now Pat. No. 10,156,586, which is a continuation-in-part of application No. 14/996,045, filed on Jan. 14, 2016, now Pat. No. 9,885,737.

(60) Provisional application No. 62/104,117, filed on Jan. 16, 2015.

(51) Int. Cl.
| | |
|---|---|
| *G01R 31/28* | (2006.01) |
| *G01R 1/04* | (2006.01) |
| *G01R 31/69* | (2020.01) |
| *G01R 31/66* | (2020.01) |
| *G01R 31/54* | (2020.01) |
| *G01R 31/52* | (2020.01) |
| *G01R 31/67* | (2020.01) |
| *G01R 31/50* | (2020.01) |

(52) U.S. Cl.
CPC ..... *G01R 31/2879* (2013.01); *G01R 31/2886* (2013.01); *G01R 31/54* (2020.01); *G01R 31/66* (2020.01); *G01R 31/69* (2020.01); *G01R 31/2889* (2013.01); *G01R 31/2896* (2013.01); *G01R 31/50* (2020.01); *G01R 31/52* (2020.01); *G01R 31/67* (2020.01)

(58) Field of Classification Search
CPC ........... G01R 31/2889; G01R 31/2896; G01R 31/69; G01R 31/66; G01R 31/54; G01R 31/52; G01R 31/67; G01R 31/50
USPC ... 324/66, 71, 378, 403, 415, 425, 500, 537, 324/538
See application file for complete search history.

(56) References Cited

U.S. PATENT DOCUMENTS

| | | | |
|---|---|---|---|
| 2017/0192046 A1* | 7/2017 | Adams | G01R 1/07314 |
| 2019/0072585 A1* | 3/2019 | Adams | G01R 1/0466 |
| 2020/0088787 A1* | 3/2020 | Ochotorena, Jr | G01R 31/69 |
| 2020/0319231 A1* | 10/2020 | Adams | G01R 1/0466 |

* cited by examiner

MPT SFDR Analysis Report

Filtered Cumulative FDR per contactor for N FDR(s)

| Series N | N | Test Count | X-Param | Y-Param | Mean | Min | Max | StdDev | MCR Mean | LCR Min | MCR Max | LCR StdDev | CS/Fit |
|---|---|---|---|---|---|---|---|---|---|---|---|---|---|
| 1 | 10 | 31 | Test Z mm | Test Force kg | 6.4195 | 4.1430 | 8.3880 | 1.0566 | 0.0000 | 100,000,000,000.0000 | -1,000.0000 | 0.0000 | Test Force kg vs Test Z mm C:\Users\Jack Lewia\Desktop\ADI_TRAINING\Unpropped FDR\Unpropped FDR\DE_DZ_De-Embed\ |
| 2 | 0 | 31 | Test Z mm | Mean | 34.5467 | -0.0021 | 990.6578 | 119.5593 | 0.0022 | -0.0021 | 0.0076 | 0.0022 | Mean vs Test Z mm C:\Users\Jack Lewia\Desktop\ADI_TRAINING\Unpropped FDR\Unpropped FDR\DE_DZ_De-Embed\ |

FIG. 30

STD-DEV of CRES vs displacement / Pin x versus contactor array for N FDR(s) mean

| Series # | N | Test Count | X-Parm 1 | | Mean | Min | Max | Stdev | WOR Mean | WOR Min | WOR Max | WOR StdDev | Log / Dir |
|---|---|---|---|---|---|---|---|---|---|---|---|---|---|
| 1 | 10 | 31 | Test Z mm | Stdev | 211.5632 | 0.0019 | 2,994.6995 | 536.4298 | 0.0032 | 0.0019 | 0.0054 | 0.0007 | Stdev vs Test Z mm C:\Users\Jack Lewia\Desktop\ADI_TRAINING\Unpropped FDR\Unpropped FDR\DE_DZ_De-Embed\ |

FIG. 34

MPT Analysis Report 

SFDR (System Force Deflection Resistance) Study Results on 212 BGA test socket using spring pin technology.

SFDR conducted using MPT and MTC with 212 BGA test package with internally shorted bond-wires to create shorting device. The bond-wire resistance has been electrically de-embed using built in tools in the MPT analysis suite. The data below was not mechanically de-embed but could be using the built-in mechanical de-embed tools also included in the MPT analysis suite.

This SFDR study consisted of 10 different package units actuated in 0.010 mm steps across a 0.300 mm working range. End of working range was determined by the spec test force for the socket per manufacturer spec. The MTC has a 0.001 mm step resolution.

Filtered Cumulative SFDR per contactor for N FDR(s)

| Series # | N Test Count | X-Parm | Y-Parm | Mean | Min | Max | StdDev | WOR Mean | WOR Min | WOR Max | WOR StdDev | Log / Dir |
|---|---|---|---|---|---|---|---|---|---|---|---|---|
| 1 | 9 31 | Test Z mm | Test Force kg | 6.8110 | 3.9000 | 9.3780 | 1.1456 | 0.0000 | 100,000,000,000.0000 | -1,000.0000 | 0.0000 | Test Force kg vs Test Z mm C:\ModusTestAutomation\DEMO\ |
| 2 | 0 31 | Test Z mm | Mean | 0.0031 | -0.0020 | 0.0139 | 0.0027 | 0.0024 | -0.0020 | 0.0093 | 0.0021 | Mean vs Test Z mm C:\ModusTestAutomation\DEMO\ |

FIG. 36

STD-DEV of CRES vs displacement / Pin x versus contactor array for N FDR(s) mean

| Series # | N | Test Count | X-Parm | Y-Parm | Mean | Min | Max | StdDev | WOR Mean | WOR Min | WOR Max | WOR StdDev | Log/Dir |
|---|---|---|---|---|---|---|---|---|---|---|---|---|---|
| 1 | 9 | 31 | Test Z mm | Stdev | 0.0081 | 0.0021 | 0.0684 | 0.0107 | 0.0051 | 0.0021 | 0.0481 | 0.0044 | Stdev vs Test Z mm C:\ModusTestAutomation\DEMO\ |

FIG. 38

Raw Cumulative Scatter FDR chart per contactor for N FDR datasets

| Series # | N | Test Count | X-Parm | Y-Parm | Mean | Min | Max | StdDev | WOR Mean | WOR Min | WOR Max | WOR StdDev | Log / Dir |
|---|---|---|---|---|---|---|---|---|---|---|---|---|---|
| 1 | 9 | 31 | Test Count | Mean | 0.0031 | -0.0020 | 0.0139 | 0.0027 | 0.0000 | 100,000,000,000,000.0000 | -1,000.0000 | 0.0000 | Mean vs Test Count C:\ModuleTestAutomation\DEMO\ |

FIG. 40

FORCE DEFLECTION AND RESISTANCE TESTING SYSTEM AND METHOD OF USE

CROSS-REFERENCE TO RELATED APPLICATIONS

This application is a continuation of U.S. patent application Ser. No. 16/882,917 which was filed on May 26, 2020, which is a continuation of U.S. patent application Ser. No. 16/181,846, filed on Nov. 6, 2018, which is a continuation of U.S. patent application Ser. No. 15/462,383 which was filed on Mar. 17, 2017, which is a continuation-in-part of U.S. patent application Ser. No. 14/996,045 which was filed on Jan. 14, 2016, which claims priority to U.S. Provisional Patent Application No. 62/104,117 which was filed on Jan. 16, 2015, all of which are hereby incorporated by reference herein in their entirety, including any figures, tables, or drawings.

FIELD OF THE DISCLOSURE

This disclosure relates to a testing system. More specifically and without limitation, this disclosure relates to a testing system for electrical interconnects, and related method of use.

BACKGROUND OF THE DISCLOSURE

Along with the development of semiconductor chips, a need developed to test these semiconductor chips to ensure that they are manufactured within specified tolerances and function properly. Many manufacturers of semiconductor chips such as Intel®, AMD®, Xilinx®, Texas Instruments®, NVIDIA®, Qualcomm® among countless others manufacture semiconductor chips which are then tested by a chip testing system having a device under test printed circuit board (DUT PCB) with an electrical interconnect that is attached thereto. The DUT PCB and electrical interconnects are generally custom made to fit each specific semiconductor chip, making them quite expensive.

Manufacturers tend to simultaneously manufacture a variety of semiconductor chips within their facilities to maximize their overhead and equipment utilization rates. Due to these multiple product lines, manufacturers have a need to test a variety of semiconductor chips at the same time, each type of chip requiring a special electrical test interconnect. Since cleanroom space is extremely limited it is undesirable to have a dedicated testing machine for each type of electrical interconnect. Conventional testing systems are not capable of testing a plurality of electrical interconnects, nor are conventional testing systems easily converted between configurations for testing different electrical interconnects.

Therefore, manufacturers of semiconductor chips have a need for a testing electrical interconnects that is capable of testing a variety of electrical interconnects, and one that quickly and easily converts between testing various electrical interconnects, which are problems not solved by the prior art. Manufacturers of semiconductor chips further have a need for this testing system to be as small as possible to maximize valuable cleanroom space.

Thus, it is a primary object of the disclosure to provide a quick change small footprint testing system and method of use that improves upon the state of the art.

Another object of the disclosure is to provide a quick change small footprint testing system and method of use that quickly converts between configurations for testing different electrical interconnects.

Yet another object of the disclosure is to provide a quick change small footprint testing system and method of use that easily converts between configurations for testing different electrical interconnects.

Another object of the disclosure is to provide a quick change small footprint testing system and method of use that is easy to use.

Yet another object of the disclosure is to provide a quick change small footprint testing system and method of use that provides accurate testing for electrical interconnects.

Another object of the disclosure is to provide a quick change small footprint testing system and method of use that can be used with a wide variety of electrical interconnects.

Yet another object of the disclosure is to provide a quick change small footprint testing system and method of use that is relatively inexpensive.

Another object of the disclosure is to provide a quick change small footprint testing system and method of use that has a long useful life.

Yet another object of the disclosure is to provide a quick change small footprint testing system and method of use that has a small footprint.

Another object of the disclosure is to provide a quick change small footprint testing system and method of use that minimizes the amount of space required to test a variety of electrical interconnects.

Yet another object of the disclosure is to provide a quick change small footprint testing system and method of use that minimizes the capital cost for testing equipment for testing a variety of electrical interconnects.

Another object of the disclosure is to provide a quick change small footprint testing system and method of use that provides for quick removal of and replacement of DUT PCBs having electrical interconnects thereon.

Yet another object of the disclosure is to provide a quick change small footprint testing system and method of use that is high quality.

Another object of the disclosure is to provide a quick change small footprint testing system and method of use that is durable.

Yet another object of the disclosure is to provide an improved method of testing the performance of an electrical interconnect.

Another object of the disclosure is to provide an improved system for testing the performance of an electrical interconnect.

Yet another object of the disclosure is to provide a method of testing the performance of an electrical interconnect that closely correlates with how the electrical interconnect will perform in actual-use.

These and other objects, features, or advantages of the present disclosure will become apparent from the specification and claims.

SUMMARY OF THE DISCLOSURE

A testing system is presented having a bottom plate, a frame member and a socket plate. The socket plate holds and the frame member houses a plurality of electrical testing components therein. A removable device under test (DUT) printed circuit board (PCB) is placed on top of the socket plate and electrically connects with the electrical testing components. A removable top plate is placed on top of the DUT PCB and is locked in place by a plurality of locking posts connected to an actuating mechanism. The locking posts connect to cam surfaces in the top plate that selectively hold the top plate in place thereby sandwiching the DUT PCB between the top plate and the socket plate. The DUT PCB is quickly and easily removed and replaced by activating the actuating mechanism and removing the top plate. In this way, a single testing system can be used to test a great variety of semiconductor chips thereby reducing capital equipment costs and space needed in cleanrooms. A actuator is also presented that presses the device under test into the electrical interconnect at increments where tests are performed on one, some or all of the contact points of the electrical interconnect. This information is then analyzed and graphed to assist with determine the optimum force and/or height to use during actual use.

BRIEF DESCRIPTION OF THE DRAWINGS

FIG. 30 is an exemplary chart of data from an example test using the system presented in FIGS. 25-29, the chart showing "Filtered Cumulative FDR per contactor for N FDR(s);

FIG. 34 is an exemplary chart of data from an example test using the system presented in FIGS. 25-29, the chart showing "STD-DEV of CRES v. displacement/Pin x versus contactor array for N FDR (s) mean";

FIG. 36 is a second exemplary chart of data from an example test using the system presented in FIGS. 25-29, the chart showing "Filtered Cumulative SFDR per contactor for N FDR(s)";

FIG. 38 is a second exemplary chart of data from an example test using the system presented in FIGS. 25-29, the chart showing "STD-DEV of CRES vs. displacement/Pin x versus contactor array for N. FDR(s) mean";

FIG. 40 is a second exemplary chart of data from an example test using the system presented in FIGS. 25-29, the chart showing "Raw Cumulative Scatter FDR chart per contactor for N FDR datasets;

DETAILED DESCRIPTION OF THE DISCLOSURE

Figure 1:
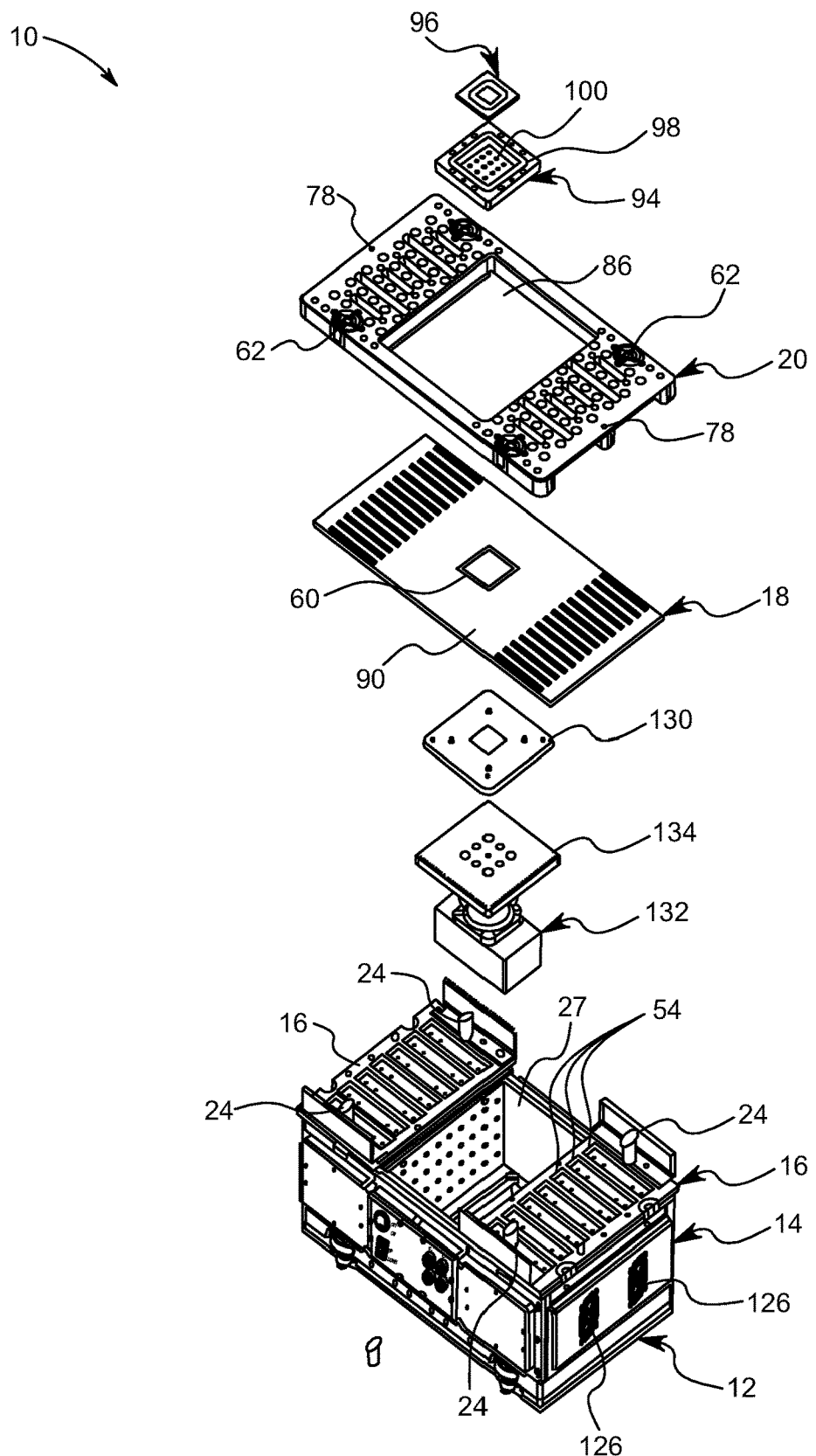
FIG. 1 is an exploded perspective view of a testing system, the view showing the frame member, with the pedestal support, sprite stiffener, DUT PCB, top plate, electrical interconnect and DUT separated from the frame member.
Figure 2:
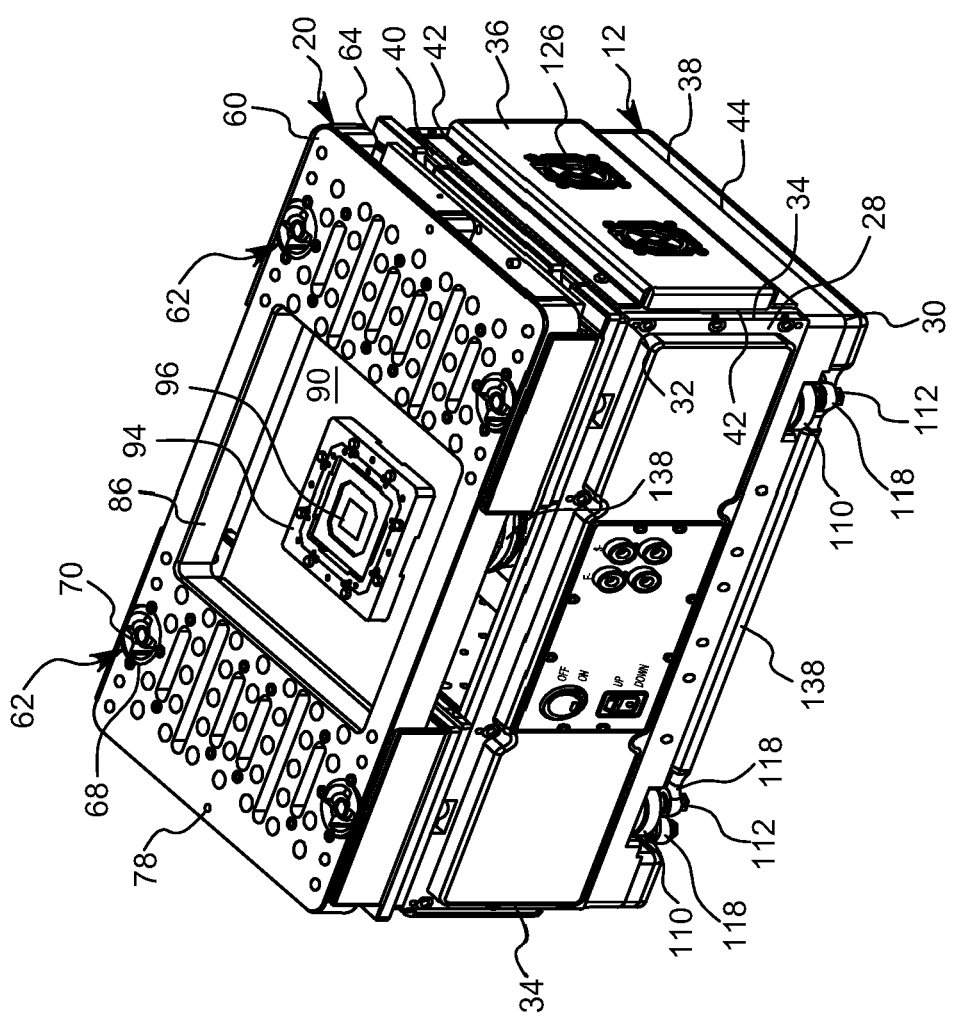
FIG. 2 is a perspective view of the testing system of FIG. 1, the view showing the frame member, DUT PCB, top plate, electrical interconnect and DUT assembled onto the frame member.
Figure 3:
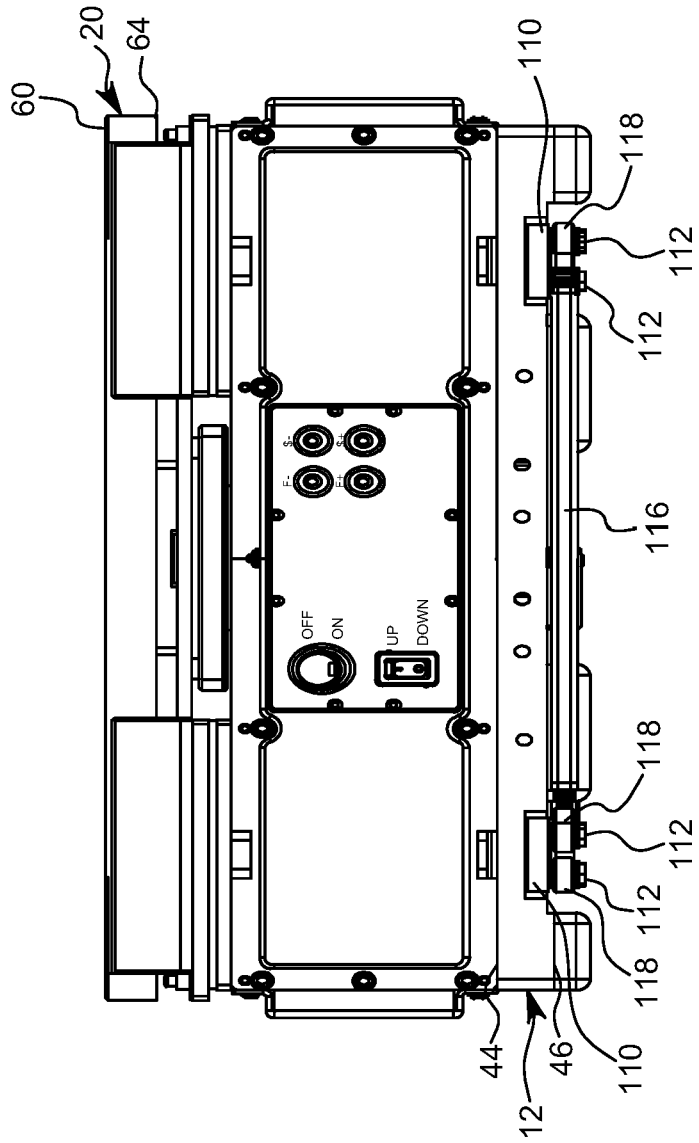
FIG. 3 is a side elevation view of the assembled testing system of FIG. 2.
Figure 4:
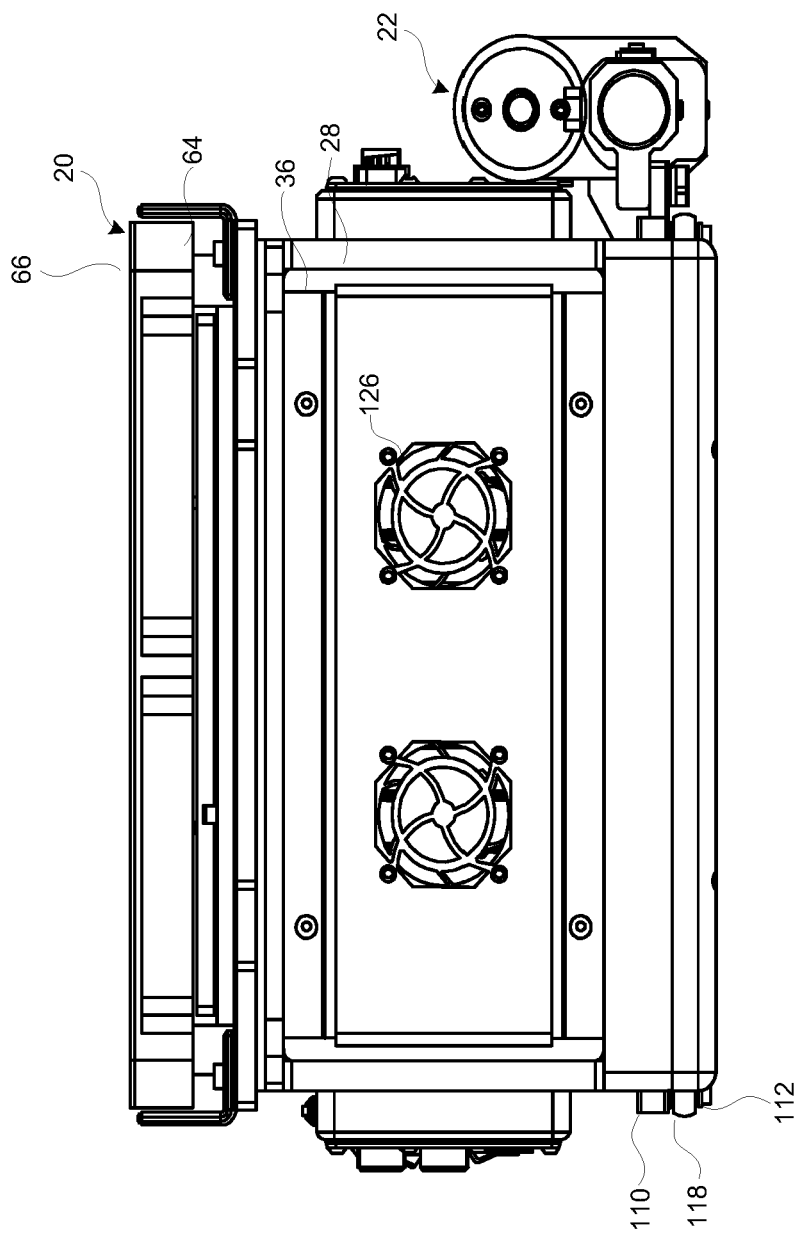
FIG. 4 is an end elevation view of the assembled testing system of FIG. 2.
Figure 5:
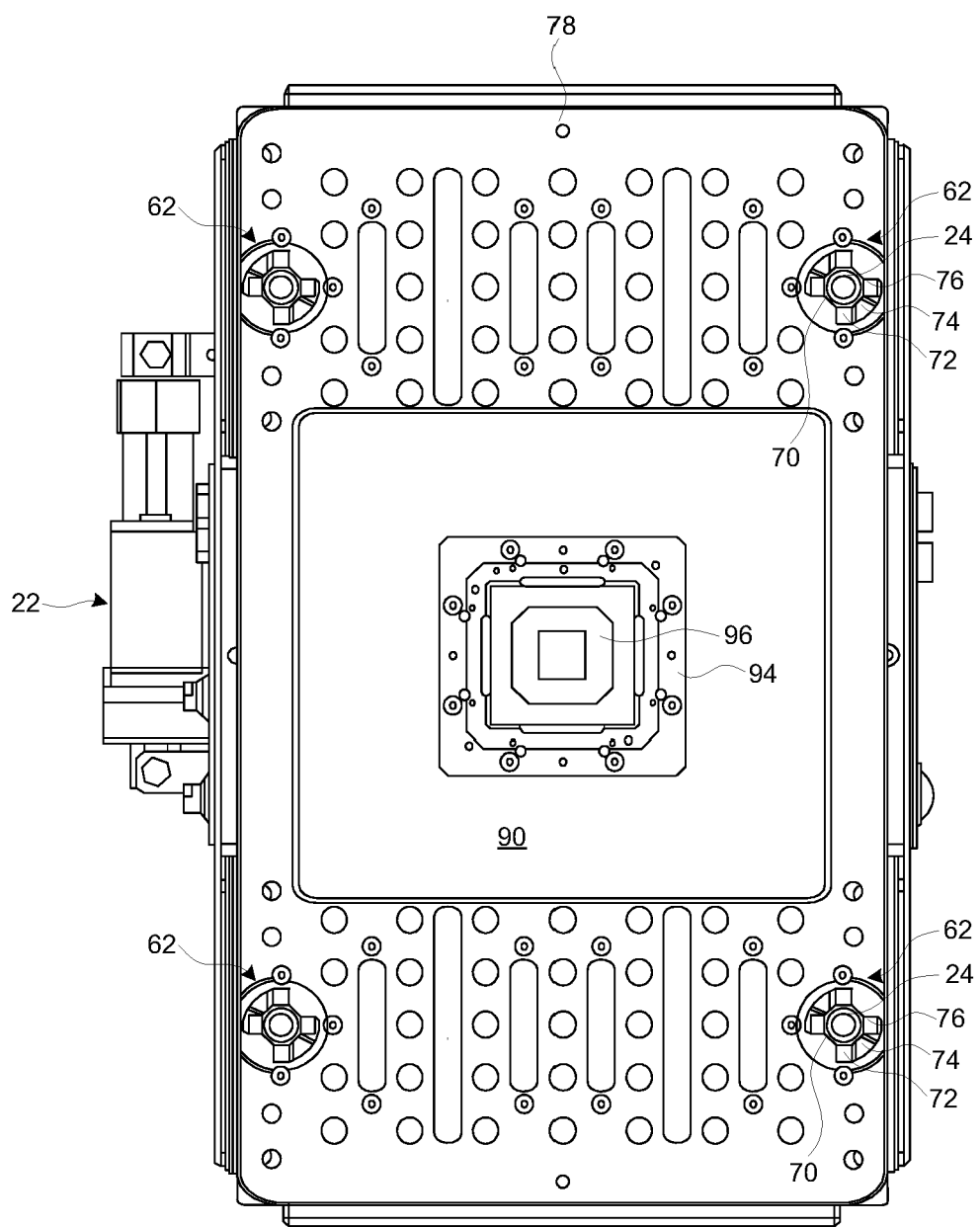
FIG. 5 is a top elevation view of the assembled testing system of FIG. 2.
Figure 6:
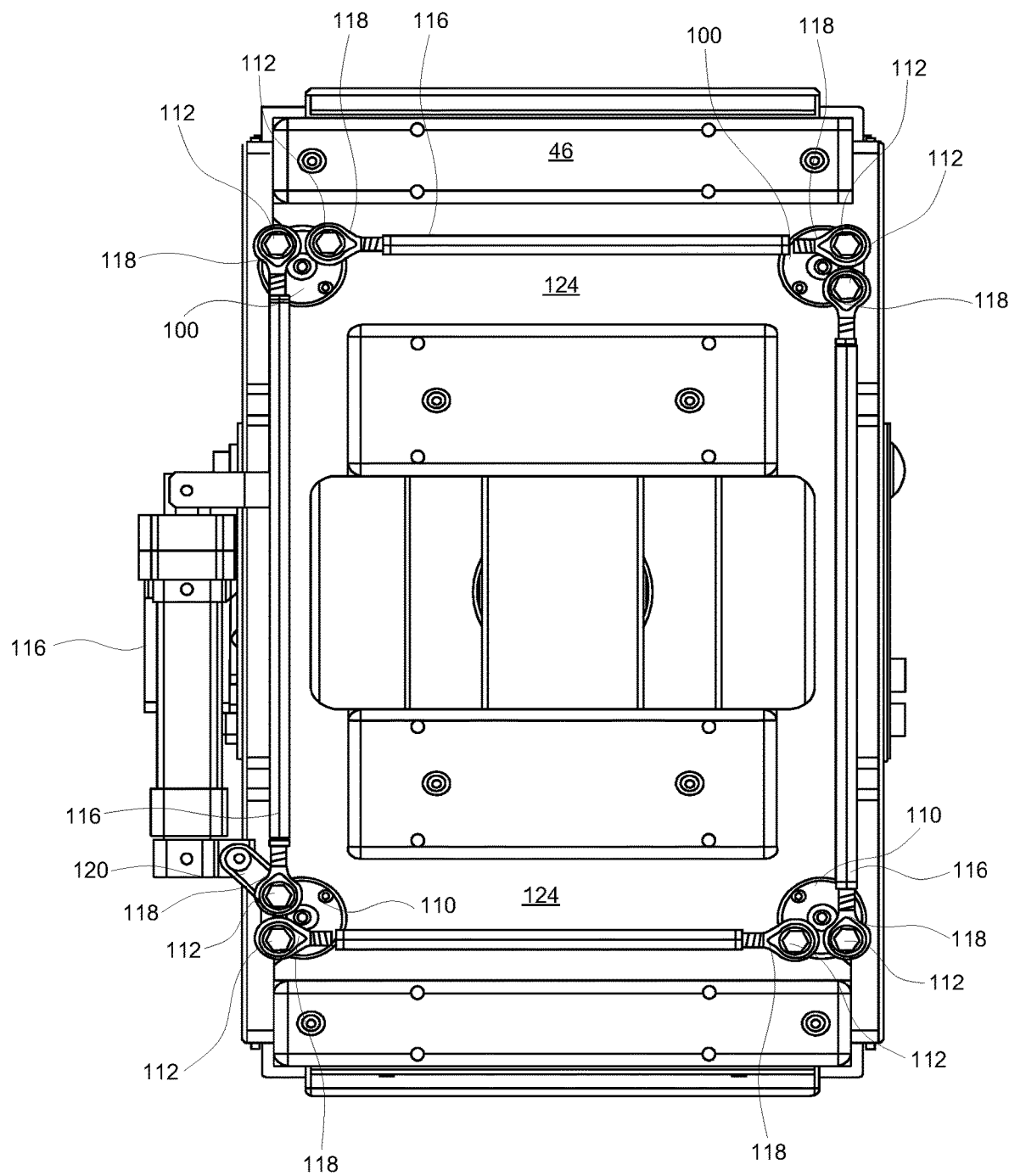
FIG. 6 is a bottom elevation view of the assembled testing system of FIG. 2.
Figure 7:
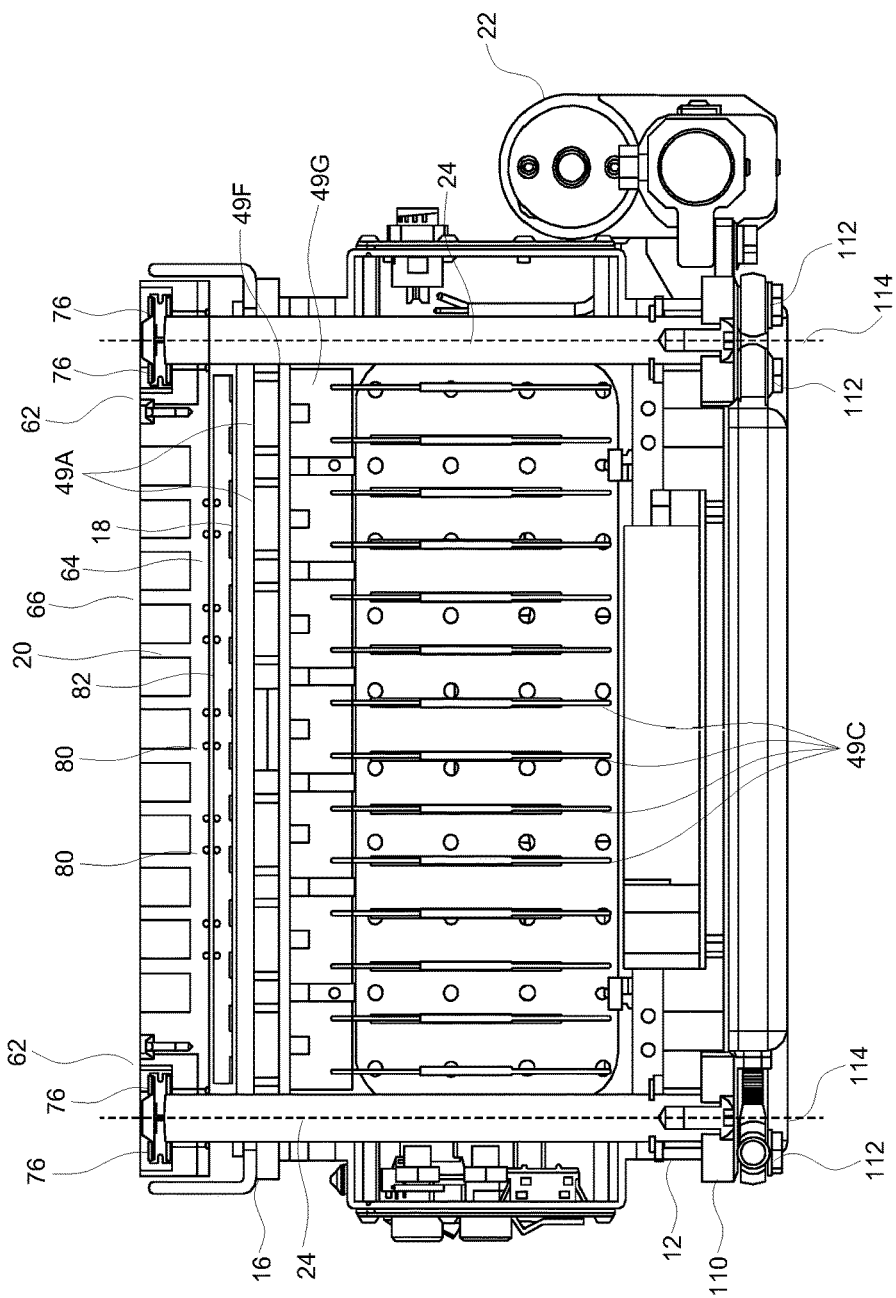
FIG. 7 is a cut-away elevation view through an end of the assembled testing system of FIG. 2, the view cut through the rotation of axis of the locking posts, the view showing the electrical testing boards connected by edge connectors into the sockets, the sockets connected to the tester PCB, the tester PCB connected to the socket plates and the bottom side of the capsules, the capsules electrically connect to the DUT PCB, and the floating plate pressing down on the DUT PCB and the top plate pressing down on the floating plate by compressed compressible members; the view also showing the protrusions of the locking posts held within the cam members of the top plate.
Figure 8:
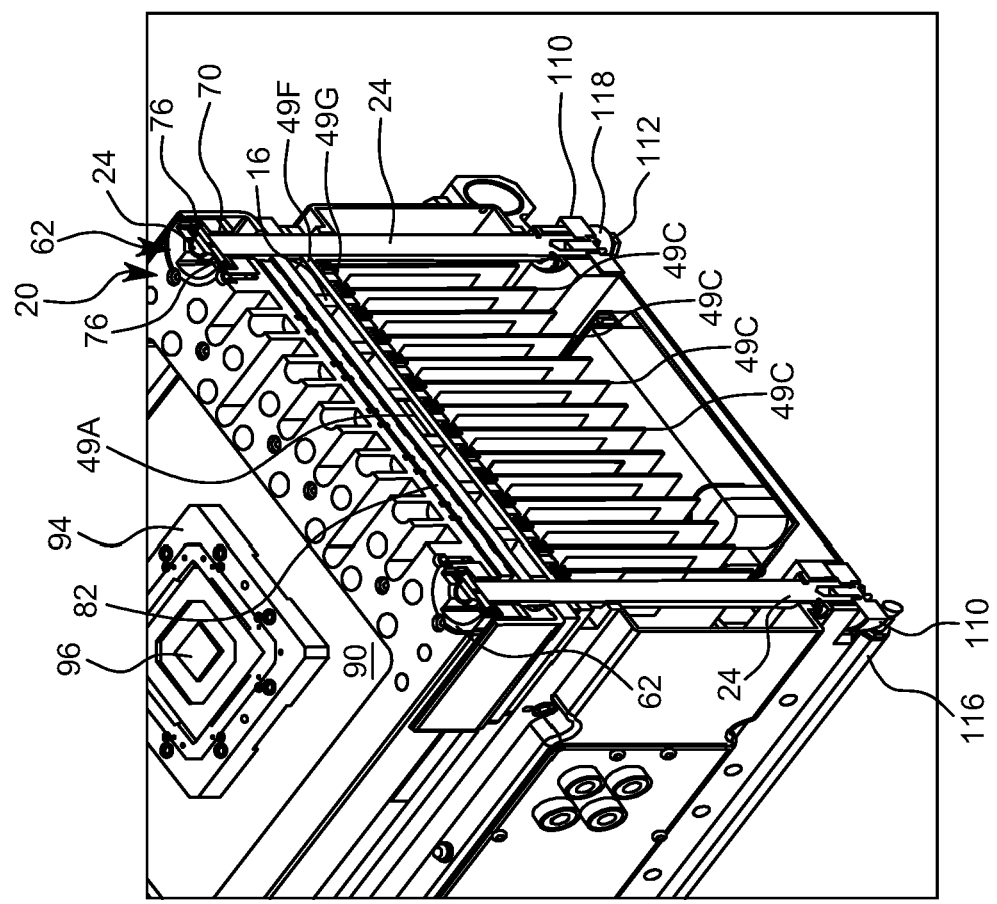
FIG. 8 is a perspective view of the cut away view of FIG. 7, the figure also showing the testing aperture in the top plate and the electrical interconnect connected to the upper surface of the DUT PCB and a DUT positioned within the electrical interconnect.
Figure 9:
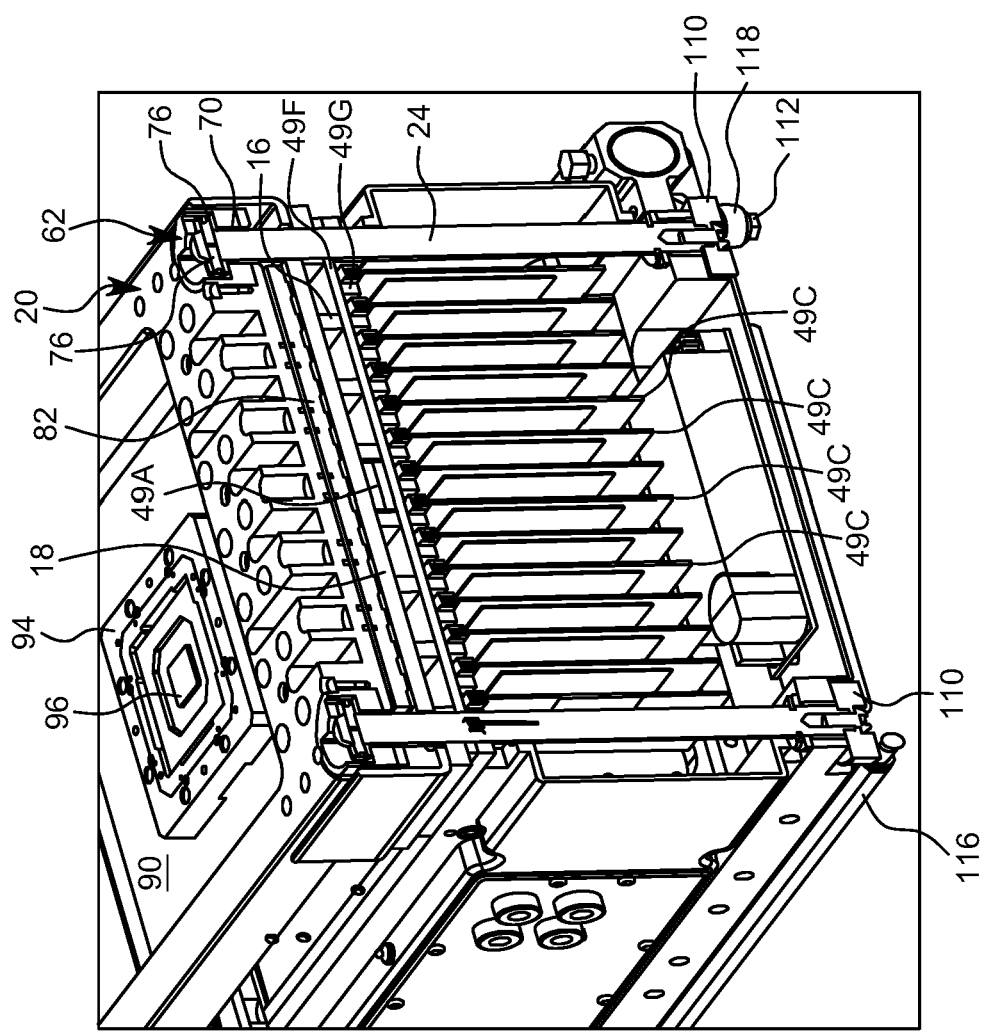
FIG. 9 is a second perspective view of the cut away view of FIG. 7, the figure also showing the testing aperture in the top plate and the electrical interconnect connected to the upper surface of the DUT PCB and a DUT positioned within the electrical interconnect.
Figure 10:
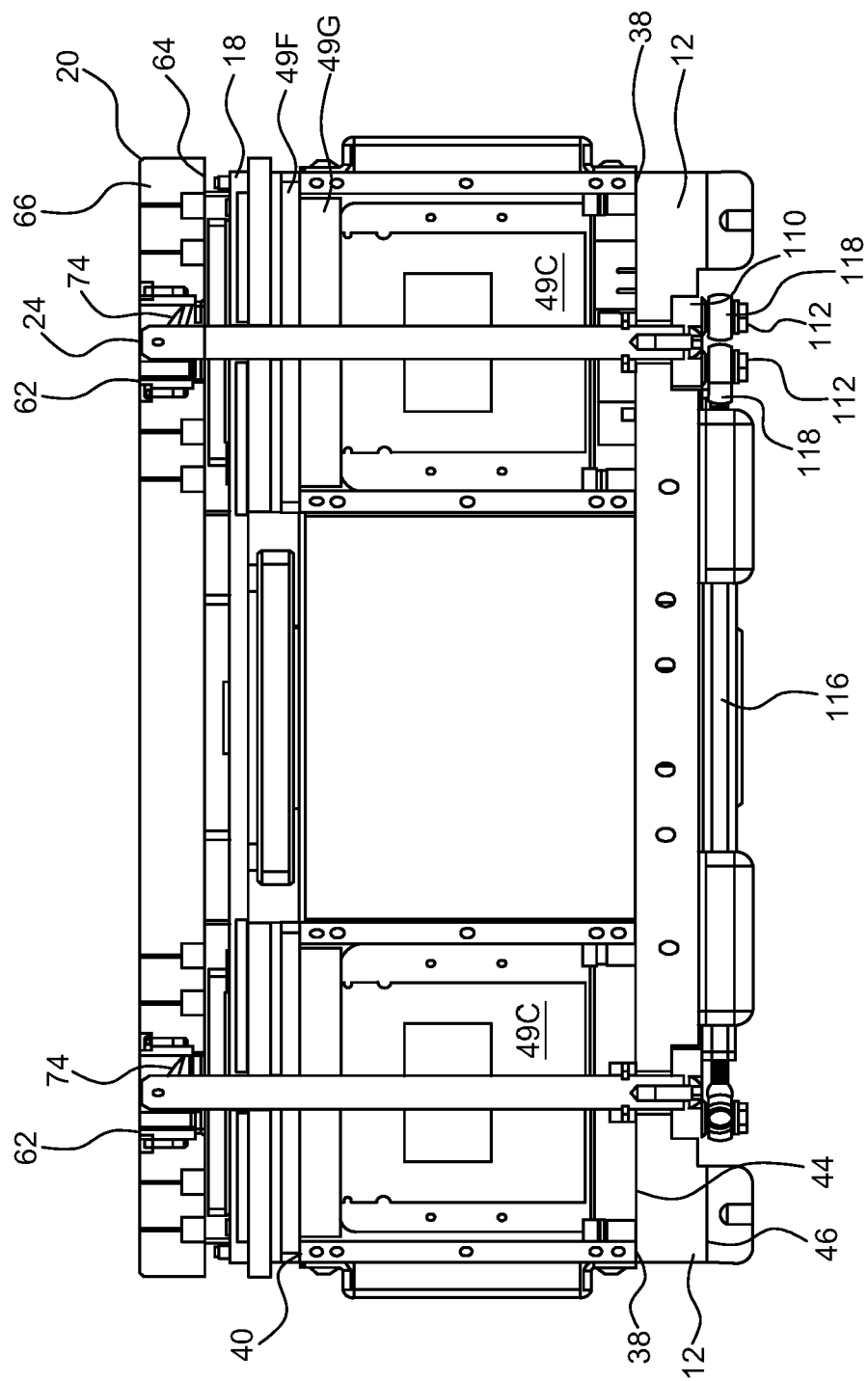
FIG. 10 is a cut-away elevation view through a side of the assembled testing system of FIG. 2, the view cut through the rotation of axis of the locking posts, the view showing the electrical testing boards connected by edge connectors into the sockets, the sockets connected to the tester PCB, the tester PCB connected to the socket plates and the bottom side of the capsules, the capsules electrically connect to the DUT PCB, and the floating plate pressing down on the DUT PCB and the top plate pressing down on the floating plate by compressed compressible members; the view also showing the protrusions of the locking posts held within the cam members of the top plate.
Figure 11:
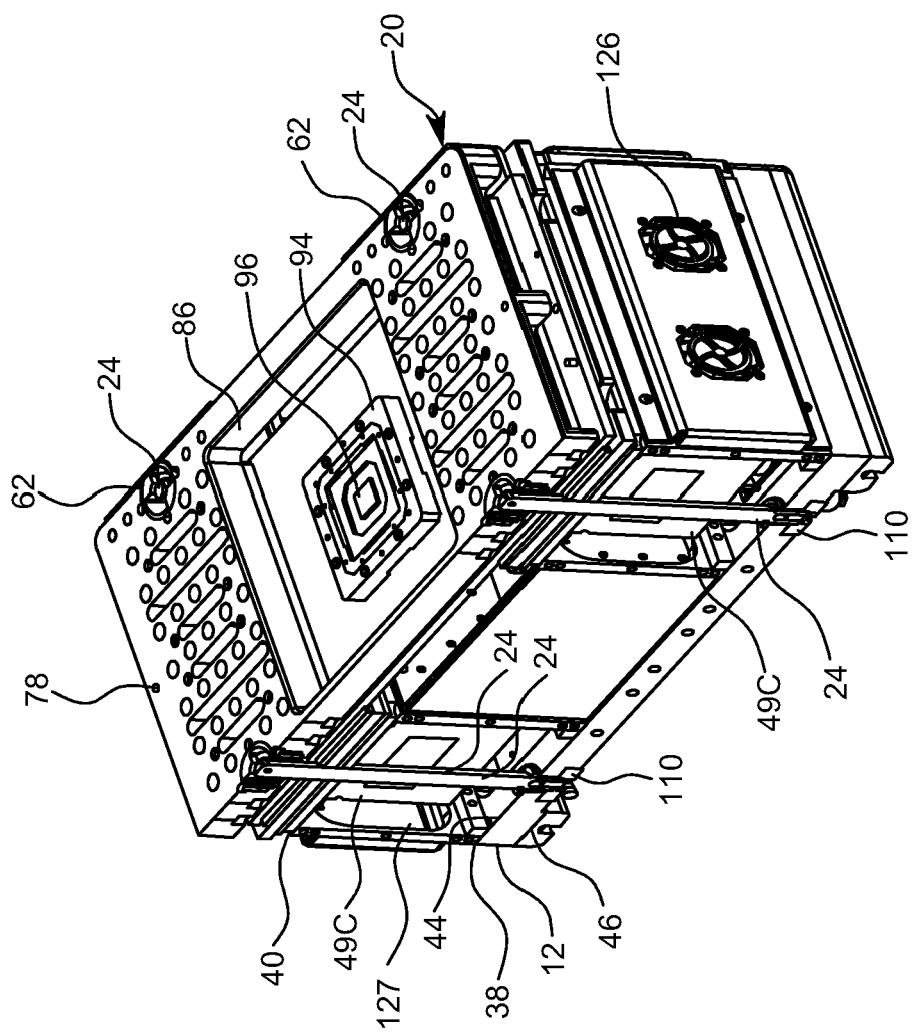
FIG. 11 is a perspective view of the cut away view of FIG. 10, the figure also showing the testing aperture in the top plate and the electrical interconnect connected to the upper surface of the DUT PCB and a DUT positioned within the electrical interconnect.
Figure 12:
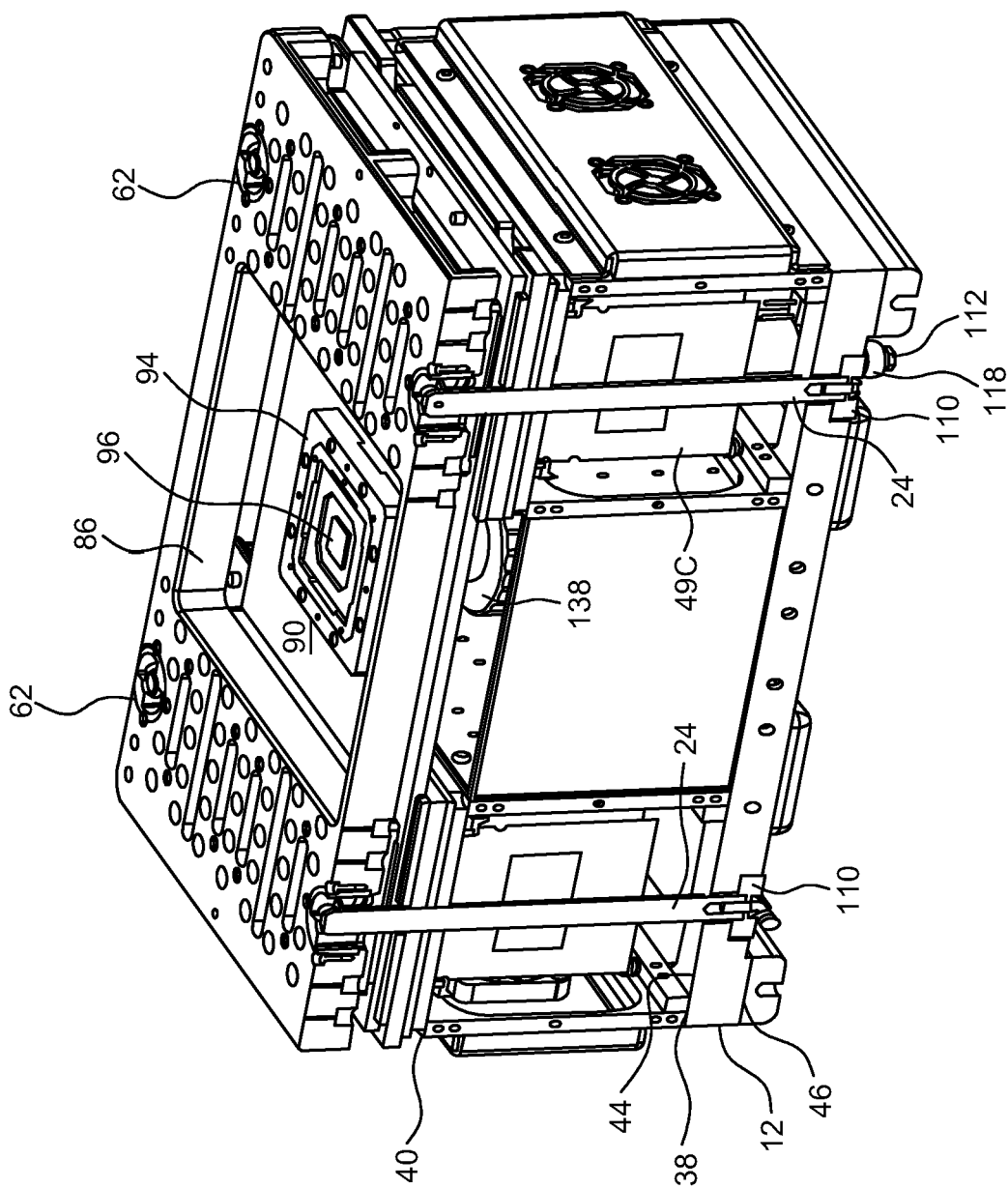
FIG. 12 is a second perspective view of the cut away view of FIG. 10, the figure also showing the testing aperture in the top plate and the electrical interconnect connected to the upper surface of the DUT PCB and a DUT positioned within the electrical interconnect.
Figure 13:
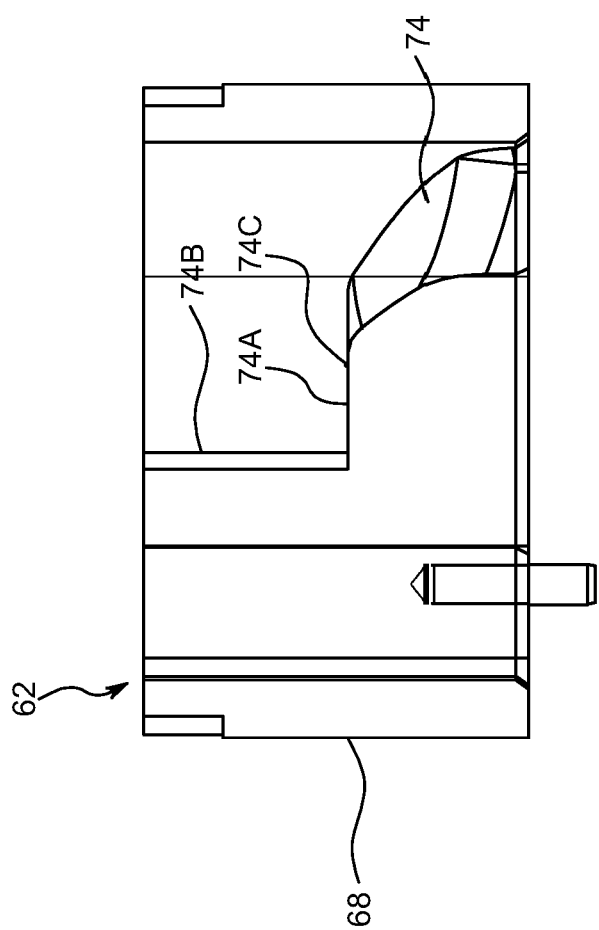
FIG. 13 is a side elevation cut-away view of a cam member, the view showing the cam surface next to the key slot opening, the cylindrical opening, the flat upper surface and the stop surface.
Figure 14:
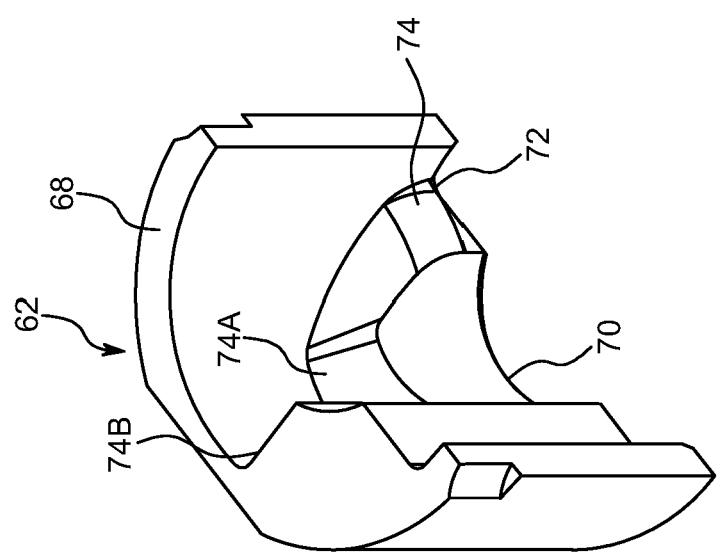
FIG. 14 is a perspective view of the cut away view of FIG. 13.
Figure 15:
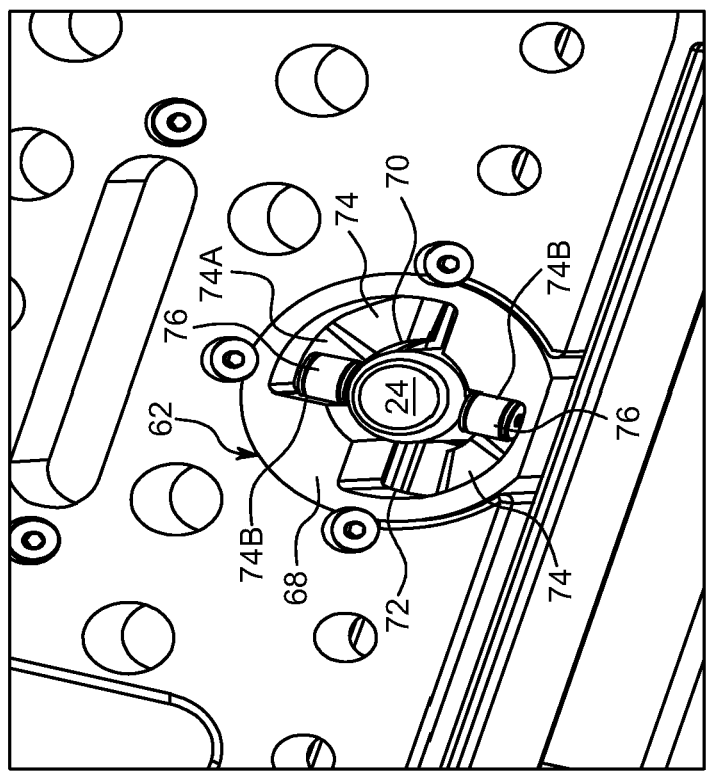
FIG. 15 is a perspective view of the upper surface of the top plate showing a close up view of a cam member with a locking post inserted therein and in an engaged position wherein the protrusions are in engagement with the stop surfaces and sitting on the flat upper surfaces; the view showing the key slot openings and the cylindrical opening, the view also showing the cam surfaces.
Figure 16:
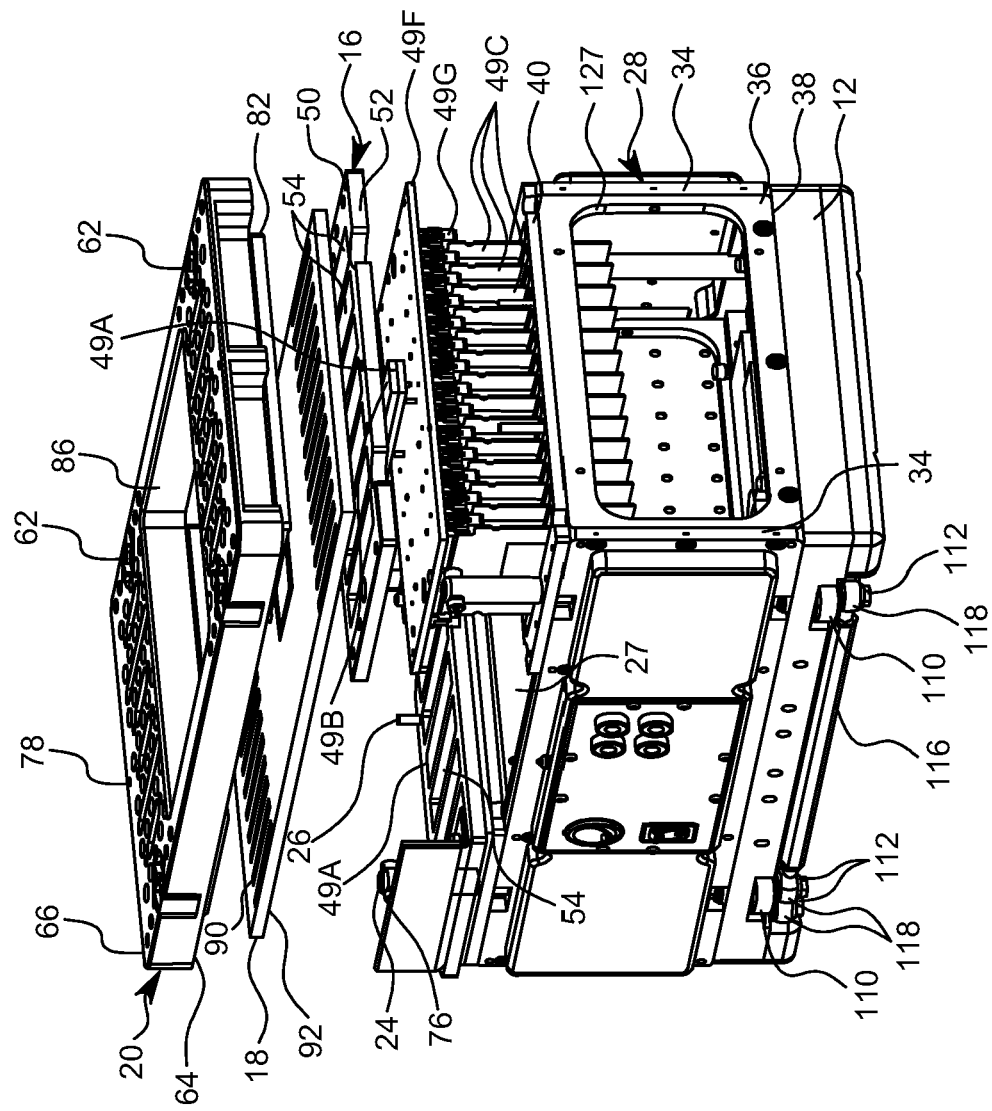
FIG. 16 is an exploded perspective view of the system, the view showing the top plate, the DUT PCB exploded off of the frame member; the view also showing one side of the system having the socket plate with socket openings exploded off of the tester PCB with a capsule in a demonstrative position below a socket opening; the view showing electrical testing cards connected by edge connectors to sockets connected to the lower surface of tester PCB; the view also showing the opening for air flow into the end wall.
Figure 17:
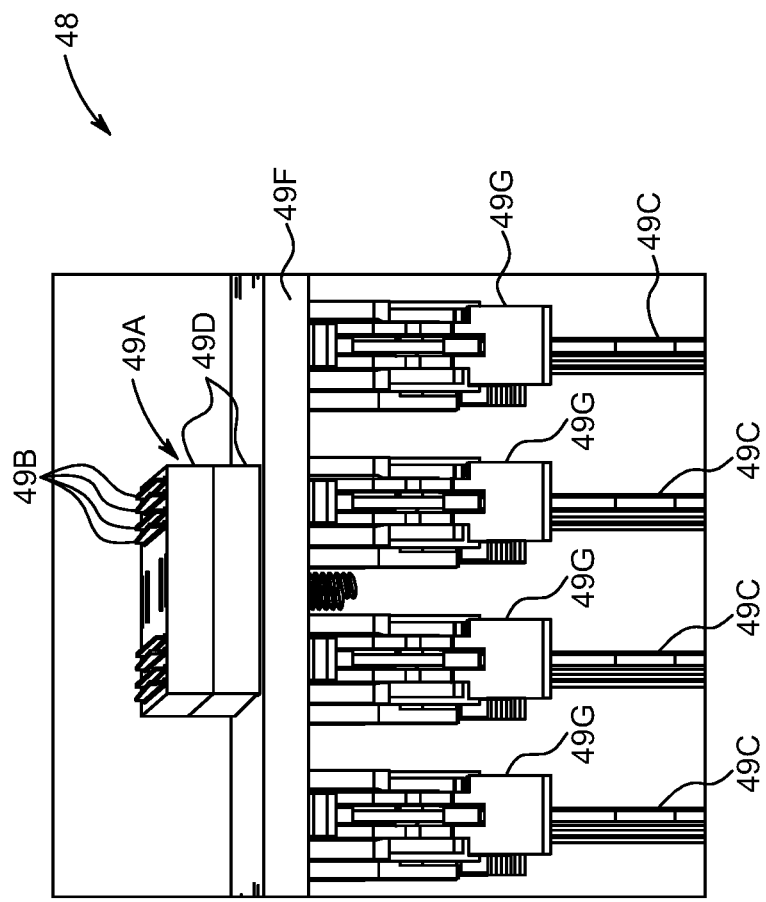
FIG. 17 is a close up perspective view showing a capsule with compressible electrical contacts extending upward from the capsule's upper surface, the capsule connected to the upper surface of a tester PCB; the view also a plurality of sockets connected to the lower surface of the tester PCB, the sockets holding an electrical testing board by way of an edge connector therein.
Figure 18:
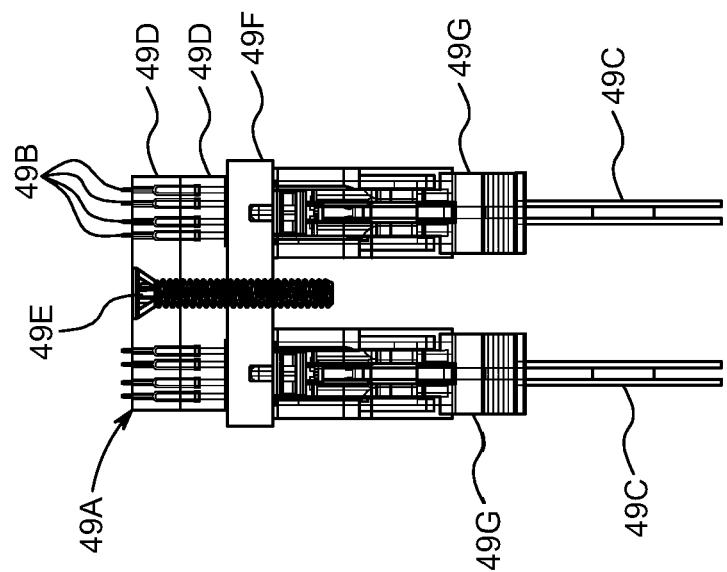
FIG. 18 is a close-up side elevation view of two sockets, a portion of the tester PCB and a capsule; the view showing various components in hidden lines including a fastener and the compressible electrical components including the springs therein.
Figure 19:
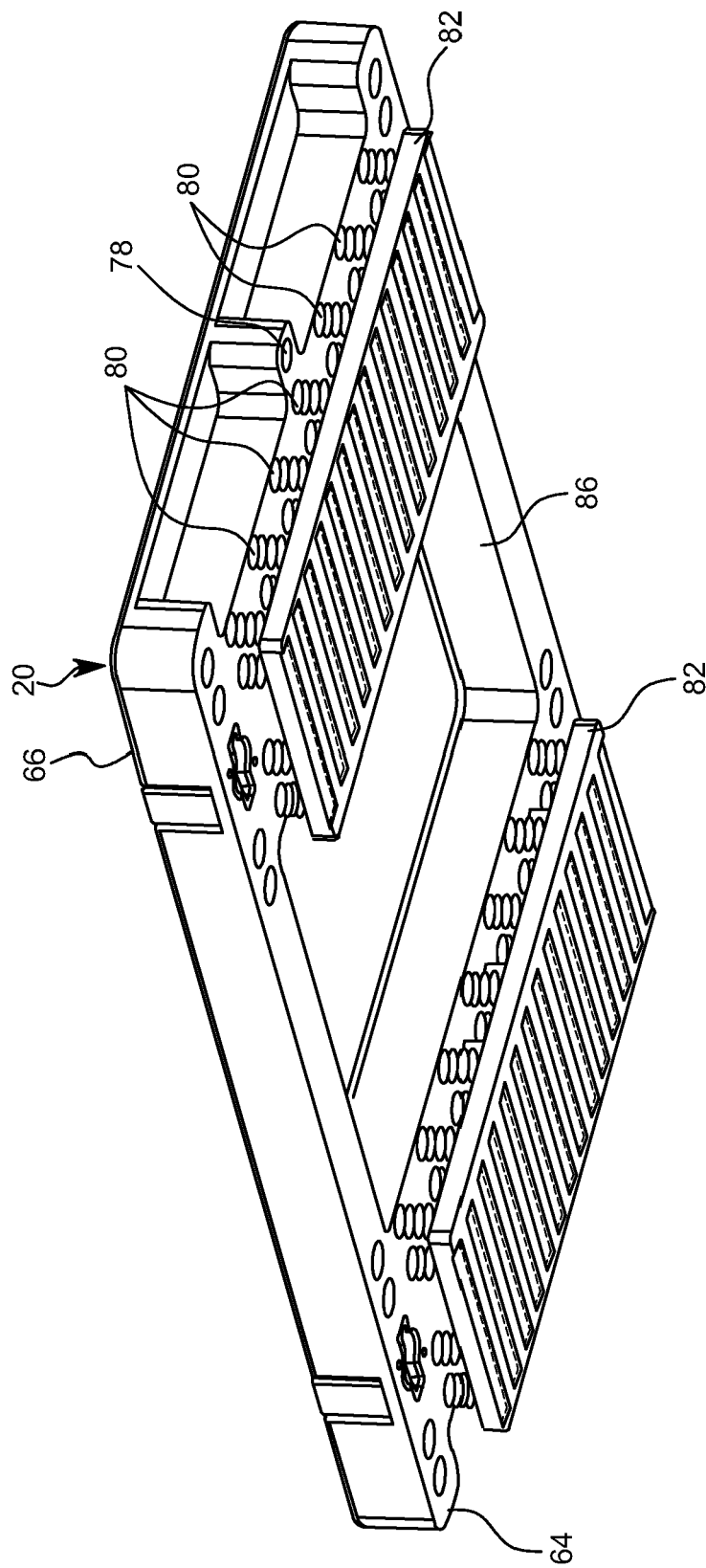
FIG. 19 is a bottom perspective view of a top plate, the view showing the floating plates connected to the bottom surface of the top plate by a plurality of compressible members.
Figure 20:
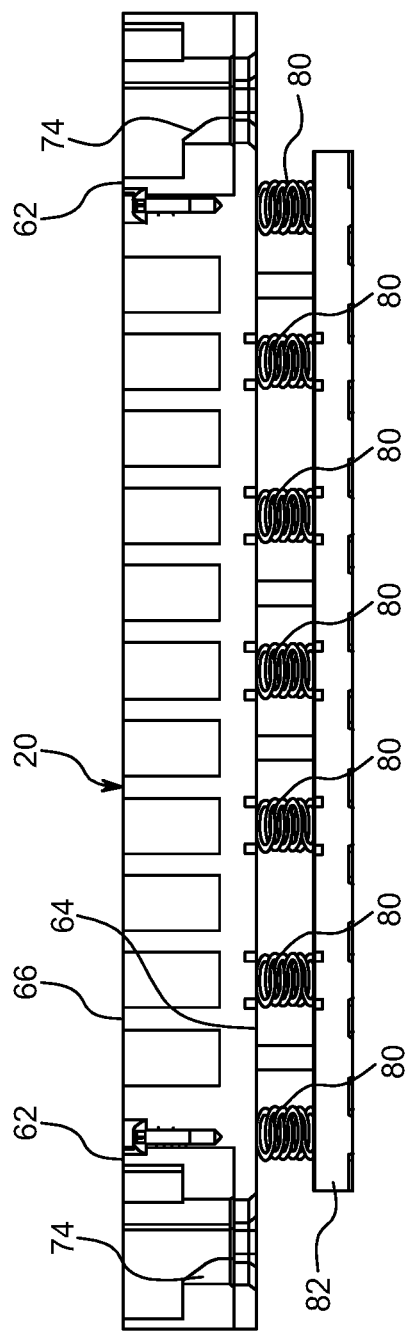
FIG. 20 is a side perspective view of the top plate of FIG. 19.
Figure 21:
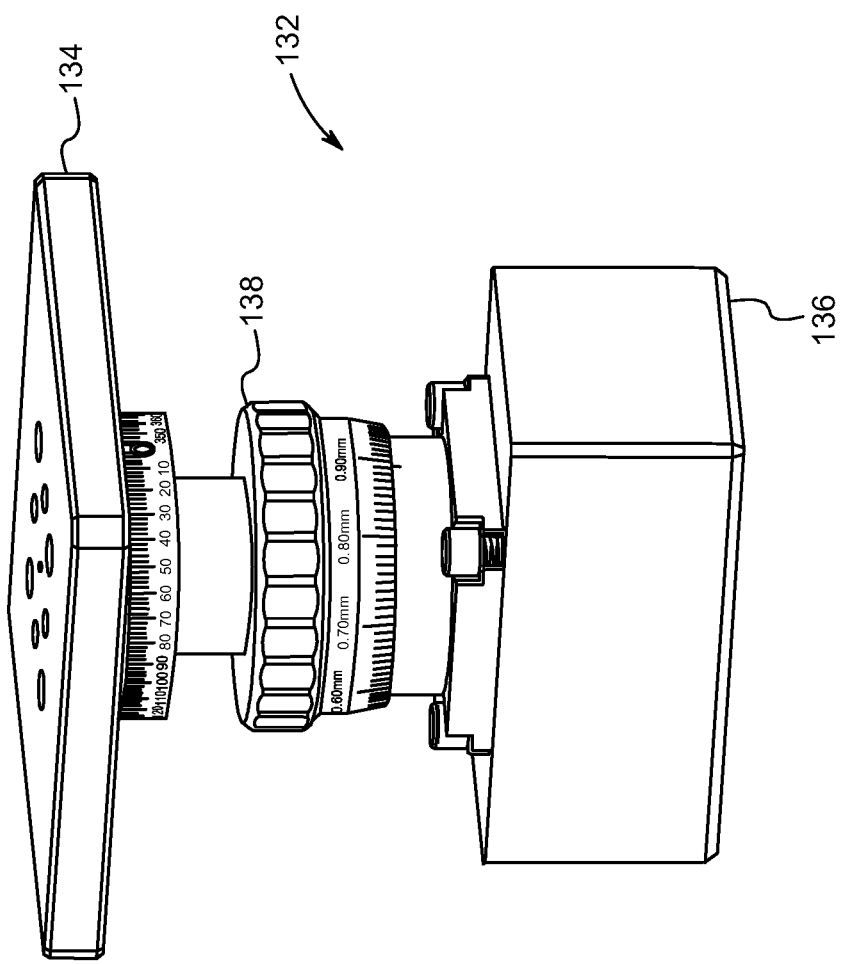
FIG. 21 is a perspective view of an adjustment mechanism.
Figure 22:
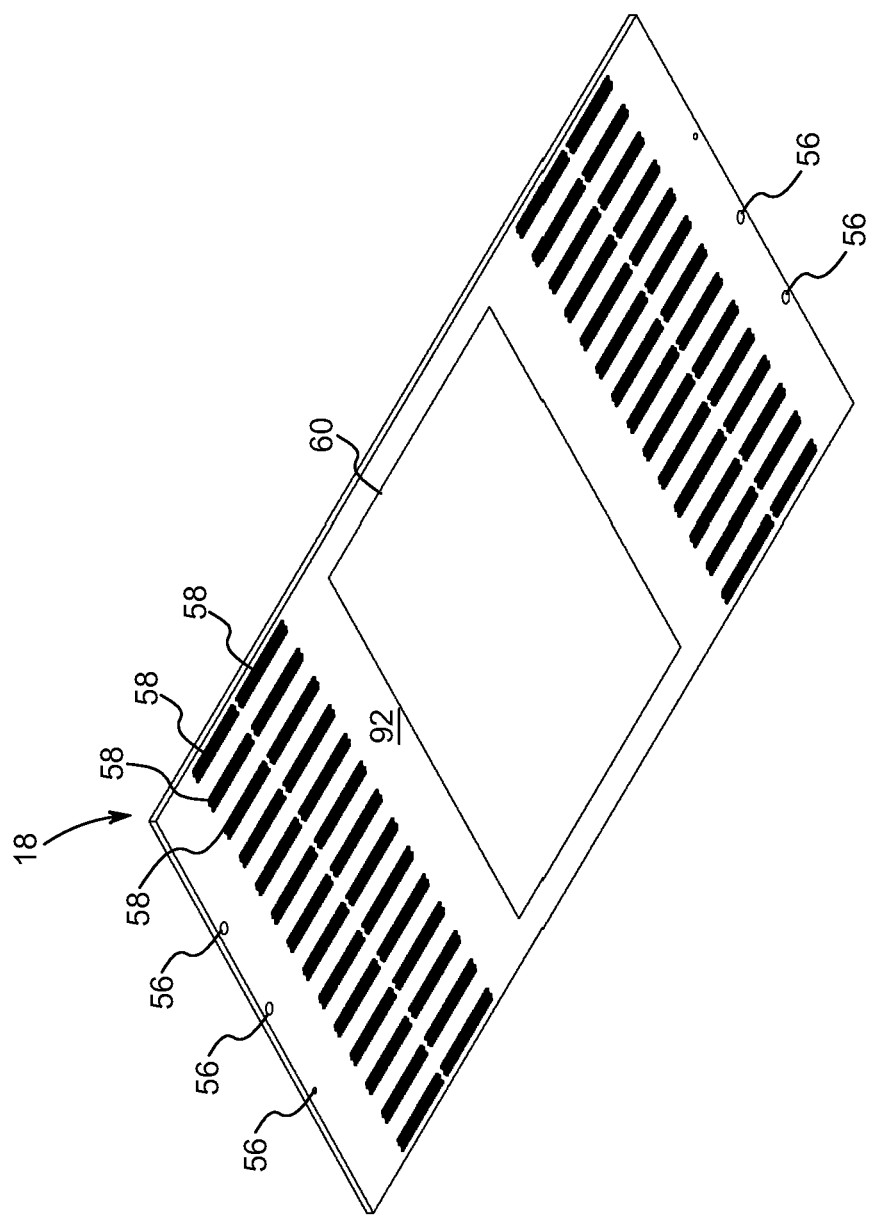
FIG. 22 is a bottom perspective view of the DUT PCB, the view showing the contact fields 50 in rows on opposing sides of the DUT PCB, the view also showing the center area of the DUT PCB.
Figure 23:
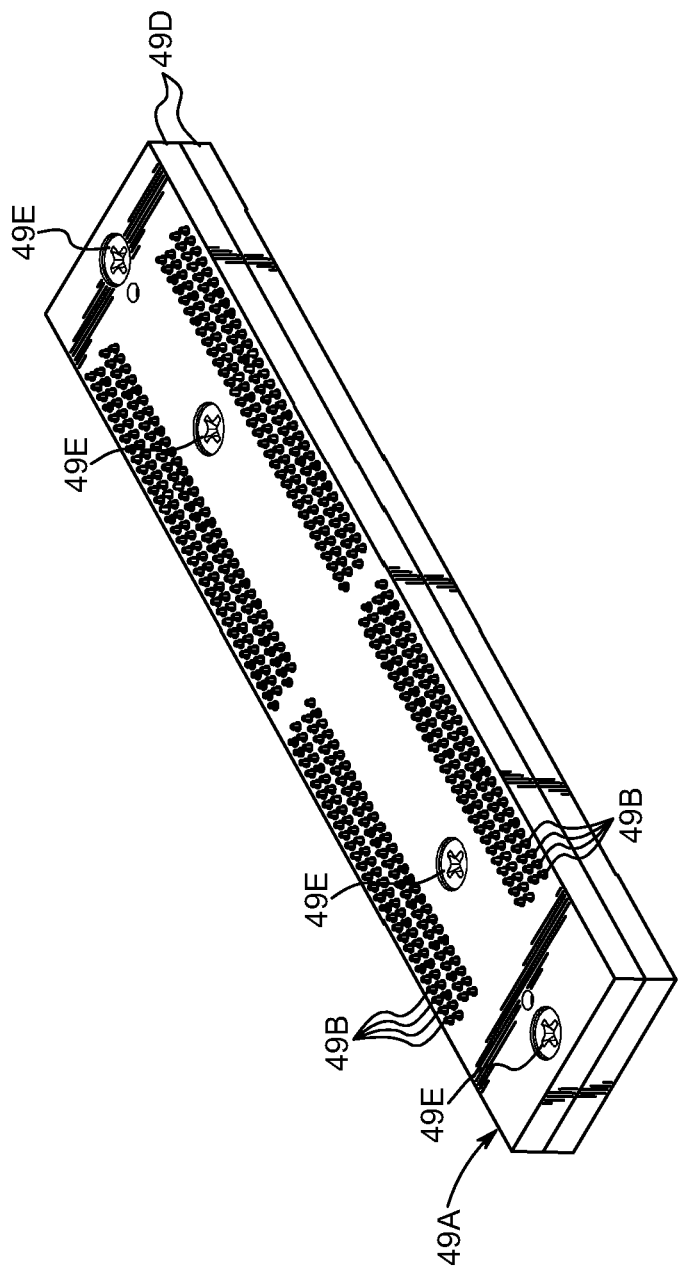
FIG. 23 is a top perspective view of a capsule, the view showing a plurality of compressible contacts aligned in two sets of rows, each set having four rows of contacts therein the rows separated by an isle down the middle that provides room for fasteners, the view showing the capsules formed of two opposing halves connected together along a seamline.
Figure 24:
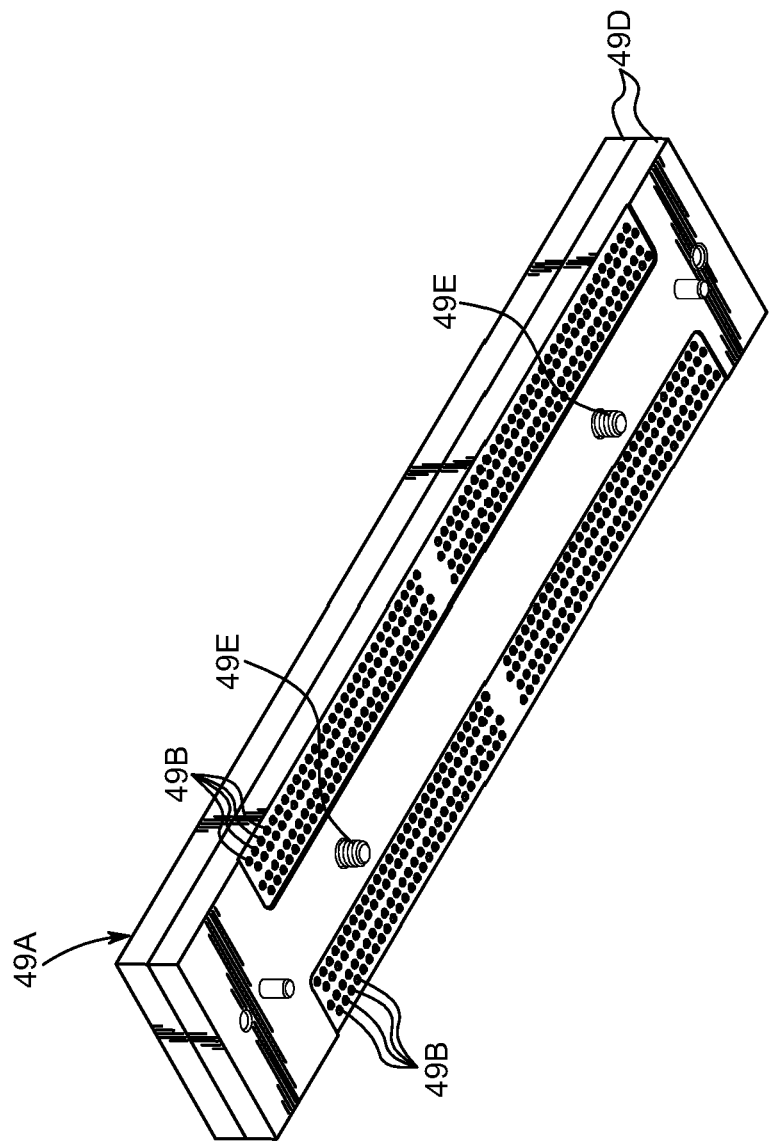
FIG. 24 is a bottom perspective view of a capsule, the view showing a plurality of compressible contacts (or contact pads or sockets) aligned in two sets of rows, each set having four rows of contacts therein the rows separated by an isle down the middle that provides room for fasteners, the view showing the capsules formed of two opposing halves connected together along a seamline.
Figure 25:
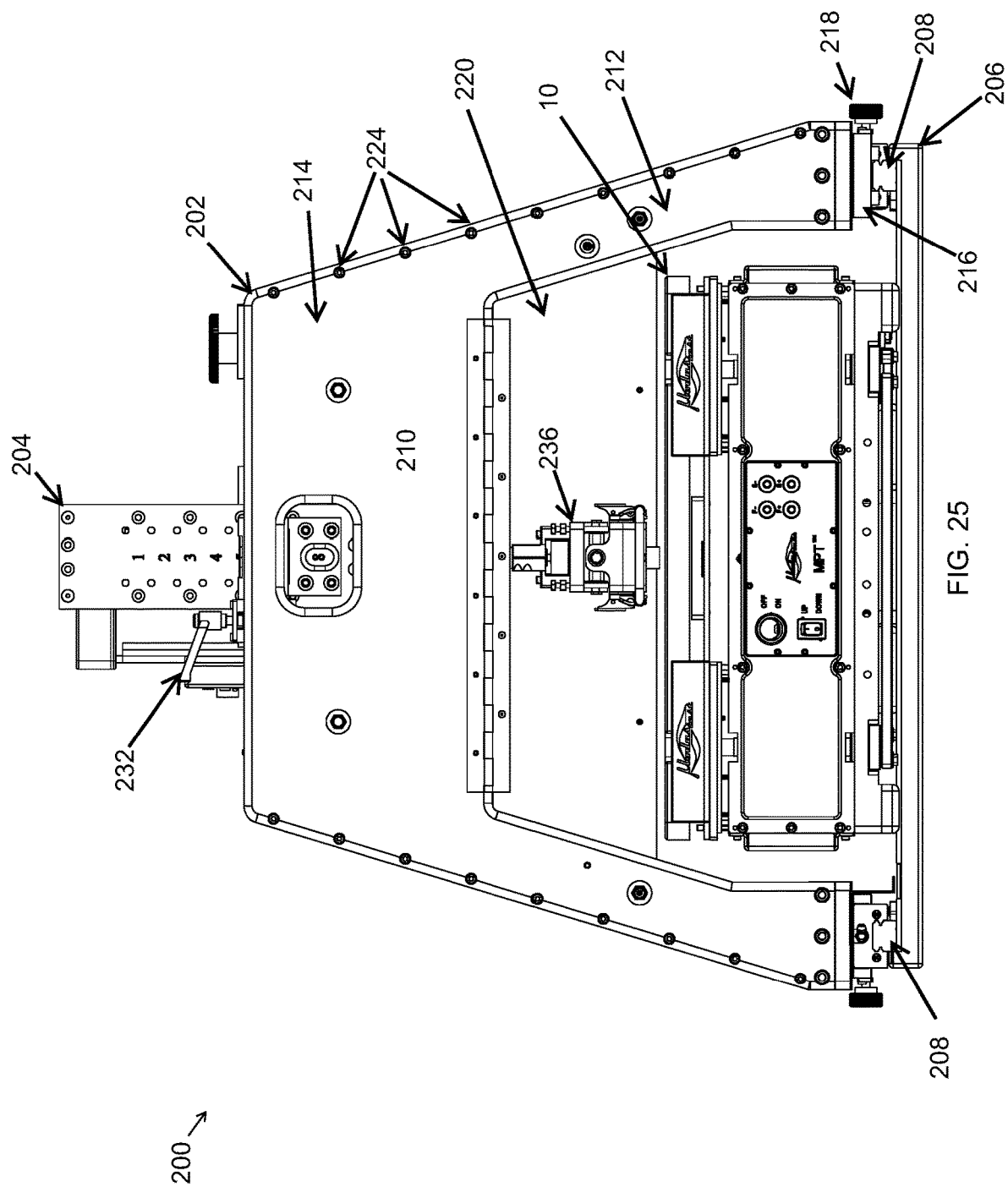
FIG. 25 is a front elevation view of the electrical interconnect testing device shown in FIGS. 1-24, the view showing the addition of a gantry having a actuator that is positioned above the electrical interconnect testing device, the gantry configured to move forward to back, the actuator configured to move side to side, the actuator configured to press the device under test into the electrical interconnect at increments for testing the actual in-situ performance of the contact points of the electrical interconnect.
Figure 26:
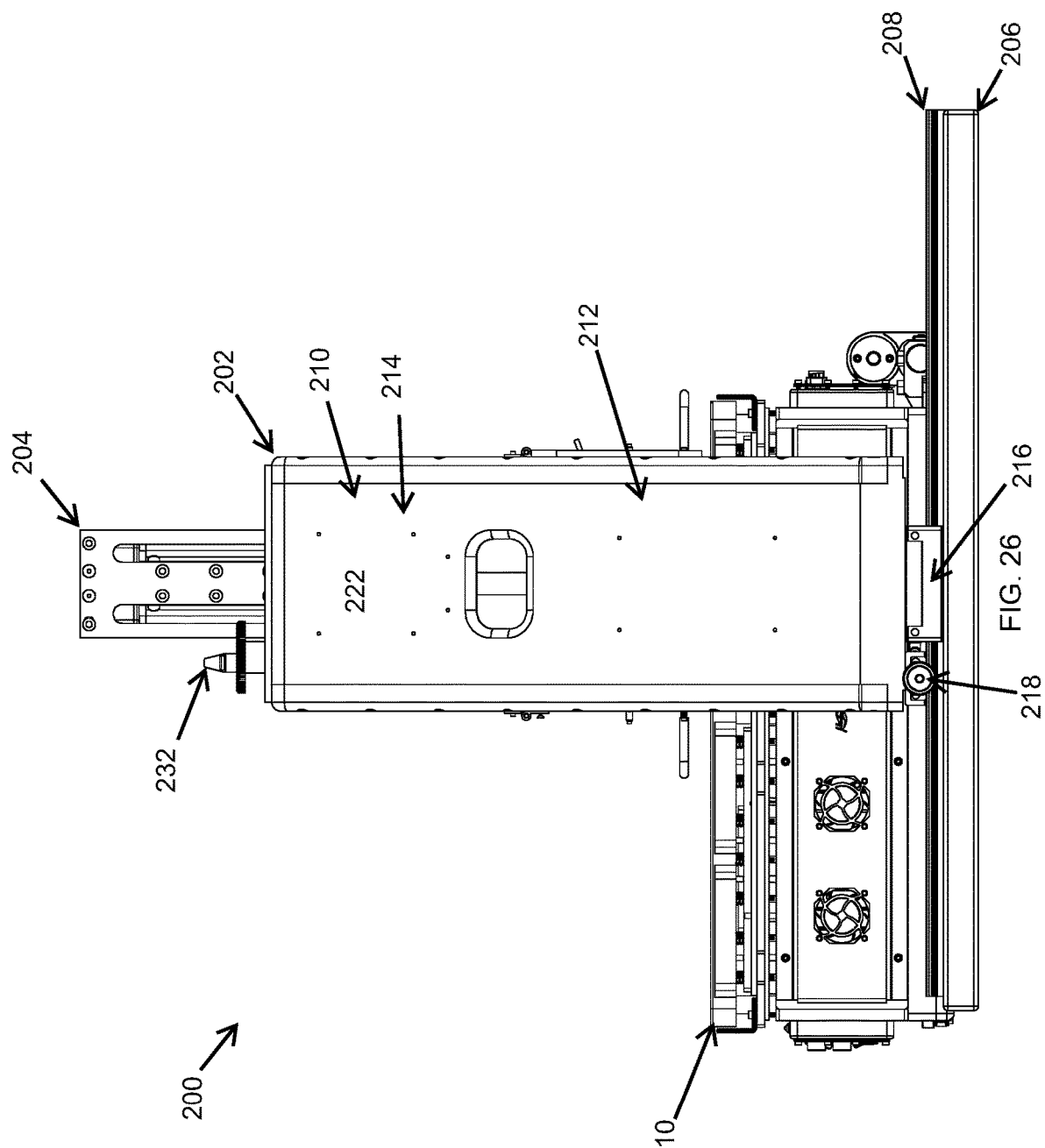
FIG. 26 is a side elevation view of the electrical interconnect testing device with a gantry and actuator shown in FIG. 25, the view showing the addition of a gantry having a actuator that is positioned above the electrical interconnect testing device, the gantry configured to move forward to back, the actuator configured to move side to side, the actuator configured to press the device under test into the electrical interconnect at increments for testing the actual in-situ performance of the contact points of the electrical interconnect.
Figure 27:
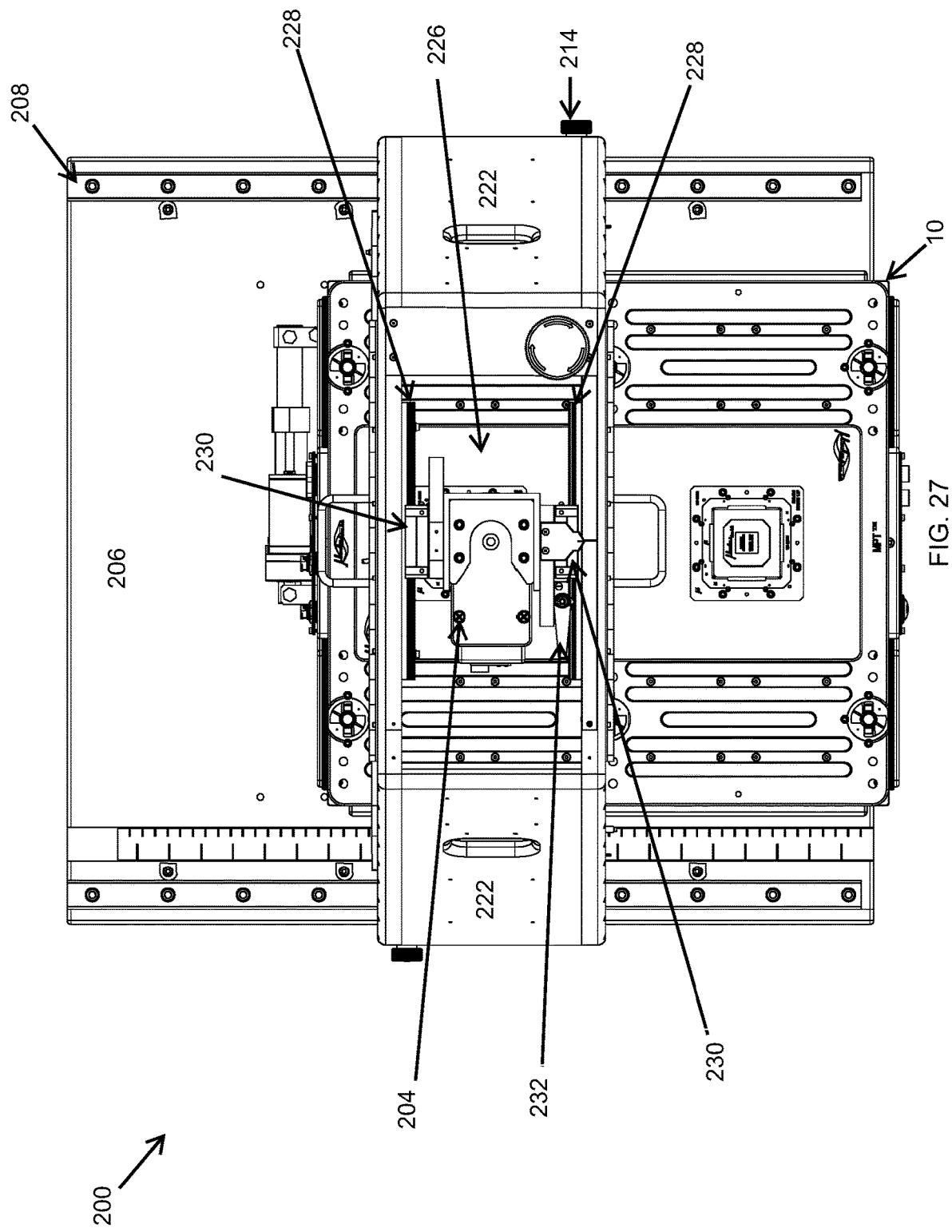
FIG. 27 is a top elevation view of the electrical interconnect testing device with a gantry and actuator shown in FIGS. 25 and 26, the view showing the addition of a gantry having a actuator that is positioned above the electrical interconnect testing device, the gantry configured to move forward to back, the actuator configured to move side to side, the actuator configured to press the device under test into the electrical interconnect at increments for testing the actual in-situ performance of the contact points of the electrical interconnect.
Figure 28:
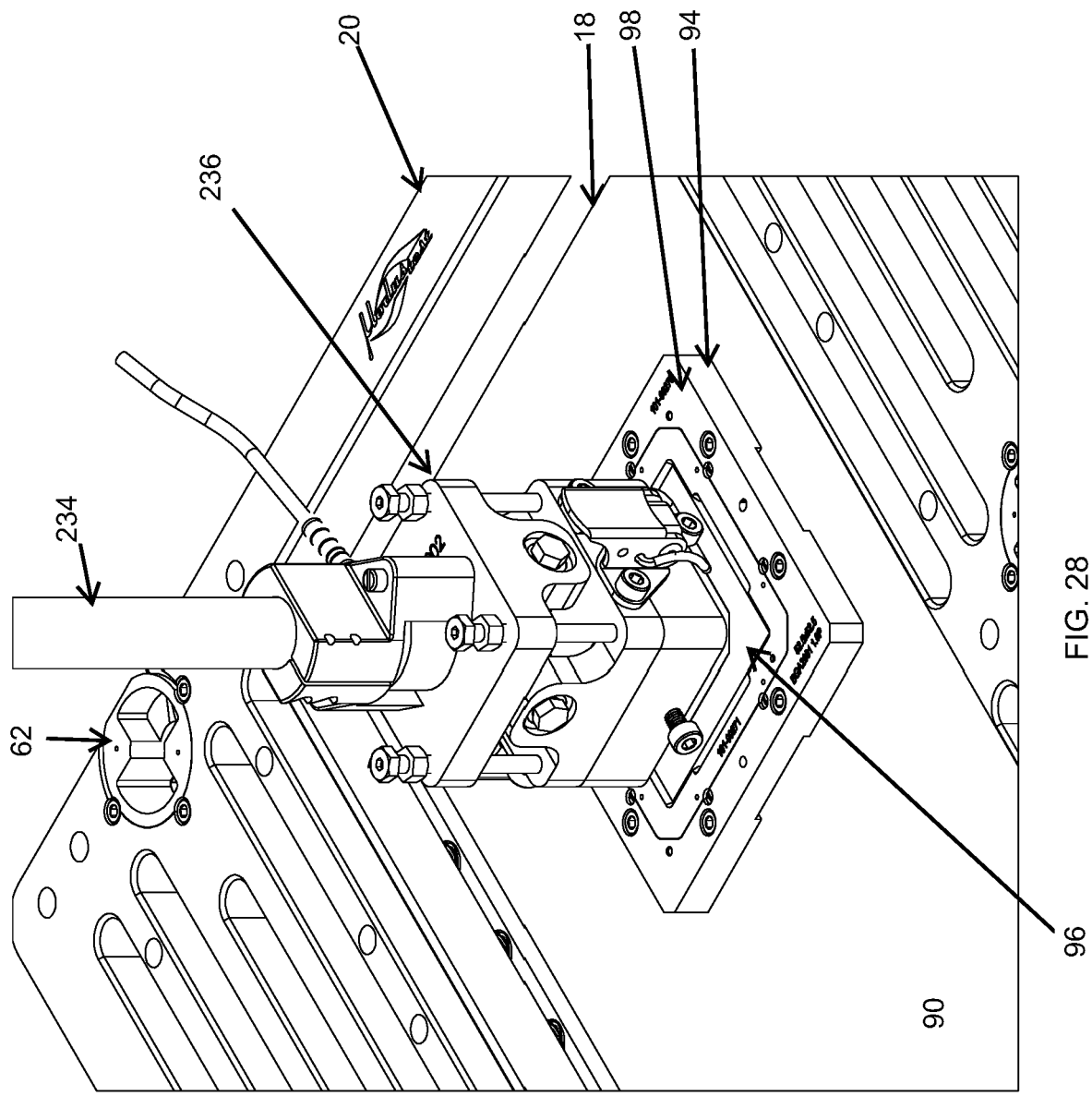
FIG. 28 is a close-up perspective view of the electrical interconnect testing device with a gantry and actuator shown in FIGS. 25-27, the view showing the pusher of the actuator pressing a device under test into the electrical interconnect which is attached to the device under test printed circuit board which is electrically connected to the electrical testing boards of the electrical interconnect testing device.
Figure 29:
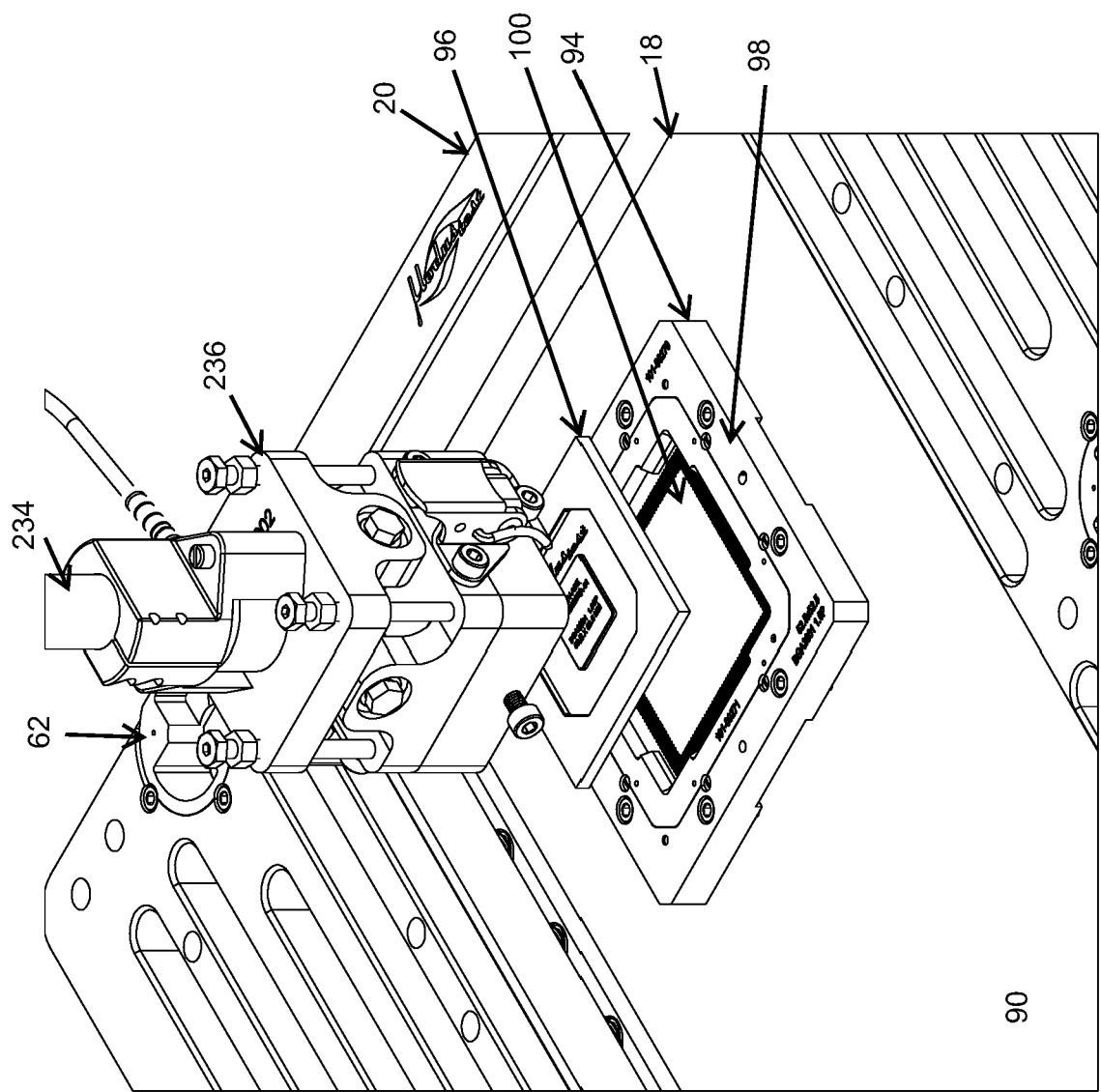
FIG. 29 is a close-up perspective view of the electrical interconnect testing device with a gantry and actuator shown in FIGS. 25-28, the view similar to that shown in FIG. 28, the view showing the pusher of the actuator about to press a device under test into the electrical interconnect which is attached to the device under test printed circuit board which is electrically connected to the electrical testing boards of the electrical interconnect testing device.

In the following detailed description, reference is made to the accompanying drawings which form a part hereof, and in which is shown by way of illustration specific embodiments in which the disclosure may be practiced. These embodiments are described in sufficient detail to enable those skilled in the art to practice the disclosure, and it is to be understood that other embodiments may be utilized and that mechanical, procedural, and other changes may be made without departing from the spirit and scope of the disclosure(s). The following detailed description is, therefore, not to be taken in a limiting sense, and the scope of the disclosure(s) is defined only by the appended claims, along with the full scope of equivalents to which such claims are entitled.

As used herein, the terminology such as vertical, horizontal, top, bottom, front, back, end, sides and the like are referenced according to the views, pieces and figures presented. It should be understood, however, that the terms are used only for purposes of description, and are not intended to be used as limitations. Accordingly, orientation of an object or a combination of objects may change without departing from the scope of the disclosure.

With reference to the figures, a testing system 10 is presented. Testing system 10 is formed of any suitable size, shape and design. In the arrangement shown, as one example, testing system 10 includes a bottom plate 12, a frame member 14, a socket plate 16, a device under test printed circuit board (or DUT PCB) 18, a top plate 20, an actuating mechanism 22, a plurality of locking posts 24, and a plurality of alignment posts 26 among other components. Frame member 14 is formed of any suitable size, shape and design. In the arrangement shown, as one example, fame member 14 is generally square or rectangular in shape and forms a hollow interior 27 which houses other components of the system 10, as is further described herein. Frame member 14 is formed of a pair of opposing sidewalls 28 that extend from a lower end 30 to an upper end 32 in approximate parallel spaced relation to one another. Sidewalls 28 connect at their outward edges 34 to end walls 36. A pair of opposing end walls 36, like sidewalls 28, extend from a lower end 38 to an upper end 40 in approximate parallel spaced relation to one another. End walls 36 connect at their outward edges 42 to the outward edges 34 of sidewalls 28. Sidewalls 28 and end walls 36 are arranged in approximate perpendicular alignment to one another. In this way, the connection of sidewalls 28 to end walls 36 forms a generally square or rectangular box or frame that houses the components shown and described herein. However, any other size or shape of frame member 14 is hereby contemplated for use.

The sidewalls 28 and end walls 36 of frame member 14 connect at their lower ends 30/38 to bottom plate 12. Bottom plate 12 is formed of any suitable size, shape and design and is used for supporting and closing the lower end of testing system 10 for placement on a table, desk or other surface, or alternatively for connecting system 10 to another machine, such as a semiconductor testing system, automated testing system, a pick and place machine or any other machine or device. Bottom plate 12 is generally planar in shape, and defines a generally planar upper surface 44 and a generally planar lower surface 46.

The sidewalls 28 and end walls 36 of frame member 14 connect at their upper ends 32/40 to socket plate 16. In the arrangement shown, one socket plate 16 is positioned on either side of the center of frame member 14. However, any number of socket plates 16 are hereby contemplated for use, such as one, or an arrangement wherein four socket plates 16 are used, one on each side of the center of frame member 14, each socket plate 16 positioned in 90° alignment or square alignment to the adjacent socket plates 16. Socket plates 16 are formed of any suitable size, shape and design and are used for connecting to or holding a plurality of electrical testing components 48 therein as is further described herein. In the arrangement shown, socket plates 16 are generally planar in shape, with a generally planar upper surface 50 and a generally planar lower surface 52. In the arrangement shown, one socket plate 16 is connected to each side of frame member 14 each of which include a plurality of socket openings 54 therein that are sized and shaped to receive and electrically connect to electrical testing components 48, as is further described herein.

When installed, the upper end of electrical testing components 48 are held within the socket openings 54 with the remaining portions of electrical testing components 48 hanging vertically downward therefrom within the hollow interior formed by frame member 14. This arrangement allows for a high density of electrical testing components 48 within a small footprint.

In one arrangement, electrical testing components 48 include a rigid capsule 49A which is removably held within or connected to socket opening 54. In one arrangement, rigid capsules 49A include a plurality of compressible electrical contacts 49B in its upward facing surface that extend upward therefrom and/or in its downward facing surface that extend down ward. Alternatively, the downward facing surface of rigid capsules 49A include contact fields or sockets that are used to make electrical connections (instead of spring loaded or compressible electrical contacts 49B). These compressible electrical contacts 49B are electrically connected to an electrical testing board 49C, also known as a card. In the arrangement shown, electrical testing boards are vertically aligned and extends downward from the rigid capsule 49A. As a rigid capsule 49A with compressible electrical contacts 49B is connected to or placed in each socket opening 54, these electrical testing boards 49C or cards are aligned in approximate parallel spaced relation within the hollow interior of testing system 10 in close but spaced relation to one another. This allows the maximum density of electrical testing boards 49C to be electrically connected the system 10.

In one arrangement, as is shown, rigid capsules 49A are generally rectangular in shape and have generally planar upper and lower surfaces which oppose one another in approximate parallel spaced relation. In this arrangement, rigid capsules 49A are formed of a pair of opposing halves 49D that connect together in generally flush engagement with one another and are held together, in one arrangement, by fastener 49E, however any other manner of connection is hereby contemplated for use. In one arrangement, these compressible electrical contacts 49B are known in the industry as pogo pins. A Pogo pin is a device used in electronics to establish a (usually temporary) connection between two printed circuit boards. Named by analogy with the pogo stick toy, the pogo pin usually takes the form of a slender cylinder containing two sharp, spring-loaded pins.

Pressed between two electronic circuits, the sharp points at each end of the pogo pin make secure contacts with the two circuits and thereby connect them together.

In one arrangement, compressible electrical contacts 49B also extend out of the lower surface of the rigid capsule 49A as well as the upper surface, whereas in other arrangements, the lower surface of rigid capsule 49A includes sockets or electrical contact pads as is further described herein.

In the arrangement shown, wherein rigid capsules 49A are generally rectangular in shape, the socket openings 54 in socket plate 16 similarly generally rectangular in shape and are sized and shaped to receive rigid capsules 49A therein with close tolerances. In this arrangement, the plurality of socket openings 54 and therefore the plurality of rigid capsules 49A are aligned in approximate parallel spaced relation in rows across the socket plate 16. As one socket plate 16 is positioned on each side of the system 10, this arrangement forms a pair of rows of socket openings 54 and capsules 49A, one on each side of the system 10.

The upper surface of capsules 49A is configured to electrically connect to the lower surface of DUT PCB 18, and the lower surface of capsules 49 is configured to electrically connect to the upper surface of tester printed circuit board 49F (tester PCB). In one arrangement, capsules 49A are connected to the upper surface of tester PCB 49F by fasteners 49E which extend through and connect both capsules 49A and tester PCB 49F, in spaced alignment to one another such that the capsules 49A fit within the plurality of socket openings 56 in socket plate 16.

A plurality of sockets 49G are connected to the lower surface of tester PCB 49F. Sockets 49G are formed of any suitable size, shape and design and serve to removably receive electrical testing boards 49C and electrically connect the electrical testing boards 49C to the tester PCB 49F, the capsules 49A and therefore the rest of the electrical components of the system 10. In the arrangement shown, sockets 49G include an edge connector. That is, sockets 49G receives the upper edge of an electrical testing board 49C therein that holds the electrical testing board 49C therein and serves to electrically connect the electrical testing board 49C. In the arrangement shown, two sockets 49G are used to connect to a single capsule 49A. In one arrangement, as is shown, each capsule 49A includes eight rows of compressible electrical contacts 49B, which are separated into two groups, one group for each electrical testing board 49B. Also, as shown, seven capsules 49A are connected to each socket plate 16 and tester PCB 49F and therefore fourteen electrical testing boards 49C are used on each side of system 10. However, any other number of sockets, capsules and electrical testing boards are hereby contemplated for use.

When assembled, the electrical contacts in the upper edges of electrical testing boards 49C are electrically in contact with the sockets 49G. The sockets 49G electrically connect to the tester PCB 49F. The tester PCB 49F electrically connects to the capsules 49A, which are held within the socket openings 54 of socket plate 16. When the DUT PCB 18 is placed on top of the socket plate 16, the compressible electrical contacts 49B in the capsules 49A electrically contact the contact fields 58 in the lower surface of DUT PCB 18, as is further described herein.

Device under test (DUT) Printed circuit board 18 (DUT PCB 18) sits on top of socket plate 16. DUT PCB 18 is formed of any suitable size shape and design. In the arrangement shown, DUT PCB 18 is generally square or rectangular in shape with its periphery being smaller or slightly smaller than the periphery of frame member 14 such that DUT PCB 18 fits within the exterior edge of frame member 14 when placed on top of frame member 14.

In one arrangement, as is shown, a plurality of alignment posts 26 extend upward a distance from the upper end 32/40 of frame member 14 in approximate parallel alignment with the height of testing system 10. Alignment posts 26 are formed of any suitable size, shape and design. In the arrangement shown, alignment posts 26 are generally cylindrical rods. Alignment posts 26 align with alignment openings 56 in DUT PCB 18 when DUT PCB 18 is properly aligned with frame member 14 and placed on top of frame member 14. DUT PCB 18 includes a plurality of electrical contact fields 58 or electrical pads positioned in the lower surface of DUT PCB 18. In this way, when DUT PCB is placed on top of frame member 14 over alignment posts 24, the electrical contact fields 58 of DUT PCB 18 are accurately aligned with spring loaded or compressible electrical contacts 49A of the capsules 49A of electrical testing components 48. In this way, spring loaded or compressible electrical contacts 49A of electrical testing components 48 electrically connect with contact fields 58 of DUT PCB 18. In one arrangement, the alignment posts 26 are configured such that the DUT PCB 18 and/or the top plate 20 can only be positioned on top of the system 10 in one manner of alignment, thereby preventing improper assembly of the system 10.

In the arrangement, wherein two rows of electrical testing boards 49C, sockets 49G and capsules 49A are part of the system 10, with one row on each side of the system 10, the contact fields 58 of DUT PCB 18 are similarly aligned in two rows, one row on either side of the center of the DUT PCB 18. This arrangement leaves the center area 60 of DUT PCB 18 open for connection of electrical interconnect 94 and reception of the device under test 96 (DUT), as is further described herein.

Top plate 20 removably sits on top of DUT PCB 18, socket plate 16 and frame member 14. Top plate 20 is formed of any suitable size shape and design and is used for tightly and accurately holding DUT PCB 18 into contact with socket plate 16 and frame member 14 while also being quickly and easily removed from DUT PCB 18, socket plate 16 and frame member 14 so as to allow for quick and easy replacement of DUT PCB 18 to accommodate other DUTs 96. In the arrangement shown, top plate 20 includes a plurality of cam members 62 placed therein. Cam members 62 may be separate components connected to or installed into top plate 20, or cam members 62 may be formed directly into top plate 20 by machining or other the like processes. More specifically, top plate 20 is generally planar in shape with a generally flat lower surface 64 and a generally flat top surface 66. In the arrangement shown, a cam member 62 is positioned approximately in each corner of top plate 20 so as to provide even and smooth downward force across top plate 20. Cam members 62, when viewed from above or below, have a generally cylindrical body 68 and include a generally cylindrical opening 70 positioned approximately at its middle that extends vertically through the cam member 62. At least one key slot opening 72 is connected to cylindrical opening 70. Key slot opening 72 is formed of any suitable size shape and design. In the arrangement shown, when viewed from above or below, key slot opening 72 is generally rectangular in shape and extends outward from or through the center of cylindrical opening 70.

Key slot opening 72 is positioned adjacent to a lower edge of cam surface 74. Cam surface 74 extends from key slot opening 72 and around cylindrical opening 70 as it extends at an angle toward upper surface 64 from lower surface 66.

In one arrangement, the upper end of cam surface 74 terminates in a generally flat upper surface 74A or plateau which is positioned next to a stop surface 74B that defines the upper end of cam surface 74. That is, in the arrangement shown, each key slot opening 72 connects to the lower end of the sloped cam surface 74, with each key slot opening 72 being positioned on opposite sides of the cam member 62.

Cylindrical openings 70 and key slot openings 72 are sized and shaped to receive the upper ends of locking posts 24. That is, the upper end of locking posts 24 include keys or protrusions 76 that extend outward therefrom. In the arrangement shown, keys or protrusions 76 are cylindrical posts that extend outward in a generally perpendicular alignment to the length or height of locking posts 24 adjacent the upper end of locking posts 24. These posts are generally cylindrical in shape; however any other shape is hereby contemplated. In the arrangement shown, when viewed from the side, locking posts 24 with protrusions 76 have a T-shape. However, any other shape is hereby contemplated for use.

Top plate 20 also includes a plurality of alignment openings 78 therein. These alignment openings 78 are sized and shaped to receive the upper end of alignment posts 26 therein in the same or similar manner that alignment openings 56 in DUT PCB 18 receive alignment posts 26.

When top plate 20 is placed on top of testing system 10, the alignment openings 78 of top plate are aligned with the alignment posts 26 of frame member 14 and the top plate 20 is lowered thereon. In this position, the cylindrical openings 70 and key slot openings 72 of cam members 62 are aligned with the upper ends of locking posts 24 when the locking posts 24 are in a disengaged position. As the top plate 20 is lowered, the upper ends of locking posts 26 pass through the cylindrical openings 70 in the cam members 62 and the keys or protrusions 76 pass through the key slot openings 72 in the cam members 62 until the top plate 20 is fully lowered in place with the lower surface of the top plate 20 in contact with the upper surface of DUT PCB 18. Once in this position, the locking posts 24 are rotated, this causes the keys or protrusions 76 to rotate out of the key slot openings 72 and to engage and slide upward along the cam surfaces 74. As the keys or protrusions 76 slide upward along cam surfaces 74, because the locking posts 24 are vertically fixed relative to the frame member 14, this pulls the top plate 20 into tighter and tighter engagement with the frame member 12 as the keys or protrusions 76 slide upward upon cam surfaces 74. This pulls the DUT PCB 18 into tighter and tighter engagement with the frame member 14, socket plate 16, and the compressible electrical contacts 49A of capsule s held within the socket openings 54. This continues until the protrusions 76 reach the flat upper surface 74A connected to the cam surface 74, and/or the protrusions 76 reach and engage the stop surface 74B. At this point the protrusions 76 can rest on the flat upper surface 74A. In one arrangement, so ensure that the protrusions do not unintentionally slide off of the flat upper surface 74A, a detent feature 74C is positioned at or near the upper end of the cam surface 74 or at or near the beginning of the flat upper surface 74A. This detent feature 74 requires the application of additional force to dislodge the protrusion from the flat upper surface 74A and thereby prevents unintentional disengagement thereof.

In one arrangement, the lower surface 64 of top plate 20 includes one or more compressible members 80 that extend downward therefrom. Compressible members 80 are formed of any compressible or resilient device such as a spring, a compressible piece of material, an air bag, an air chamber, a piston or the like. In the arrangement shown, compressible members 80 are springs and connect to floating plate 82 that directly engage the top surface of DUT PCB 18. The use of floating plate 82 and compressible members 80 ensure even pressure and constant and repeatable tightening force. In the arrangement shown, one floating plate 82 is positioned on either side of the center of system 10 and is sized and shaped to cover approximately the area where contact fields 58 of DUT PCB 18, capsules 49A, Electrical testing boards 49C, tester PCBs 49F, sockets 49G, and capsules 49A are located. The size, shape and location of floating plates 82 ensure that appropriate, even and constant downward pressure is generated between the compressible electrical contacts 49B of capsules 49A and the contact fields 58 of DUT PCB 18 thereby ensuring proper, constant and repeatable electrical connection there between.

In addition, to ensure repeatable tightening, and to prevent overtightening, a plurality of stop bars 84 extend upward from testing system 10, or in an alternative arrangement downward from top plate 20. Stop bars 84 are formed of any suitable size shape and design and define a stopping surface for top plate 20. In the arrangement shown, stop bars 84 are generally cylindrical in shape and terminate in a generally flat end which flatly engages top plate 20 thereby stopping the lower progression of top plate 20 relative to frame member 14.

Top plate 20 also includes a testing aperture 86 that is generally centrally located therein, or located at its approximate middle. In the arrangement shown, the rows of electrical testing boards 49C and capsules 49A are positioned on either side of the testing aperture 86. Testing aperture 86 is formed of any suitable size shape and design. In the arrangement shown, testing aperture 86 is generally square or rectangular in shape and separates top plate 20 into opposing sides 88. Testing aperture 86 provides access through top plate 20 and to the upper surface of center area 60 of DUT PCB 18 for testing purposes.

In one arrangement, a guide 89 (not shown) is connected to top plate 20 and positioned around testing aperture 86. Guide 89 is formed of any suitable size, shape and design. In one arrangement, guide 89 serves the purpose of conforming the testing aperture 86 to meet the size and shape of a handler device or other device that loads DUT 96 into testing system 10. In one arrangement, guide 89 also provides additional structural rigidity to the system 10. In one arrangement, guide 89 provides additional mounting capabilities for top plate 20.

DUT PCB 18 is formed of any suitable size shape and design. In the arrangement shown, DUT PCB 18 is generally square or rectangular in shape with its periphery being smaller or slightly smaller than the periphery of frame member 14 such that DUT PCB 18 fits within the exterior edge of frame member 14 when placed on top of frame member 14. DUT PCB 18 has a generally flat upper surface 90 that extends in approximate parallel spaced relation to a generally flat lower surface 92. DUT PCB 18 includes a plurality of contact fields 58 positioned in its lower surface 92 that electrically connect with compressible electrical contacts 49B of rigid capsules 49A held within socket openings 54. These contact fields 58 are aligned on both sides of center area 60 of DUT PCB 18.

An electrical interconnect 94 is connected to the upper surface 90 of DUT PCB 18 and is sized and shaped to receive a device under test (DUT) 96, such as a semiconductor chip, a reference chip, a shorting device, a reference standard or the like. Electrical interconnect 94 is formed of any suitable size, shape and design and is generally sized and shaped specifically to receive DUT 96 within close and tight tolerances and in mating engagement with one another. In the arrangement shown, electrical interconnect 94 includes a raised peripheral edge 98 which surrounds and provides a border to a field of contact points 100 positioned approximately at the center of the electrical interconnect 94.

In one arrangement, as is shown, electrical interconnect 94 is what is known as a test socket. However, the disclosure herein is not limited to testing test sockets only. Instead, the disclosure is applicable to testing any device or system that forms an electrical interconnect.

Electrical interconnect 94 is affixed to the upper surface 90 of DUT PCB 18 such that when DUT PCB 18 is placed on top of testing system 10, and top plate 20 is placed on top of DUT PCB 18, electrical interconnect 94 is positioned within testing aperture 86 and is accessible from above testing system 10. Or, said another way, testing aperture 86 provides access to electrical interconnect 94 which is positioned within the center area 60 of DUT PCB 18.

Electrical interconnect 94 includes a plurality electrical contacts 100 positioned at its center within a raised peripheral edge 98 of electrical interconnect 94 which surrounds the electrical contacts 100. The electrical contact points 100 of electrical interconnect 94 electrically connect to electrical traces or leads that extend through DUT PCB 18 and electrically connect to the electrical contact fields 58 positioned in the lower surface 92 of DUT PCB 18. In this way, the DUT PCB serves to electrically connect the electrical interconnect 94, and any DUT 96 positioned within the electrical interconnect 94, connected to the top surface of the DUT PCB 18 to the electrical testing components 48 (capsules 49A, compressible electrical contacts 49B, electrical testing boards 49C, Tester PCBs 49*f*) positioned below the DUT PCB 18. As such, when DUT PCB 18 is placed on top of testing system 10, the electrical contact points 100 of electrical interconnect 94 electrically contact through DUT PCB 18 to the electrical testing components 48.

In a manufacturing environment, DUT 96 is often a sophisticated semiconductor chip that provides sophisticated functionality and capabilities in a tremendously compact size. However, in a testing environment, wherein electrical interconnect 94 is being tested, DUT 96 is often a shorting device or a reference standard. Often, when DUT 96 is a shorting device it is a solid metallic or plated metallic device that has a generally well known resistance which is suitable for testing purposes. Often, DUT 96 is reference standard that mimics a certain condition or provides an anticipated result that is useful for testing purposes.

DUT 96 often has a very high density of electrical contacts in its lower surface that electrically connect the DUT 96 to the device DUT 96 is installed in (such a computer's motherboard, or the like). Accordingly, to test all of the contacts DUT 96 has in its lower surface, electrical interconnect 94 has a corresponding number of electrical contacts or points 100 in its upper surface. Testing system 10 is configured to perform complex and sophisticated testing procedures on DUT 96 which require sophisticated and complex electrical testing components 48 (as are described herein). DUT PCB 18 serves to connect the dense electrical contacts in the bottom surface of DUT 96 (the electrical contact points 100 in the upper surface of electrical interconnect 94) to the electrical testing components 48 of the system 10 through a network of electrical traces embedded within the DUT PCB 18. As such, through its network of internal electrical leads (or traces) DUT PCB 18 expands the dense electrical leads in the bottom surface of DUT 96 outward and to the sides of DUT PCB 18 so as to provide room for the electrical testing components 48 needed to perform the electrical tests to ensure DUT 96 is a conforming device and within spec. As such, through its network or electrical traces, DUT PCB 18 serves to expanded surface area of the electrical contacts 100 in electrical interconnect 94 outward so as to provide room for the needed electrical testing components 48 of system 10. While system 10 houses the electrical testing components 48 in a very dense arrangement, the surface area required for the electrical testing components 48 is substantially greater than the surface area of the electrical contacts in the DUT 96.

Locking posts 24 are formed of any suitable size, shape and design. In the arrangement shown, locking posts 24 extend vertically through frame member 14 with the lower ends protruding outward from the bottom plate 12 and the upper ends protruding outward from the socket plate 16. In the arrangement shown, a locking post 24 is positioned approximately in each corner of the testing system 10 so as to provide even tightening of top plate 20. The lower ends of locking posts 24 connect to a rotatable member 110 having a pair of posts 112 extending downward therefrom, each post 112 being off center from the axis of rotation 114 of locking post 24.

Each post 112 is connected to a linkage 116. Linkages 116 mechanically link the rotatable member 110 to the adjacent rotatable members 110 and thereby mechanically connect all locking posts 24 to one another. In this way, when one rotatable member 110/locking post 24 moves, so moves all other rotatable members 110/locking posts 24. Linkages 116 are formed of any suitable size, shape and design. In the arrangement shown, linkages 116 are generally elongated bars that terminate in threaded heads 118 having openings with bearing surfaces that connect to posts 112. In this way linkages 116 are lengthwise adjustable, using the threaded ends, and allow for rotation of posts within heads 118.

At least one rotatable member 110 includes an arm 120 that extends outward therefrom and connects to actuating mechanism 22. Actuating mechanism 22 is formed of any device that actuates or causes rotation of locking posts 24. In the arrangement shown, actuating mechanism 22 is an electrical, pneumatic or hydraulic device, such as a solenoid, a piston, a cylinder, or the like that moves arm 120 between an engaged position, which locks top plate 20 in place, and a disengaged position, which allows top plate to be removed and replaced. In the arrangement shown, actuating mechanism 22 is connected to the exterior lower edge of frame member 14. In an alternative arrangement, actuating mechanism 22 is a manual device, such as a bar or lever that extends outward from the exterior lower edge of frame member 14. Arm 120 connects to actuating mechanism at an axis of rotation 122 that allows rotation of arm 120 relative to actuating mechanism 22 as actuating mechanism 22 moves.

To provide proper clearance for movement of locking posts 24, rotatable members 110, posts 112, linkages 116, threaded heads 118 and arm 120, these components reside within recesses 122 grooves, or deviations in the bottom plane or bottom surface or bottom plate 120 of system 10 that provide clearance for these components and allow for their unencumbered movement.

Due to the high density of the electrical testing components 48 positioned within the hollow interior of frame member 14, the testing system 10 generates a great amount of heat. To combat this heat generation, fan members 126 are connected to the end walls 36 and/or sidewalls 28 which pull or push air movement through the hollow interior of frame member 14 thereby cooling the electrical testing components 48 and preventing the system from overheating. Fan members 126 are formed of any suitable air moving device and fluidly connect to openings 127 or passageways in the end walls 36 and/or sidewalls 28 of frame member 14 that maximize the amount of air that can flow through end walls 36 and/or sidewalls 28.

In arrangements where a handler, machine, robot, or other device is placing DUT 96 into electrical interconnect 94, it may be necessary to provide additional structural rigidity to DUT PCB 18 so as to prevent flexing or breakage of DUT PCB 18. In some arrangements, the addition of a sprite stiffener 130 is beneficial. In these arrangements, sprite stiffener 130 is any device which is attached to the lower surface 92 of DUT PCB 18 below the electrical interconnect 94. Sprite stiffener 130 is formed of any rigid component and is connected to DUT PCB 18 in any manner known in the art such as passing threaded fasteners through DUT PCB 18 and sprite stiffener 130, using adhesives, or the like. In the arrangement shown, sprite stiffener 130 is generally square or rectangular in shape and fits within the testing aperture 86 of top plate 20.

To provide further structural rigidity, a pedestal support 132 can be placed within the hollow interior 27 of frame member 14 and below the electrical interconnect 94. Pedestal support 132 is any device which provides structural support to the lower side of DUT PCB 18. In one arrangement, as is shown, pedestal support 132 is an adjustable device which resides within the hollow interior 27 of frame member 14 and sits upon the upper surface of the bottom plate 12 and includes a pad 134 that engages the lower surface 92 of DUT PCB 18. In the arrangement shown, pedestal support 132 has, at its bottom end, a generally flat bottom surface 136 that flatly connects to the upper surface of bottom plate 12. Similarly, in the arrangement shown, at its upper end pedestal support 132 has a pad 134 that has a generally flat upper surface that flatly connects to the lower surface 92 of DUT PCB 18, sprite stiffener 130 or any other component that provides support to the bottom side of DUT PCB 18. An adjustment mechanism 138 is positioned between the bottom surface 136 and pad 134 that adjusts the height of pad 134 so as to provide optimal support to DUT PCB 18 and prevent flexing caused by the insertion of DUT 96 by a robot or machine. Adjust mechanism 138 is any device or arrangement that allows for vertical adjustment such as a threaded collar over a threaded shaft, a gearing arrangement or the like.

In Operation: To assemble the testing system 10, a DUT PCB 18 is selected for the particular DUT 96 that is being manufactured and therefore needs to be tested. Once selected, the DUT PCB 18 is placed on top of the testing system 10 and on top of socket plates 16. When placing the DUT PCB 18 on top of the socket plate 16, care is taken to ensure that the alignment posts 26 of testing system 10 align with and are received within the alignment openings 56 of DUT PCB 18. Once aligned in this manner, DUT PCB 18 is lowered until the lower surface 92 of DUT PCB 18 engages the upper surface 50 of socket plate 16. In this position, the contact fields 58 of DUT PCB 18 physically engage the compressible electrical contacts 49B of the capsules 49A held within the socket openings 54 of socket plates 16. In this way, the DUT PCB 18 is electrically connected to the electrical testing boards 49C of electrical testing components 48.

Once in this position, top plate 20 is placed on top of DUT PCB 18. This is accomplished by aligning the alignment openings 78 in top plate 20 with the upper end of alignment posts 26. Once in this position, top plate 20 is lowered onto testing system 10 until the lower surface of floating plate 82 engages the upper surface 90 of DUT PCB 18 or until the top plate 20 engages the upper end of the stop bars 84.

As the top plate 20 is aligned with the alignment posts 26, the locking posts 24 are simultaneously aligned with the cam members 62. More specifically when the locking posts 24 are in a disengaged position, the locking posts 24 are aligned with the cylindrical openings 70 in the cam members 62 and the keys or protrusions 76 attached to the locking posts 24 are aligned with the key slot openings 72 in the cam members 62.

Once in this position, the top plate is lowered in place. Once fully lowered, the actuating mechanism 22 is actuated, either by manual movement or by motorized movement. As the actuating mechanism 22 is moved, the rotatable member 110 that arm 120 directly connects to rotates thereby causing all other rotatable members 110 to similarly rotate. This rotation of rotatable member 110 simultaneously and evenly causes the rotation of the other rotatable members 110 by transferring this rotational movement through the arrangement of posts 112, through linkages 116 and into the other rotatable members 110.

As the rotatable members 110 rotate, so rotates the locking posts 24. As the locking posts 24 rotate out of their disengaged position, the keys or protrusions 76 rotate out of the key slot openings 72. As the keys or protrusions 76 rotate out of the key slot openings 72 the keys or protrusions 67 engage the angled or sloping cam surface 74 of cam members 62. As the locking posts 24 continue to rotate this causes the keys or protrusions 76 to slide over the cam surfaces 74 which has the effect of pulling the top plate 20 closer to and into tighter engagement with testing system 10. This progression continues until the locking posts 24 are fully rotated and the keys or protrusions 76 reach a plateau or level portion 74A at the end of the cam surface 74, and/or the keys or protrusions 76 engage the stop surface 74B at the end of the cam surface 74, at which point the top plate 20 is fully engaged and tightened against testing system 10 and the testing system 10 is ready for testing. As the top plate 20 is pulled lower the compressible members 80 vertically compress thereby applying pressure to force the DUT PCB 18 towards the frame member 14.

Once the system 10 is assembled, with the DUT PCB 18 and top plate 20 installed, to use the testing system 10, a DUT 96 is then placed in the electrical interconnect 94 such that the edges of the DUT 96 are aligned with the raised peripheral edge 98 of the electrical interconnect 94 and the contact points 100 in the upper surface of the electrical interconnect 94 receive, engage and electrically connect to the electrical contacts of the DUT 96. Once in this position, electrical signals are transmitted through the electrical testing components 48 and through the DUT 96.

More specifically, the electrical testing boards 49C send and receive electrical signals through the edge connectors of sockets 49G. These signals then transmit through the electrical leads of tester PCB 49F and into the capsules 49A. More specifically, the electrical signals pass through the compressible electrical contacts 49B of capsules 49A and into the contact fields 58 of DUT PCB 18. These electrical signals travel through the DUT PCB 18 and into the electrical interconnect 94. These electrical signals then pass through the electrical interconnect 94 and into the DUT 96. These electrical signals travel through the DUT 96 and back to the electrical testing boards 49C through the same or a similar path; and the process repeats. The electric testing components 48 measure these signals and determine whether the DUT 96 is conforming or non-conforming.

Once the test is complete, the DUT 96 is removed and another DUT 96 is inserted into the electrical interconnect 94 and the process is repeated.

This process is repeated until another type or style of DUT 96 needs to be tested at which point the DUT PCB 18 is removed using the opposite process described above. That is, the actuating mechanism 22 is rotated in an opposite direction until the keys or protrusions 76 are in a disengaged position from the cam members 62. Once disengaged, the top plate 20 is removed and the DUT PCB 18 is removed. Next, a new DUT PCB 18 that includes a electrical interconnect 94 configured specifically for the new DUT 96 to be tested is selected and the above-described process is repeated for installing the new DUT PCB 18 and testing the new DUT 96.

Rectangular and Square Arrangements: It is to be noted, that while a single rectangular testing device 10 is presented in the drawings having one or more rows of electrical testing boards 49C aligned on two, opposing, sides of the testing system 10, it is hereby contemplated that a square or cross shaped testing system may be utilized having four rows of electrical testing boards 49C, one row on each of the squared sides of testing aperture 86/center area 60 of DUT PCB 18. This arrangement allows for the use of additional electrical testing boards 49C. Also, another Double Wide: It is also to be noted, that the teachings herein apply to a wider version of the device shown in the drawings. That is, the depth of the device can be increased any amount to accommodate any number of electrical testing boards 49C and/or multiple electrical interconnects 94 and/or any sized or shaped DUT 96.

System Force, Deflection & Resistance: With reference to FIGS. 25-29 a cycler system 200 is shown in use with electrical interconnect testing device 10, which is described herein. Cycler system 200 is formed of any suitable size, shape and design and is configured to provide repeatable and reproducible measurement of electrical interconnect 94. In the arrangement shown, as one example, cycler system 200 includes a gantry 202 that extends over electrical interconnect testing device 10 that supports a actuator 204.

Gantry 202 is formed of any suitable size, shape and design and is configured to support actuator 204 above the electrical interconnect 94 and device under test 96 of electrical interconnect testing device 10 while facilitating movement of the actuator in the X-direction (e.g. left-to-right) and Y-direction (e.g. forward-to-back). In one arrangement, as is shown, gantry 202 includes a bottom plate 206 that is generally square or rectangular in shape, when viewed from the above, and is generally planar in shape when viewed from the front or side. In the arrangement shown, electrical interconnect testing device 10 is positioned on top of the upper surface of bottom plate 206, and in one arrangement is attached thereto by any manner, method or means such as screwing, bolting, locking or the like. The outward edges of bottom plate 206 includes rails 208 that facilitate movement of the actuator 204 in the Y-direction (e.g. forward-to-back). In the arrangement shown, rails 208 extend all or a portion of the forward-to-back length of bottom plate 206.

Gantry 202 includes a tower 210 that has opposing legs 212 that connect to an upper portion 214. Legs 212 connect at their lower end to rails 208 at a carrier 216. Carrier 216 is any device that connects to rails 208 and facilitates movement thereon. In the arrangement shown, the features of carrier 216 mate with the features of rails 208 such that carriers 216 slide upon rails 208. Also, in the arrangement shown, carrier 216 include a break mechanism 218. Break mechanism 218 is any device which when released allows for movement of carriers 216 on and over rails 208 and when engaged prevents movement of the tower 210 with respect to bottom plate 206. In the arrangement shown, break mechanism 218 is a locking screw activated by a rotatable knob, however any other arrangement is hereby contemplated for use such as a push button, a friction member, a cam member, a spring-loaded pin, or any other mechanism.

In the arrangement shown, the connection of opposing legs 212 to upper portion 214 form a hollow interior space 220 between opposing legs 212 and between the upper surface of bottom plate 206 and the lower edge of upper portion 214. Electrical interconnect testing device 10 is positioned within this hollow interior space 220. In the arrangement shown, when viewed from the front or back, legs 212 extend inward slightly as they extend upward such that the upper portion 214 is slightly narrower than the width of rails 208 in bottom plate 206. When viewed from the side, the sides of tower 210, (legs 212 and upper portion 214), are generally flat and planar and extend in approximate parallel spaced relation to one another. In the arrangement shown, legs 212 and upper portion 214 are formed of a single plate on the forward and back sides of tower 210 that are connected to side plate 222 positioned there between, which are connected together by a plurality of fasteners 224.

Upper portion 214 of tower 210 of gantry 202 includes an opening 226 that extends vertically through the upper portion 214 of tower 210 and facilitates connection to actuator 204. In the arrangement shown, as one example, opening 226 is generally square or rectangular in shape when viewed from above and includes rails 228 therein that extend in approximate perpendicular alignment to the rails 208 of bottom plate 206. Rails 228 extend in approximate parallel spaced relation to one another. In this arrangement, actuator 204 is connected to rails 228 by carriers 230. Carrier 230 is any device that connects to rails 228 and facilitates movement thereon. In the arrangement shown, the features of carrier 230 mate with the features of rails 228 such that carriers 230 slide upon rails 228. Also, in the arrangement shown, carriers 230 include a break mechanism 232. Break mechanism 232 is any device which when released allows for movement of carriers 230 on and over rails 228 and when engaged prevents movement of the actuator 204 with respect to bottom plate 206 and tower 210. In the arrangement shown, break mechanism 232 is a locking screw activated by a rotatable lever, however any other arrangement is hereby contemplated for use such as a push button, a friction member, a cam member, a spring-loaded pin, or any other mechanism. The connection of actuator 204 to rails 228 facilitates movement of the actuator 204 in the X-direction (e.g. left-to-right). In one arrangement, while movement in the Z-direction is automated by actuator 204, movement in the X-direction and Y-direction are performed manually. In another arrangement, movement in the X-direction and/or the Y direction are automated as is movement in the Z-direction by actuator 204.

Actuator 204 is formed of any suitable size, shape and design and facilitates vertical movement so as to press device under test 96 into electrical interconnect 94. In the arrangement shown, actuator 204 includes a post 234 that includes a pusher 236 connected to its lower end. Actuator 204 operates to vertically move post 234 and pusher 236 into device under test 96 and electrical interconnect 94, so as to test the electrical interconnect 94 at different vertical distances and forces as is further described herein. Actuator 204 may be an electrically controlled device, such as a solenoid or the like, a pneumatically controlled device, a hydraulically controlled device, or any other device which facilitates vertical movement.

Figure 42:
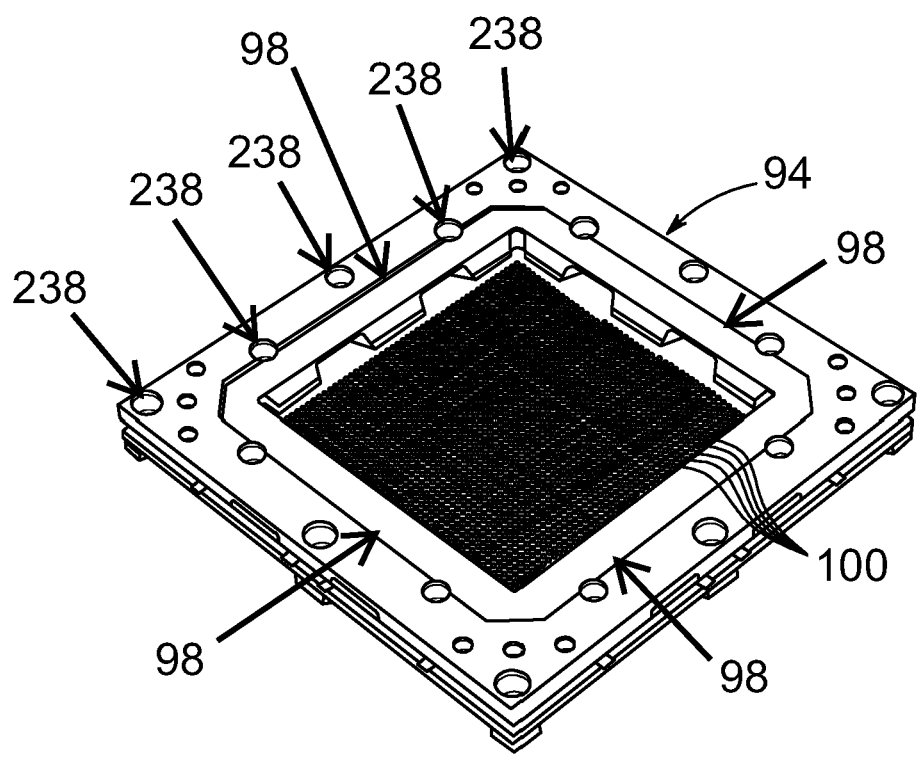
FIG. 42 is a perspective view of an example electrical interconnect for use with the electrical interconnect testing device.
Figure 43:
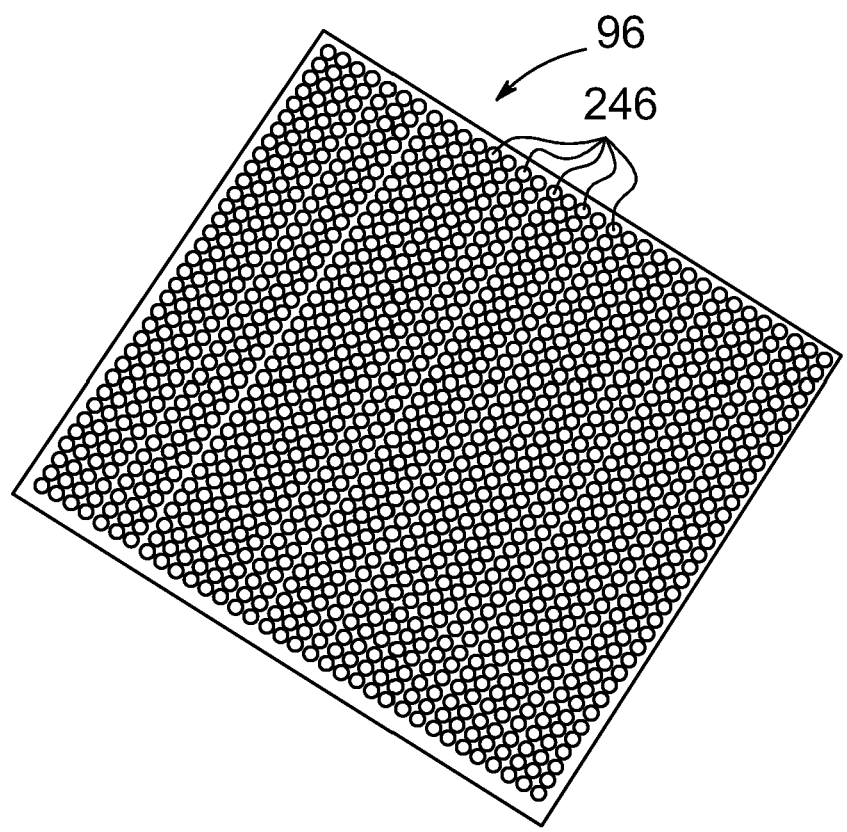
FIG. 43 is a perspective view of the bottom surface of a device under test used with the electrical interconnect testing device (which may be a solid reference standard, or it may be a more-sophisticated reference chip that is formed using printed circuit board or semi-conductor manufacturing processes)
Figure 44:
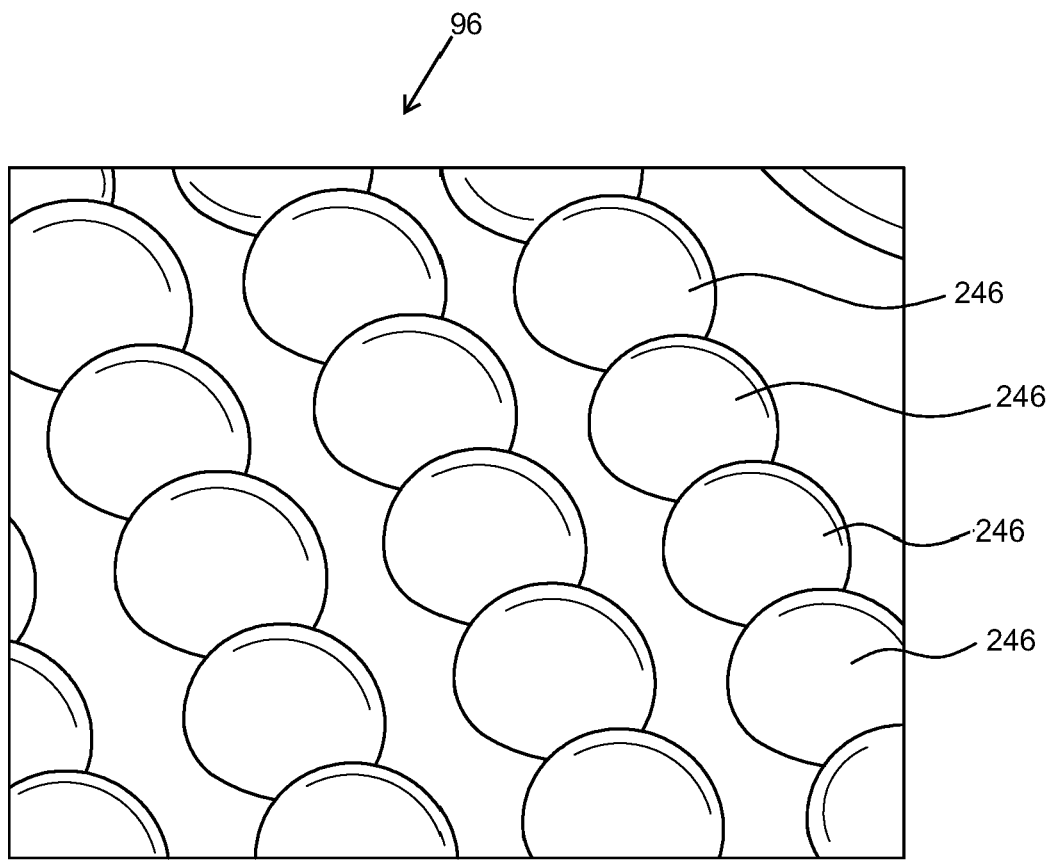
FIG. 44 is a close-up perspective view of the bottom surface of a device under test used with the electrical interconnect testing device (which may be a solid reference standard, or it may be a more-sophisticated reference chip that is formed using printed circuit board or semi-conductor manufacturing processes) shown in FIG. 43, the view showing the contact points of the device under test in detail.

With reference to FIG. 42, a close up perspective view of an example of an electrical interconnect 94 is shown. Electrical interconnect 94 is sized and shaped to receive a device under test (DUT) 96 therein, such as a semiconductor chip, a reference chip, or the like. In the arrangement shown, electrical interconnect 94 includes a raised peripheral edge 98 which surrounds and provides a border to a field of contact points 100 positioned approximately at the center of the electrical interconnect 94. In the arrangement shown, electrical interconnect 94 includes a plurality of openings 238 that are used to facilitate connection to DUT PCB 18, or a production tester device, by way of receiving conventional screws or bolts there through. Electrical interconnects 94 are custom designed to test the specific device under test 96.

Electrical interconnect 94 includes a plurality electrical contacts 100 positioned at its center within the raised peripheral edge 98 of electrical interconnect 94 which surrounds the field of electrical contacts 100. The electrical contact points 100 of electrical interconnect 94 electrically connect to electrical traces or leads that extend through DUT PCB 18 and electrically connect to the electrical contact fields 58 positioned in the lower surface 92 of DUT PCB 18. In this way, the DUT PCB serves to electrically connect the electrical interconnect 94, and any DUT 96 positioned within the electrical interconnect 94, to the top surface of the DUT PCB 18 to the electrical testing components 48 (capsules 49A, compressible electrical contacts 49B, electrical testing boards 49C, Tester PCBs 49f) positioned below the DUT PCB 18.

In one arrangement, as is shown, contact points 100 are known in the industry as pogo pins. A pogo pin is a device used in electronics to establish a (usually temporary) connection between two printed circuit boards. Named by analogy with the pogo stick toy, the pogo pin usually takes the form of a slender cylinder containing two sharp, spring-loaded pins. Pressed between two electronic circuits, the sharp points at each end of the pogo pin make secure contacts with the two circuits and thereby connect them together.

Figure 45B:
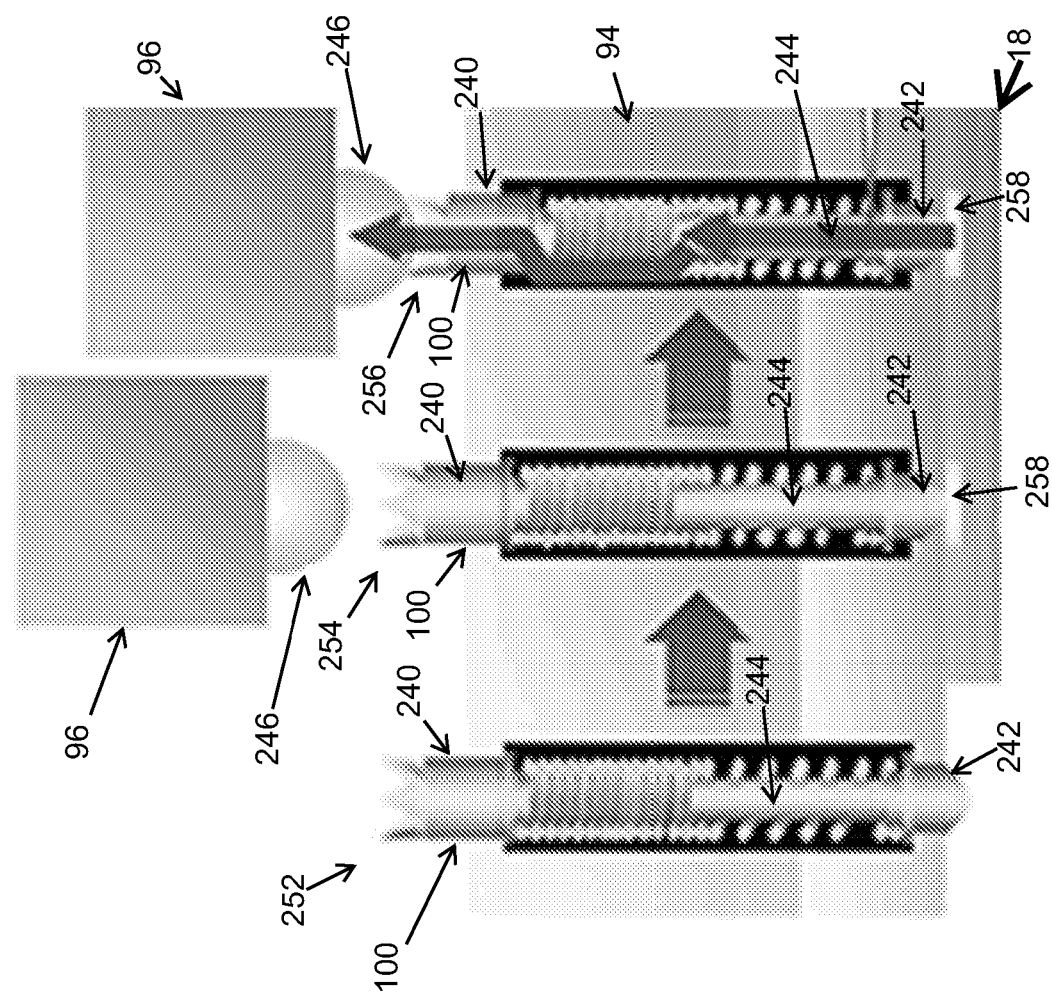
FIG. 45B is a side elevation view of an exemplary contact point in a free arrangement, where the contact point is held within the electrical interconnect but neither the upper end nor the lower end of the contact point is in engagement or electrical contact; a set arrangement, where the contact point is held within the electrical interconnect and the lower end of the contact point is in engagement and electrical contact with the contact pad of the device under test printed circuit board; and a contact arrangement, where the contact point is held within the electrical interconnect and the lower end of the contact point is in engagement and electrical contact with the contact pad of the device under test printed circuit board and the upper end of the contact point is in engagement and electrical contact with the contact point of the device under test.
Figure 45A:
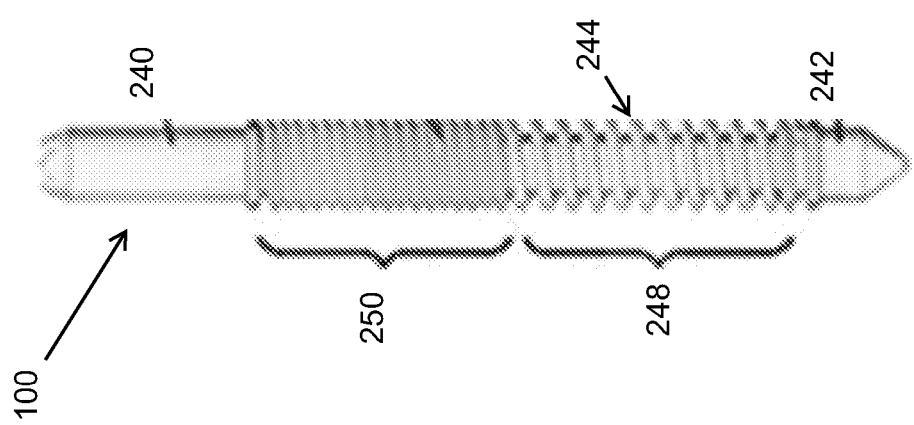
FIG. 45A is a side elevation view of an exemplary contact point for use with a electrical interconnect, the contact point being formed of an upper plunger, a lower plunger and a spring mechanism, the view showing the stroke of the contact point and the threaded section, the view also showing the points that help make electrical contact in the upper and lower ends of the contact point.
Figure 46:
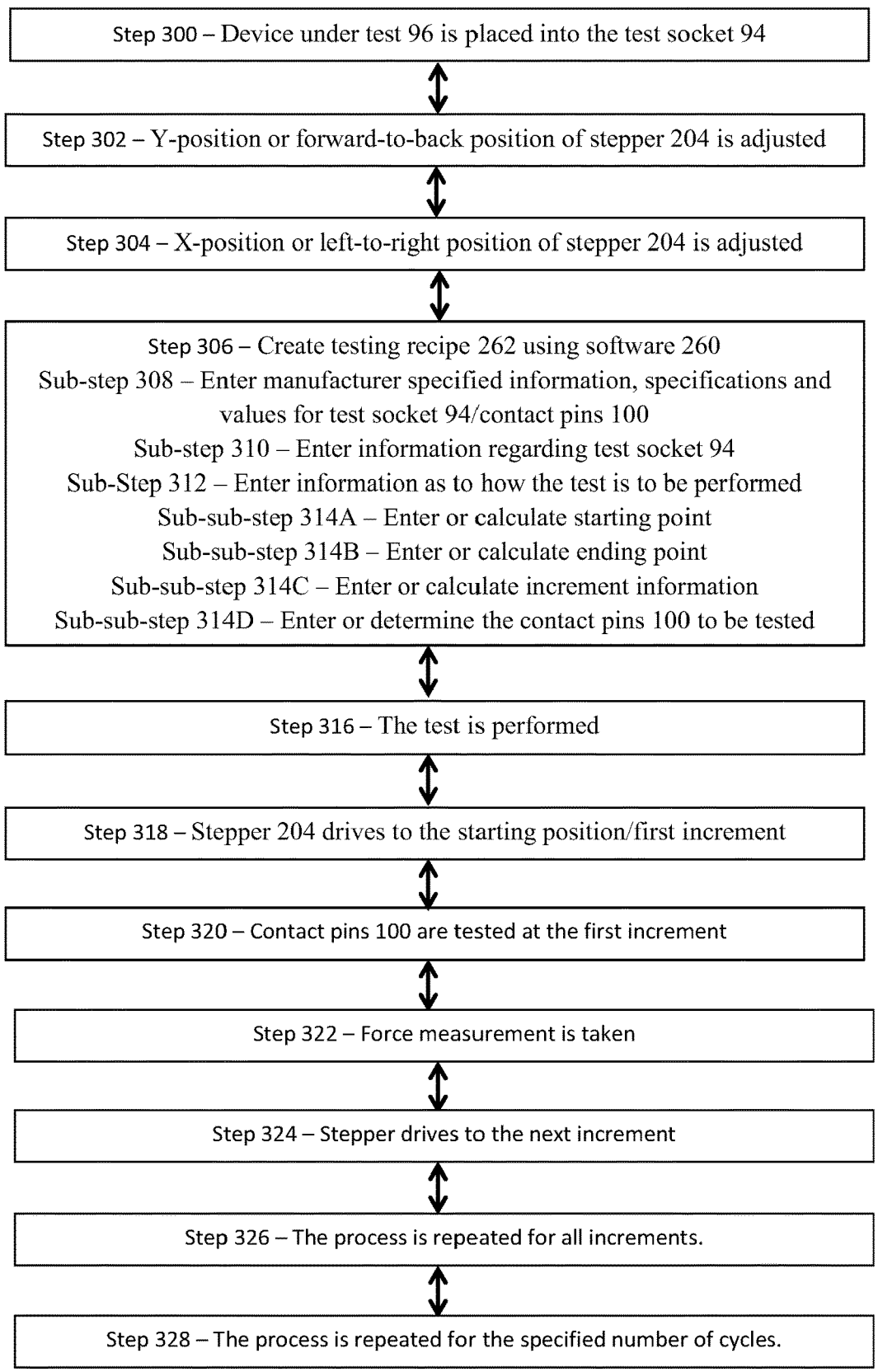
FIG. 46 is a plan view of the steps of a testing method.

With reference to FIG. 45A, an exemplary pogo pin is shown as an example of a contact point 100. As is shown, contact point 100 (pogo pin) includes an upper plunger 240, a lower plunger 242 and a spring member 244 positioned there between, among other components that facilitate electrical connection there between. In the arrangement shown, upper plunger 240 is generally cylindrical in shape and includes one or a plurality of pointed features in its upper end that help facilitate forming an electrical connection to a contact point 246 of device under test 96. Contact point 100 (pogo pin) also includes a lower plunger 242 that is generally cylindrical in shape and includes one or a plurality of pointed features in its lower end that help facilitate forming an electrical connection to a contact pad 240 in the upper surface 90 of device under test printed circuit board 18. A spring member 244 connects the inward facing sides of upper plunger 240 and lower plunger 242 and facilities the compression of the upper plunger 240 and lower plunger 242 as well as facilitates electrical connection between the upper plunger 240 and the lower plunger 242 throughout the range of compression between a fully extended position and a fully compressed position. In the arrangement shown, the upper plunger 240 has a hollow section in its lower end that is sized and shaped to receive the upper end of lower plunger 242 therein; however, the opposite arrangement is hereby contemplated for use.

This arrangement allows the upper plunger 240 and lower plunger 242 to compress upon one another until the upper edge of lower plunger 242 engages the upper edge of the hollow interior of upper plunger 240 at which point the contact point 100 is fully compressed and pressing it further may cause structural damage to the contact point 100. In an alternative arrangement, neither the upper plunger 240 and lower plunger 242 include a hollow interior and instead the inner end of the upper plunger 240 and lower plunger 242 abut one another when fully compressed.

The amount of distance a contact point 100 is capable of compressing is known as the stroke 248. The amount of stroke 248 as well as the amount of force required to compress contact point 100 to the optimum level is often a manufacturer specified value. As is also shown, the exterior surface of the lower portion of upper plunger 240 includes a threaded section 250, this threaded section 250 represents a fixed and non-compressible portion of the contact point 100.

With Reference to FIG. 45B, an exemplary contact point 100 is shown in various stages of use. At 252 contact point 100 is shown in what is known as a free arrangement, at 254 contact point 100 is shown in what is known as a set arrangement, and at 256 contact point 100 is shown in what is known as a contact position.

In a free arrangement, at 252, contact point 100 is installed within an opening in the electrical interconnect 94 as one of many contact points 100 and the upper end of the upper plunger 240 is not in electrical contact and the lower end of the lower point 242 is not in electrical contact. In this arrangement, contact point 100 is in a fully extended position or uncompressed position while being constrained within the electrical interconnect 94.

In a set arrangement, at 254, the lower end of lower plunger 242 is engaged with electrical contact pad 258 of the printed circuit board 18 and the upper end of the upper plunger 240 is not in electrical contact. In this arrangement, the contact point 100 of the electrical interconnect 94 is in electrical contact with the contact pad 258 of the printed circuit board 18. In this arrangement, due to the engagement between the lower end of the lower plunger 242 and the contact pad 258 of the printed circuit board 18 the contact point 100 is in a partially compressed state.

In a contact arrangement, at 256, the lower end of lower plunger 242 is engaged with electrical contact pad 258 of the printed circuit board 18 and. In this arrangement, the contact point 100 of the electrical interconnect 94 is in electrical contact with the contact pad 258 of the printed circuit board 18 and the contact point 246 of device under test 96. In this arrangement, due to the engagement between the lower end of the lower plunger 242 and the contact pad 258 of the printed circuit board 18, and the engagement between the upper end of the upper plunger 240 and the contact point 246 of the device under test 96, the contact point 100 is in a compressed state. In the contact arrangement, at 256, the contact point 100 is supposed to be compressed to its optimum distance as well as force so that it forms the optimum electrical connection between the contact point 246 of the device under test 96 and the contact pad 258 of the printed circuit board 18.

Generally, manufacturers of contact points 100 provide as standard specifications the optimum and maximum stroke 248 of a particular contact point 100 as well as the amount of force required to compress the contact point 100 to the optimum and maximum level. Generally, the users of these contact points 100 (manufacturers of semiconductor chips) simply accept this information and adopt it into their manufacturing processes without testing and verifying its accuracy. This is largely because there are no available testing devices or known methods for accurate testing. As such, the users of these contact points 100 blindly drive their testing equipment to these standard specifications (such as optimum height and/or optimum force) without knowing whether this provides optimum results.

Manufacturers of contact points 100 characterize and specify their contact points 100 in an isolated mechanical and electrical setup to remove any external factors from the collected data. While this is effective at characterizing a single contact point, this may not lead to an accurate characterization of a plurality of contact points 100 within a electrical interconnect 94. This can lead to miss-correlation of performance when placed in a system application where other mechanical and electrical factors may impact performance or lifespan of one or more contact points 100.

In the arrangement presented, the electrical interconnect testing device 10 with the cycler 200 closely mimics the application environment and all external factors that may be encountered in the production use environment which leads to accurately understanding the performance characteristics of not just one contact point 100 in isolation, but instead to understanding the performance characteristics of all the contact points 100 held within a specific electrical interconnect 94. With this information, the user can drive the contact points 100 not to a manufacturer specification that was determined in isolation but instead to the optimum amount of compression and/or force for optimum performance of that particular electrical interconnect 94. That is, the lowest amount of resistance across all contact points 100 while ensuring electrical connection to all contact points 100 while also ensuring that the contact points 100 are not compressed further than they need to be which can lead to premature failure.

In addition, the electrical interconnect testing device 100 with the cycler 200 allows a user to characterize both electrical and mechanical performance along with lifespan of the electrical contacts 100 in a fast, easy and automated manner. That is, the electrical interconnect testing device 100 with the cycler 200 can be used to repeatedly test an electrical interconnect 94 to determine the dynamic changes of the electrical interconnect 94 as the number of cycles increase. This testing can be accomplished in temperature and other environmental conditions similar to those present in the production environment which can lead to further accuracy.

Furthermore, the sample size capabilities of the electrical interconnect testing device 10 with the cycler 200 provides for exceptional levels of accuracy and detail. Traditionally, users only sample a small number of electrical contacts 100, such as one to up to thirty. This is due to the limited electrical test capabilities of existing testing systems. In one arrangement, the electrical interconnect testing device 10 presented herein has 5320 kelvin test channels, meaning that every contact point 100 can be tested, not just one or a handful of contact points 100. Even more test channels are contemplated for use with minor modifications to the system which can allow for the number of test channels to be doubled, tripled, quadrupled or more. This leads to statistically significant improvement in the sample population and therefore statistically significant improvement in the results. Furthermore, it would take a significant amount of time to collect this amount of data using existing systems (on the order of a few weeks to a few years).

Furthermore, the accuracy of the actuator 204, which is capable of driving downward at 1-micron increments, or sub-micron increments, facilitates exceptionally high levels of accuracy and the collection of massive amounts of data. Traditionally, users only sample at the manufacturer-specified resistance or vertical height, or in exceptional cases in a small number of heights or force levels. This is due to the limited electrical test capabilities of existing testing systems and the lack of integration with these limited systems with a actuator 204. In one arrangement, the electrical interconnect testing device 10 presented herein is capable of testing up to 5320 kelvin test channels (or more) at every micron or sub-micron increments, and this process can be repeated (or cycled) multiple times meaning that every contact point 100 can be tested at every micron or every sub-micron level or increment throughout its stroke, not just at one or a handful of points a few times. This leads to statistically significant improvement in the sample population and therefore statistically significant improvement in the results. Furthermore, it would take a significant amount of time to collect this amount of data using existing systems (on the order of a few weeks to a few years).

The massive amount of data that is collected using the electrical interconnect testing device 10 with the cycler 200 is transported to a graphing function where the characteristics of the overall electrical interconnect 94 can be graphed revealing what is actually occurring to the electrical interconnect 96 itself throughout the stroke 248.

In addition, recipes can be created using the electrical interconnect testing device 10 with the cycler 200 where the increments of the actuator 204 can be set and the contact points 100 can be established. The increments can be set based on distance, as an example, the actuator 204 drives down in one-micron increments and takes a measurement. Alternatively, the increments can be set based on force, as an example, the actuator 204 drives down until a predetermined amount of resistance is met. At each increment, the recipe can call for testing any one contact point 100, all of the contact points 100, a random grouping of the contact points 100 or a predetermined group of the contact points 100. In addition, the recipe can be set to cycle the test any number of times, from once to many hundreds or thousands of times.

The electrical interconnect testing device 10 with the cycler 200 provides data with exceptionally high levels of statistical accuracy with an exceptional amount of time. The speed of the testing reduces the cost of the testing as compared to prior systems and methods. The detailed information reveals the actual characteristics of the electrical interconnect 94 throughout its operating range.

Method of Testing:

As one example, electrical interconnect testing device 10 is attached to bottom plate 206 of cycler system 200 under gantry 202. In this position the gantry 202 passes over electrical interconnect testing device 10 as it slides on rails 208. In this position, the actuator 204 moves over electrical interconnect testing device 10 in the X-direction as it slides on rails 228.

The proper DUT PCB 18 is placed on the electrical interconnect testing device 10 and the desired electrical interconnect 94 is attached to the upper surface 90 of DUT PCB 18. Care is taken when attaching the electrical interconnect 94 to the DUT PCB 18 such that the lower plungers 242 of the plurality of contact points 100 that extend out of the bottom surface of the electrical interconnect 94 align with, engage and electrically connect to the plurality of electrical contact pads 258 in the upper surface 90 of the DUT PCB 18. Once in this position, the electrical interconnect 94 is tightened in place using fasteners that extend through openings 238 in electrical interconnect 94 and into the DUT PCB 18. As the electrical interconnect 94 is tightened against the DUT PCB 18 the contact points 100 of the electrical interconnect 94 partially compress, or more specifically the lower plunger 242 moves closer to upper plunger 240 as the spring mechanism 244 partially compresses. In this position, the contact points 100 of electrical interconnect 94 are electrically connected to the electrical testing boards 49C through traces that extend through DUT PCB 18 and through electrical contact pads 258.

The top plate 20 is tightened against the DUT PCB 18 using cam members 62.

Next, a device under test 96 is placed in the electrical interconnect 94. As the device under test 96 is placed within the electrical interconnect 94, the raised peripheral edges 98 help guide the device under test 96 into alignment such that the electrical contact points 246 in the bottom surface of the device under test 96 align with the electrical contacts 100 extending upward from the center of the electrical interconnect 94.

Once in place, theoretically the upper end of upper plungers 240 engage the contact points 100 of device under test 96. However, in practice, due to countless variables, such as dimensional variation, contamination, oxidation, etc., the device under test 96 must be pressed into the electrical interconnect 94 a distance or with an amount of force. As the device under test 96 is pressed into the electrical interconnect 94 the lower ends of contact points 246 engage the upper end of upper plungers 240. As force is applied to the device under test 96 and contact points 246 of the device under test 96 are forced into the sharp points at the upper end of the contact points 100 of electrical interconnect 94 which helps to form an electrically conductive connection between the contact point 100 of the electrical interconnect 94 and the contact point 246 of the device under test 96. In this position, the contact points 246 of the device under test 96 and the contact points 100 of electrical interconnect 94 are electrically connected to the electrical testing boards 49C through traces that extend through DUT PCB 18 and through electrical contact pads 258.

As force is applied to the device under test 96 the contact points 100 of the electrical interconnect 94 partially compress, or more specifically the upper plunger 240 moves closer to the lower plunger 242 as the spring mechanism 244 partially compresses. In this position, the contact points 100 of electrical interconnect 94 are electrically connected to the electrical testing boards 49C through traces that extend through DUT PCB 18 and through electrical contact pads 258.

If the device under test 96 is not moved down far enough, or if enough force is not applied to the device under test 96 then the potential exists that not all of the contact points 100 of the electrical interconnect 94 will engage the contact points 246 of the device under test 96, this is due to varying heights of contact points 100 of electrical interconnect 94 and/or varying heights of contact points 246 of device under test 100. Or, even if the contact points 100 of the electrical interconnect 94 engage the contact points 246 of the device under test 96, there may be contamination, oxidation or other reasons why an electrically conductive connection is not formed there between. It is for these reasons why a certain amount of additional force is applied, and the device under test 100 is moved downward into the electrical interconnect 94, to ensure that all of the electrical contacts 100 of electrical interconnect 94 engage and form an electrically conductive connection with the electrical contacts 246 of device under test 96.

As the device under test 100 is moved downward, the electrical contact points 100 of the electrical interconnect 94 compress thereby taking up dimensional variance between the electrical interconnect 94 and the device under test 96. However, if the device under test 96 is driven too far into the electrical interconnect 94 the contact points 100 of the electrical interconnect will bottom out, meaning that the inner edge of the upper plunger 240 will engage the inner edge of the lower plunger 242 at which point additional force could damage or destroy the electrical contact 100 and/or the entire electrical interconnect 94.

The purpose of testing a electrical interconnect 94 is to determine whether the electrical interconnect 94 is adequately performing. If the electrical interconnect 94 is not adequately performing, meaning that the electrical contacts 100 are imparting excess resistance to the tests of the device under test 96 then when used in production semiconductor chips (device under test 96) are likely to be unnecessarily rejected or scrapped. As such, this can be a very costly error.

However, prior to the electrical interconnect testing device 10 with cycler 200 there was no adequate or comprehensive way to test the electrical interconnect 94 to determine whether it was functioning properly, not to mention functioning optimally. Instead users of electrical interconnects 94 merely accepted the manufacturers specifications as to how much force to apply and/or how far to drive the device under test 96 into the electrical interconnect 94. Instead of accepting this information as a so-called "known" the electrical interconnect testing device 10 with cycler 200 can be used to test the functioning of the electrical interconnect 94 throughout its operational range, and on one, some or all electrical contact points 100 at a plurality of increments.

Test Example: Using the electrical interconnect testing device 10 with cycler system 200, at step 300, the device under test 96 is placed into the electrical interconnect 94.

At step 302, the Y-position, or forward-to-back position of actuator 204 is manually adjusted, or adjusted by motorized, pneumatic, hydraulic or electrical movement in the Y-direction such that the pusher 236 and post 234 are directly above the device under test 96. This may be accomplished manually by disengaging break mechanism 218 and sliding gantry 202 on rails 208 until the proper position is achieved at which point the break mechanism 218 is again engaged thereby locking the Y-position of the gantry 202 and actuator 204 in place.

At step 304, the X-position, or left to right position of actuator 204 is manually adjusted, or adjusted by motorized, pneumatic, hydraulic or electrical movement in the X-direction such that the pusher 236 and post 234 are directly above the device under test 96. This may be accomplished manually by disengaging break mechanism 232 and sliding actuator 204 on rails 228 until the proper position is achieved at which point the break mechanism 232 is again engaged thereby locking the X-position of the actuator 204 in place.

At step 306, using software 260 (not shown in detail) configured to control operation of the electrical interconnect testing device 10 and cycler system 200 a testing recipe 262 (not shown in detail) is created by the user.

At sub step 308, the user enters into the testing recipe 262 some or all of the manufacturer specified information, specifications and/or values of the contact points 100 of the electrical interconnect 94 such as, for example, distance of stroke 248, maximum force 264, and optimum force 266, the amount of current they are rated to handle, the amount of resistance they are intended to have, among any other manufacturer provided or specified value.

At sub step 310, the user enters into the testing recipe 262 information regarding the electrical interconnect 94, such as its configuration, the number of contact points 100, its physical size, its position, its dimensions, its shape, its features, and any other information.

At step 312, using software 260 the user enters information as to how the testing is to be performed. This is accomplished by setting how or when or where the testing will begin, how or when or where the testing will stop, and the increments where the testing will occur between the start position and the stop position.

At sub step 314A, the starting point is entered or calculated. The starting point can be determined by any manner, method or means.

In one arrangement, the testing recipe 262 is configured to drive the pusher 236 downward until a particular force is encountered, which may be when the pusher 236/actuator 204 first senses engagement with the device under test 96 or when the pusher 236/actuator 204 first senses a predetermined amount of force with the device under test 96. (Note: the term force is used to describe resistance pressure of push-back imparted on the actuator 204 by the electrical interconnect 94/device under test 96). The testing recipe 262 may be configured to begin testing at the position where this force is first encountered, or the testing recipe 262 may be configured to back up a certain distance or force before beginning testing.

In another arrangement, the testing recipe 262 is configured to drive the pusher 236 downward until a particular vertical position is encountered, which may be when the pusher 236/actuator 204 first engages the device under test 96 or when the pusher 236/actuator 204 achieves a certain position within the stroke 248 of contact points 100.

In yet another arrangement, the actuator 204 or gantry 202 is equipped with a sensing device that senses a surface of the device under test 96 or electrical interconnect 94 or another surface. This may be an optical sensor, a laser sensor, an infrared sensor, a pressure sensor, or any other sensor. With this position information, the starting point is calculated.

At sub step 314B, an ending point is entered or calculated. The ending point can be determined by any manner, method or means. In one arrangement, once the starting point is entered, the ending point is similarly entered. In another arrangement, once the starting point is entered, the ending point is calculated based on the starting point, such as a predetermined distance below the starting point. The ending point may be when a particular position is achieved or when a particular force is encountered.

At sub step 314C, increment information is entered or calculated. The increments are where the measurements are taken.

In one arrangement, the number of increments are entered and the software 260 calculates the position of these increments by dividing the distance between the starting point and the ending point by the number of increments and the actuator 204 drives to each of these increments and the electrical interconnect testing device 10 takes a measurement. In this example, as an example the user enters fifty increments, or one-hundred increments into software 260 and the software 260 divides the distance between the starting point and the ending point by the number of increments.

In another arrangement, the distance of the increments or between the increments is entered and the actuator 204 drives downward the specified distance and stops at each increment from the starting point to the ending point and the electrical interconnect testing device 10 takes a measurement at each increment. In this example, as an example the user enters one micron or two microns or three microns as the distance of the increments or between the increments and the actuator 204 drives to each position and the electrical interconnect testing device 10 takes a measurement.

In another arrangement, the force of the increments or between the increments is entered and the actuator 204 drives downward until the specified force is achieved and stops at each increment from the starting point to the ending point and the electrical interconnect testing device 10 takes a measurement. In this example, as an example the user enters 0.1 kg or 0.2 kg or 0.3 kg into software 260 and the actuator 204 drives downward until the desired resistance force is encountered and electrical interconnect testing device 10 takes a measurement. Once a measurement is taken the actuator 204 again drives down until the next incremental force is encountered, and the process is repeated.

At sub step 314D, the user sets the electrical contacts 100 that are to be tested. In one arrangement, the user sets software 260 to test all electrical contacts 100 at all increments. In another arrangement, the user sets software 260 to test one electrical contact 100 at all increments, which may or may not be the same electrical contact 100 at each increment. In another arrangement, the user sets software 260 to test some of the electrical contacts 100 at all increments, which may or may not be the same electrical contacts 100 at each increment. In another arrangement, the user sets software 260 to test a random sample of the electrical contacts 100 at all increments.

At sub step 314E, the user sets the number of cycles. That is, is this test to be performed one time, or several times or hundreds of times, or thousands of times. In this example, as an example the user enters 50 cycles or 100 cycles into software 260.

At step 316, after the device under test 96 is placed in the electrical interconnect 94 and the actuator 204 is centered over the device under test 96, the test itself is performed according to the parameters of the testing recipe 262.

At step 118, the actuator 204 drives to the starting point. This may be accomplished by driving directly to the starting point which is a known position, a calculated position or a sensed position. Alternatively, the actuator 204 drives downward until a specified resistance force is encountered and either the testing begins at that point which is the starting point, or the actuator 204 backs up a specified distance or until the resistance force diminishes to a predetermined amount, which then becomes the starting point.

At step 320, the electrical interconnect testing device 10 performs the test at the starting point which is essentially the first increment or the first incremental position. In doing so, the electrical interconnect testing device 10 tests one, some or all of the contact points 100 that are specified in the testing recipe 262 to be tested at the first increment. In doing so, the electrical testing boards 49C pass electrical signals through the traces in the DUT PCB 18 which pass through the electrical contact pads 258 of the DUT PCB 18. These electrical signals pass through the contact points 100, or more specifically the electrical signal passes through the lower plunger 242, (in some arrangements through the spring mechanism 244), through the upper plunger 240 and into the contact point 246 of device under test 96 (which in a testing environment is often a solid gold or gold plated reference standard or shorting device that is designed to reduce resistance or provide a predictable amount of resistance for each contact point 100). These electrical signals then pass through the device under test 96, back through another contact point 100 of the electrical interconnect 94 in the manner described herein, back through the traces in the DUT PCB 18 and into the same or a different electrical testing board 49C. During this process the resistance is measured for the electrical contact points 100 that the electrical signal passes through. One, some or all of the electrical contact points 100 can be tested at the increment. Each contact point 100 can be tested against any other contact point 100, any group of contact points 100 or all contact points 100 in the electrical interconnect 94. This information is saved and/or exported to a controller or computing system that has software 260 used in association with the electrical interconnect testing device 10 for graphing and analysis purposes.

At step 322, a force measurement is taken by actuator 204, or more specifically with a sensor or other mechanism associated with actuator 204. This information is saved and/or exported to a controller or computing system that has software 260 used in association with the electrical interconnect testing device 10 for graphing and analysis purposes.

At step 324, once the electrical tests have been performed and the force measurement has been taken, the actuator 204 drives to the next increment. In one arrangement, the next increment is a predetermined distance away from the previous increment and the actuator 204 drives until it arrives at this next position. In another arrangement, the next increment is an incremental increase in force from the previous increment and the actuator 204 drives until it arrives at the increased (or decreased) force. Once the actuator 204 drives to the next increment, the contact points 100 are tested and the force is sensed.

At step 326 process is repeated in an incremental manner until the actuator 204 drives to the last increment or the ending point is tested. After the ending point is tested, the actuator 204 raises.

At step 328, if the testing recipe 262 includes cycling, the testing procedure is repeated. This continues until the number of cycles specified in the testing recipe 262 is performed. Result Analysis and Graphing: The results of the test can be used to analyze the performance of the electrical interconnect 94 as it actually performs, providing verification/validation of the manufacturer specifications for single interconnects.

Figure 31:
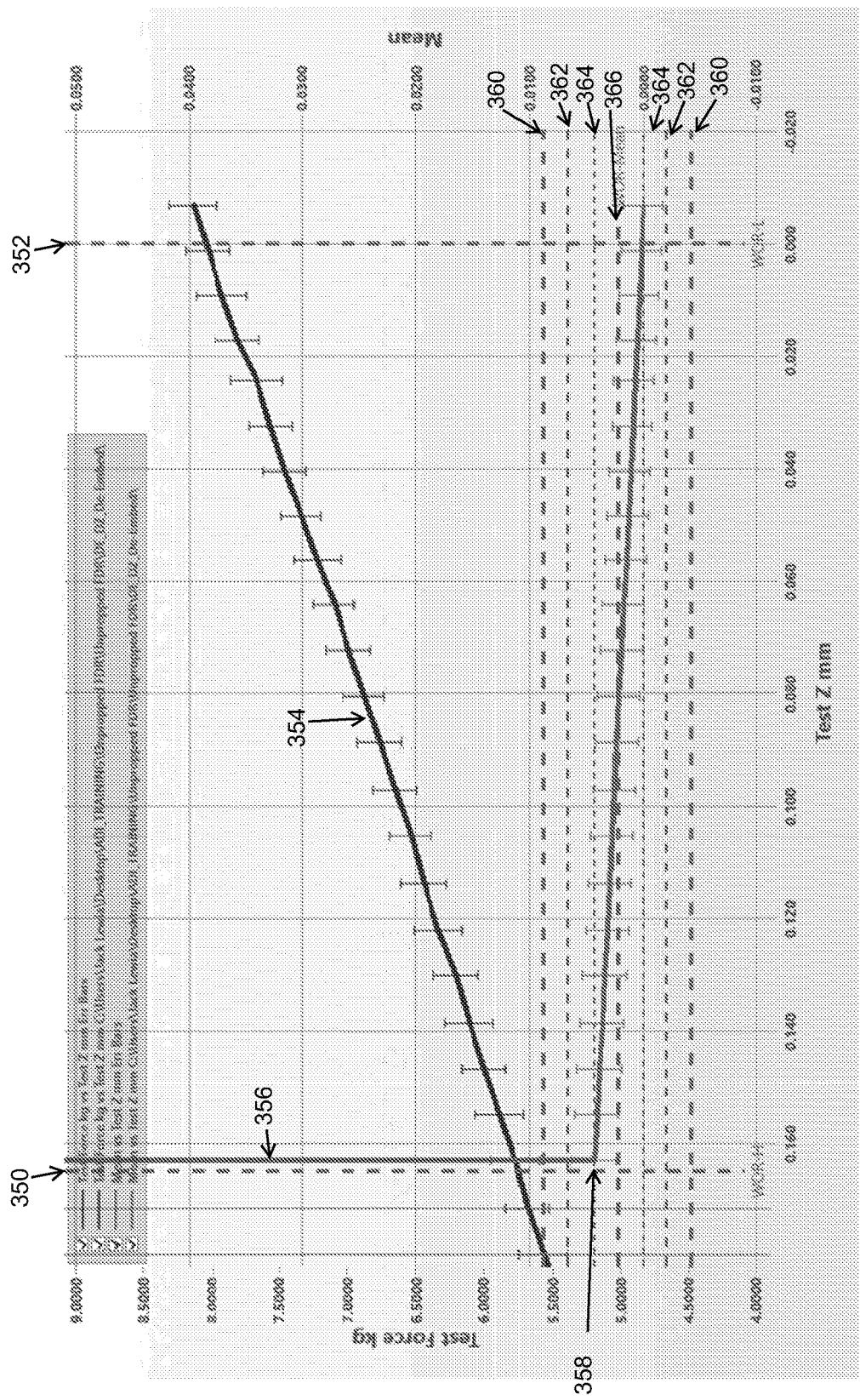
FIG. 31 is an exemplary graph of data from an example test using the system presented in FIGS. 25-29, the graph showing "Test Force kg v. Test Z mm Error Bars," "Test Force kg v. Test Z mm," "Mean v. Test Z mm Error Bars," and "Mean v. Test Z mm"

With reference to FIGS. 30 and 31 the results of a sample test of an example electrical interconnect 94 is shown.

The "Series #" identifies which parameters are used. With reference to the chart of FIG. 32, the X-axis is test height or "Test Z mm" which is the vertical height of the increment or the position of the particular iteration of the test. The vertical or Y-axis to the left is "Test Force kg" or the amount of force applied and/or sensed by the actuator 204 at that particular vertical height or increment. The vertical or Y-axis to the right is the "Mean" resistance, or the resistance sensed or encountered at that particular vertical height or increment. In this example, Series #1 uses the left Y-axis, or "Test Force kg" and Series #2 uses the right Y-axis, or "Mean" resistance.

The "N" is the number of cycles, which is the number of times the test is repeated. The more times the test is performed the higher the confidence in the results or the better the statistical significance of the results. More cycles mean more accurate results. Any number of cycles can be used.

The "Test Count" means the number of increments or the number of points the actuator 204 drives between the starting point and the ending point, inclusive. That is, the actuator 204 drives to this number of positions where, at each position or increment, individual tests are performed. In this example thirty-one increments are used including the starting point and the ending point. Any number of increments can be used and the actuator 204 can have one micron or sub one micron resolution.

The "X-Parm" is the parameter of the X-axis for that Series #, which is in this case is the Z-height of the actuator 204 for both Series #1 and Series #2.

The "Y-Parm" is the parameter of the Y-axis for that Series #. In this example, the Y-Parm for Series #1 is the "Test Force kg" which is the left Y-axis, and the Y-Parm for Series #2 is the "Mean" resistance.

The "Mean" "Min" "Max" and StdDev" represent the mean, minimum, maximum and standard deviation of the force measurement throughout the working range (from starting point to the ending point). These measurements are not applicable to the resistance measurement (Series #2).

The "WOR Mean" "WOR Min" "WOR Max" and "WOR StdDev" represent the mean, minimum, maximum and standard deviation of the resistance measurement throughout the working range (or WOR)(from starting point to ending point). These measurements are not applicable to the force measurement (Series #1).

With reference to the graph at FIG. 31, the dashed line at 350 represents the maximum height of the working range, which is a user entered number and/or a specification from the manufacturer of the electrical interconnect 94 or contact points 100. This represents the highest point the actuator 204 will be at when the first measurement is taken, also known as the starting point. Similarly, the dashed line at 352 represents the minimum height of the working range, which is a user entered number and/or a specification from the manufacturer of the electrical interconnect 94 or contact points 100. This represents the lowest point the actuator 204 will be at when the last measurement is taken, also known as the ending point.

The line at 354 represents the mean line, or in this case the mean force line and utilizes the Y-axis at the left side of the chart (Test Force kg) and correlates to Series #1 (on FIG. 30). This line represents the mean force applied by actuator 204 at each increment. The vertical lines that cross line 354 are error bars at one-sigma from the mean in this example, but can represent any deviation amount such as two-sigma, three sigma or any other amount. As is seen in this graph, the force steadily increases in a generally straight and linear manner throughout the working range with the force resistance increasing as the actuator 204 continues to drive downward into the electrical interconnect 94. This graph represents an electrical interconnect 94 that performs as would be expected and as is desired. That is, the harder the contact points 100 are pressed, the more the springs therein compress and the more the contact points 100 push back, again, as is expected. If the contact points 100 were to bottom out, meaning that the springs fully compressed and the upper plunger 240 engages the lower plunger 242 this line would spike at that point as the resistance would substantially increase. This line 354 reveals that the contact points 100 did not bottom out through the working range as the line 354 is linear throughout the working range.

The line at 356 represents the mean resistance line and utilizes the Y-axis at the right side of the chart (Mean, resistance in ohms) and correlates to Series #2 (on FIG. 30). This line represents the mean resistance of the contact point(s) 100 tested at each increment. The vertical lines that cross line 356 are error bars at one-sigma from the mean in this example, but can represent any deviation amount such as two-sigma, three-sigma or any other amount. As is seen in this graph, at first, just within the maximum height of the working range 350 the resistance is essentially immeasurable which represents that no contact has been made between the contact points 246 of device under test 96 and the contact points 100 of electrical interconnect 94, and/or the pusher 236 of actuator 204 has not yet engaged the device under test 96. At point 358, the slope of line 356 dramatically changes which represents the first increment or the first test where electrical contact is present between the contact points 246 of device under test 96 and the contact points 100 of electrical interconnect 94. From there, as the pusher 236 of actuator 204 continues to push further and further downward (and the force increases) the resistance sensed across the contact points 100 of electrical interconnect 100 decreases. This graph represents a electrical interconnect 94 that performs as would be expected and as is desired throughout the working range (reference numerals 350 to 352). That is, the harder the contact points 100 are pressed, the less the resistance, as is expected. This is because as more force is applied to the device under test 96, the points in the upper end of upper plunger 240 tend to form a better electrical contact with the contact points 246 of the device under test 96; and as more force is applied to the device under test 96, the points in the lower end of lower plunger 242 tend to form a better electrical contact with the electrical contact pads 258 of the DUT PCB 18; and as more force is applied to the device under test 96 the internal electrical contact between upper plunger 240, lower plunger 242 and/or spring mechanism 244 may also improve. The linearity of this line through the working range reveals that the electrical interconnect 94 and contact points 100 are working as expected. Dashed line 360 represents the three-sigma average, dashed line 362 represents the two-sigma average, line 364 represents the one-sigma average, and dashed line 366 represents the mean, or in this case the mean average resistance across the working range (reference numerals 350 to 352).

With reference to the graph of FIG. 31, in one arrangement, as one example, the test is performed by driving actuator 204 down until the force entered into software 260 of testing recipe 262 is encountered (which can be the manufacturer specified force or a user selected force), which in this example is ~8.0 kg. At this point the, the minimum height of the working range 352 is established and the Test Z mm (the X-axis in the graph, but the Z-axis for the actuator 204) is set at zero. In one arrangement, this also represents the ending point, or the last increment of the testing. From there, the actuator 204 drives upward the distance entered into software 260 of testing recipe 262 (which can be the manufacturer specified distance or stroke 248 of contact points 100, or a user selected distance), which in this example is ~0.164 mm. At this point the, the maximum height of the working range 350. In one arrangement, this also represents the starting point, or the first increment of the testing. In this way, the working range (350 to 352) is established without knowing the actual position of the actuator 204 or the relative position of the actuator 204, which is essentially inconsequential to the test.

Figure 32:
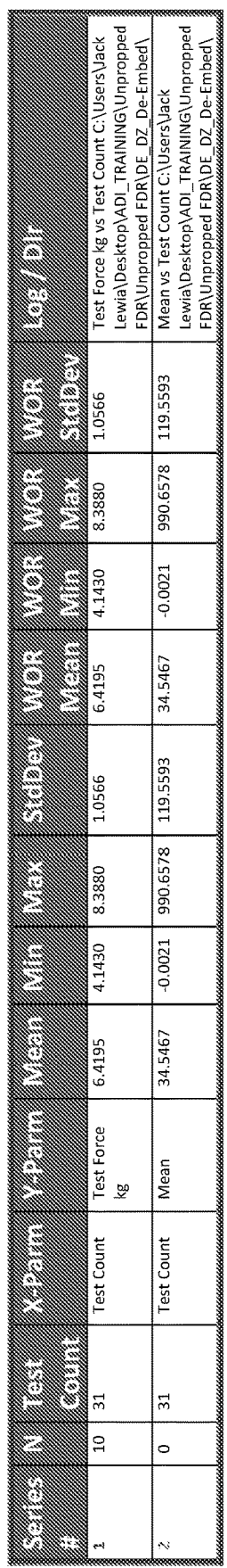
FIG. 32 is an exemplary chart of data from an example test using the system presented in FIGS. 25-29, the chart showing "Raw Cumulative Scatter FDR chart per contactor for N FDR datasets"
Figure 33:
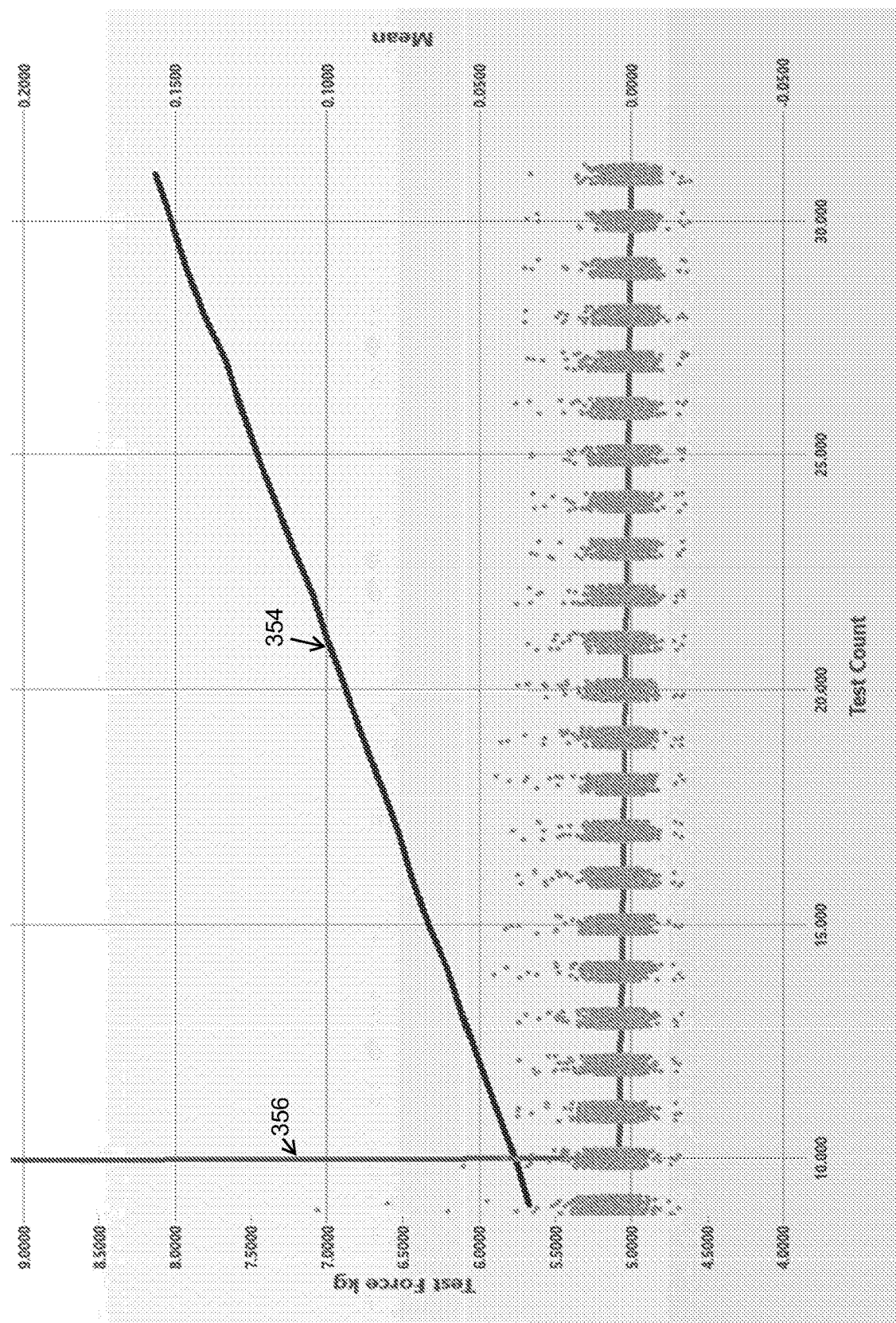
FIG. 33 is a graph of data from an example test using the system presented in FIGS. 25-29, the graph showing Test Force kg. v. Test Count and Mean vs Test Count.

With reference to FIGS. 32 and 33, the same data set is presented on a different chart. In this example, a scatter chart is presented with the X-axis of the chart representing the Test Count. Presenting this information in this manner reveals additional details about the test results. (Note some of the WOR calculations are skewed because no WOR bars are present on this graph). As is shown at the left portion of this chart reveals that at the initial measurements several tests had high resistance values (referring to the several points to the left of practically-vertical portion of line 356 that are substantially above the cluster of points). These points indicate that these contact points 100 were not in full or complete electrical contact with the device under test 96 at this force/increment. This is understandable as this may indicate physical variations within the device under test 96 or electrical interconnect 94, or it may indicate shorter contact points 100, or any other variation. As these points, well above the mean revert to the mean as greater force is applied is also expected and indicates that these variations/outliers were compensated by pressing the device under test 96 further into electrical interconnect 94.

This chart (FIG. 33) is also representative of the level of detail that the system 10 can provide. Namely, the system 10 can indicate precisely how many contact points 100 and exactly which points 100 are outliers and therefore just these contact points 100 can be fixed or replaced, (instead of throwing the entire electrical interconnect 94 away or replacing all the contact points 100—which can lead to greater problems when perfectly functioning contact points 100 are replaced).

Figure 35:
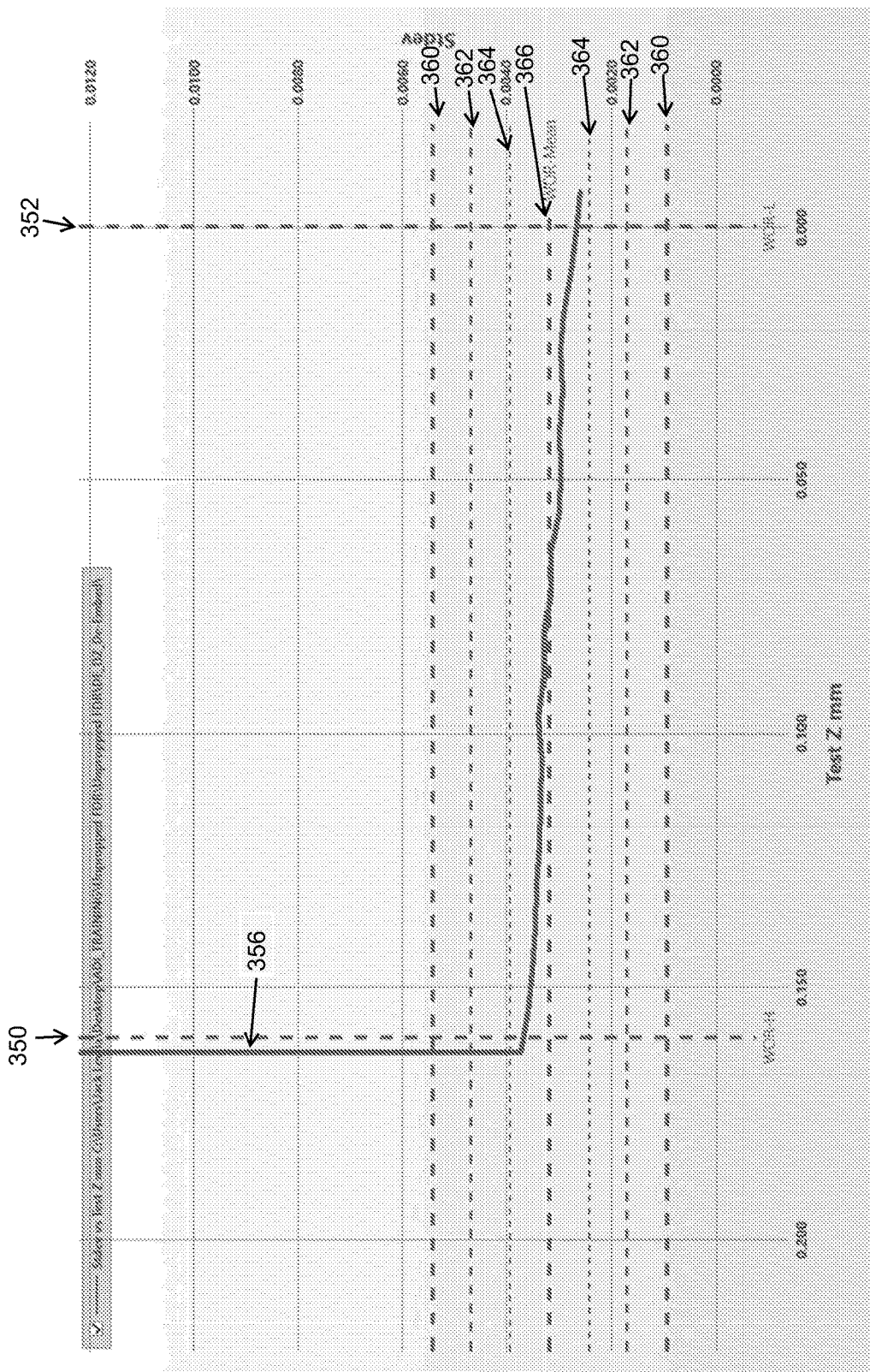
FIG. 35 is an exemplary graph of data from an example test using the system presented in FIGS. 25-29, the graph showing "Stdev. v. Test Z mm"

With reference to FIGS. 34 and 35, the same data set is presented on a different chart. In this example, the standard deviation of the contact resistance of contact points 100 is charted verses displacement. This chart reveals less linearity in the mean resistance line.

Figure 37:
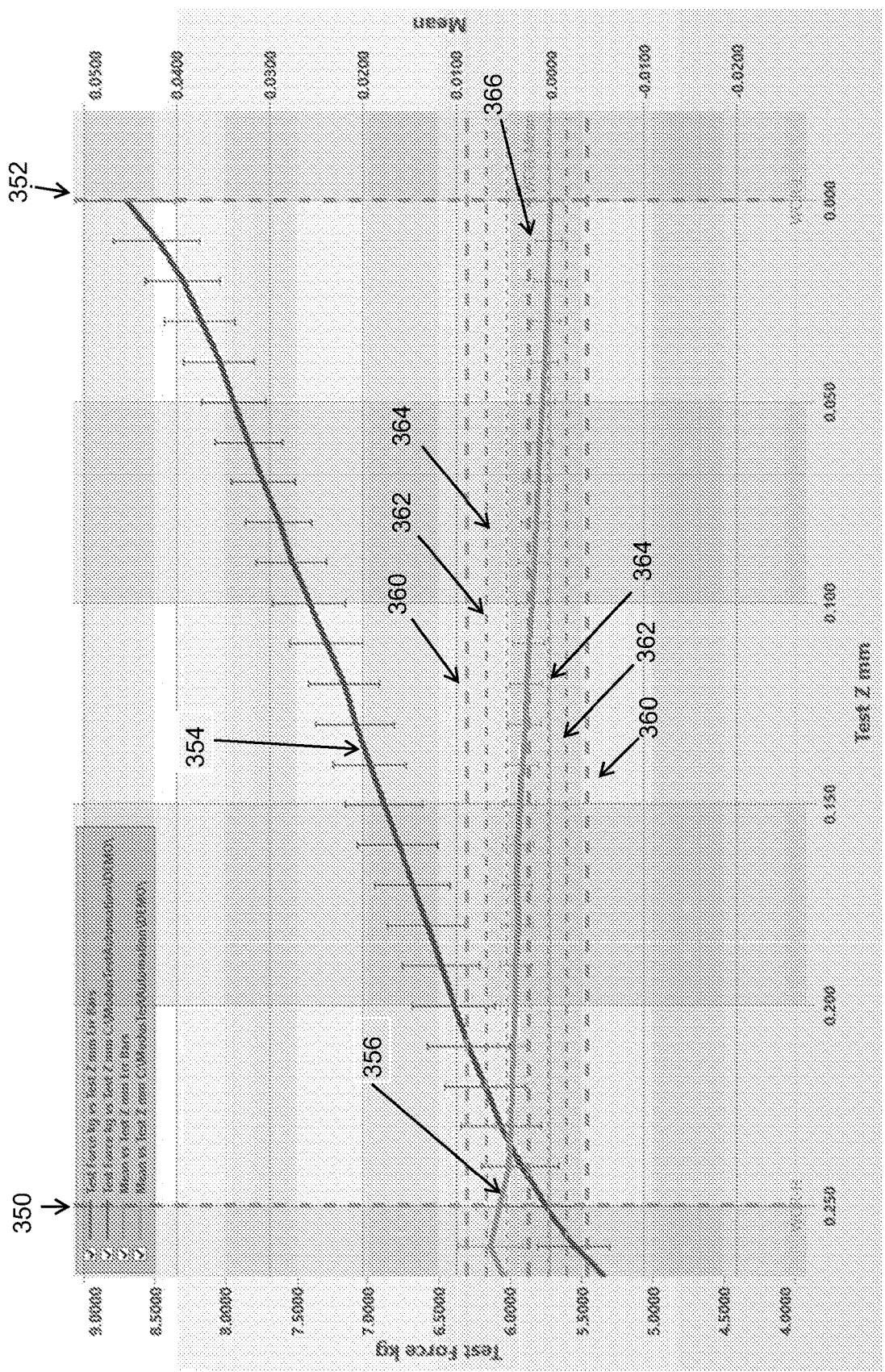
FIG. 37 is a second exemplary graph of data from an example test using the system presented in FIGS. 25-29, the graph showing "Test Force kg v. Test Z mm Error Bars," "Test Force kg v. Test Z mm," "Mean v. Test Z mm Error Bars," and "Mean v. Test Z mm"
Figure 39:
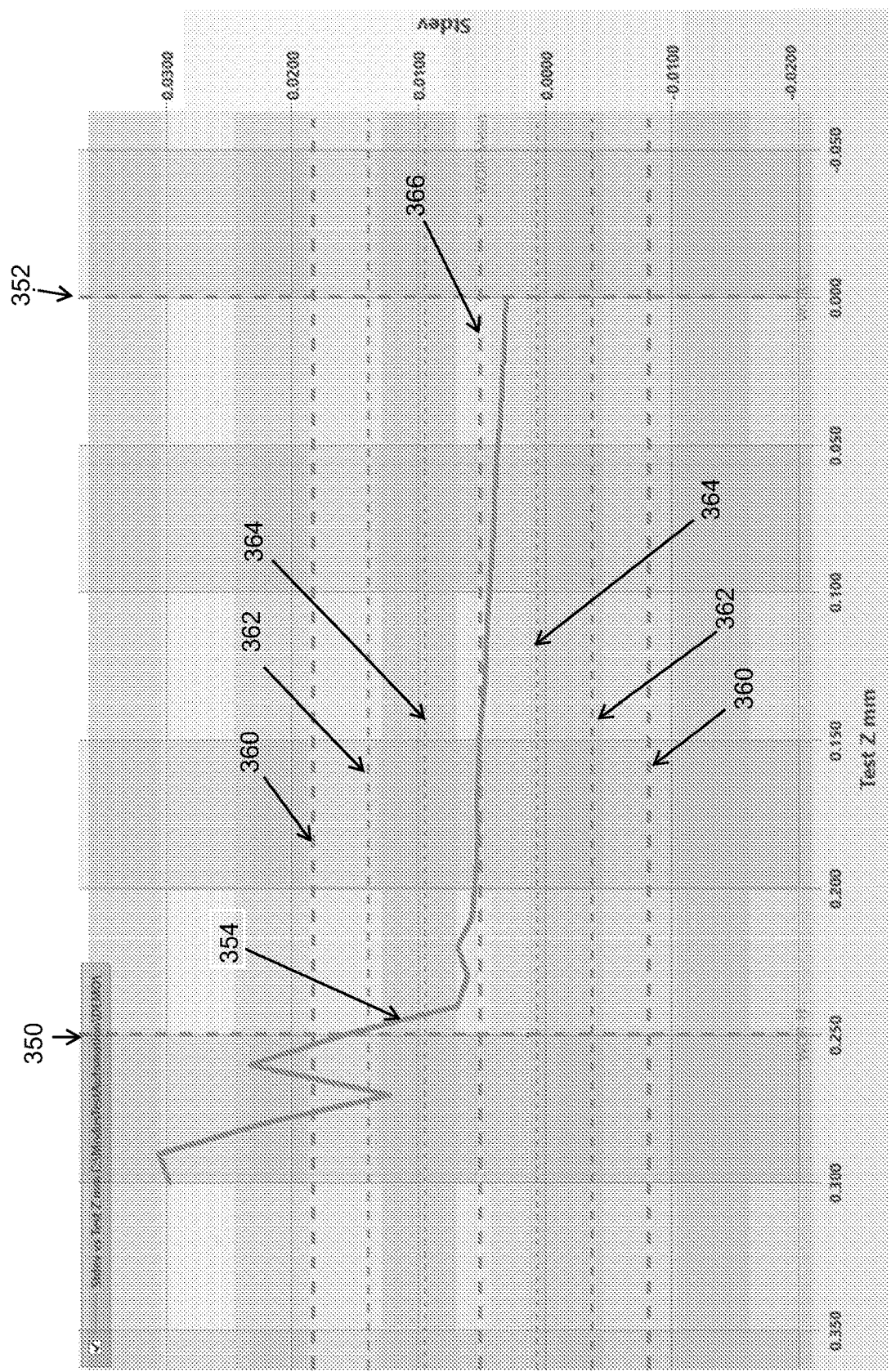
FIG. 39 is a second exemplary graph of data from an example test using the system presented in FIGS. 25-29, the graph showing "Stdev v. Test Z mm"
Figure 41:
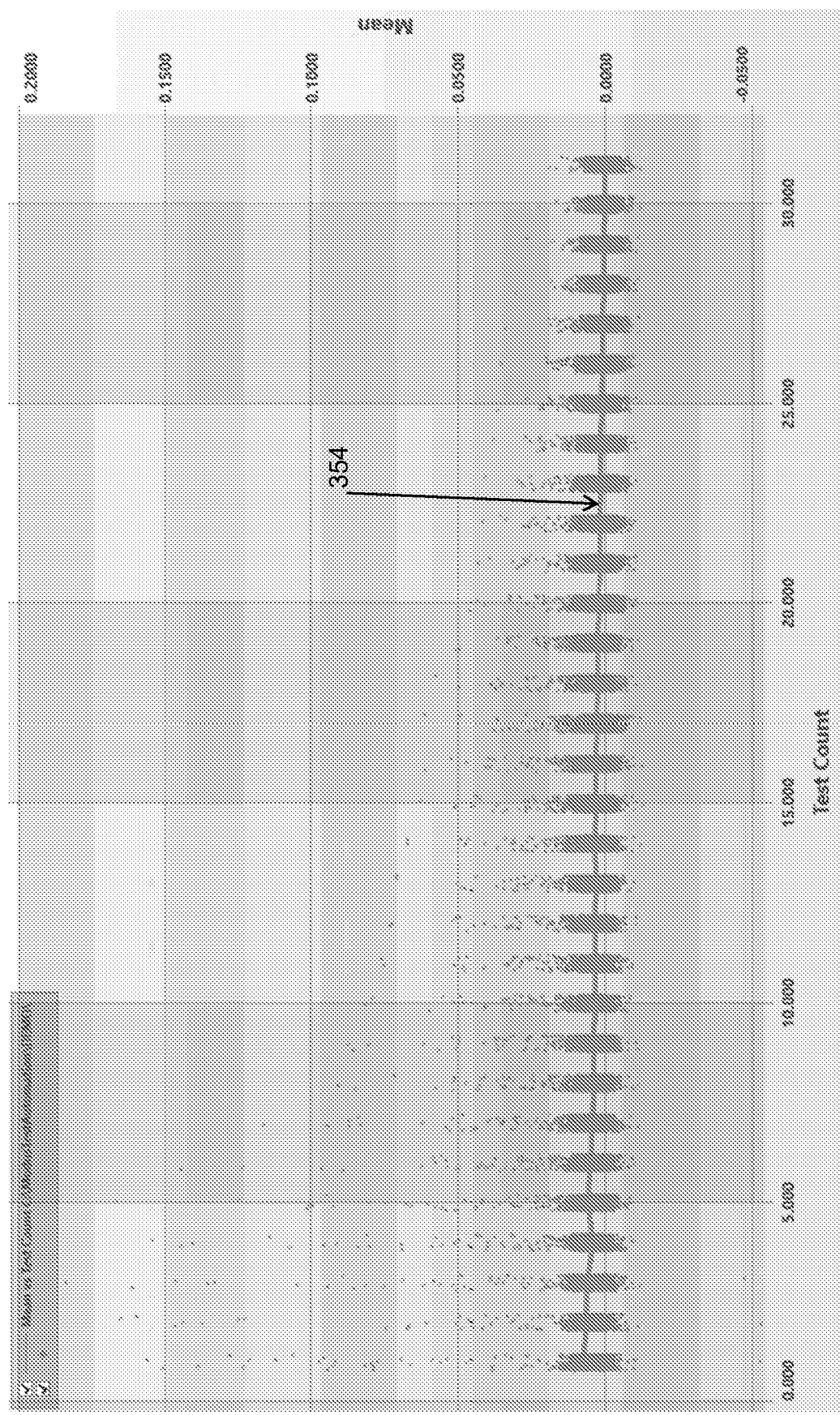
FIG. 41 is a second exemplary graph of data from an example test using the system presented in FIGS. 25-29, the graph showing "Mean v. Test Count"

With reference to FIGS. 36-41, a second exemplary set of data and accompanying charts and graphs are presented from an example test using the system presented in FIGS. 25-29. More specifically, FIG. 36 is a chart of data showing "Filtered Cumulative SFDR per contactor for N FDR(s)"; FIG. 37 is a graph showing "Test Force kg v. Test Z mm Error Bars," "Test Force kg v. Test Z mm," "Mean v. Test Z mm Error Bars," and "Mean v. Test Z mm"; FIG. 38 is a chart showing "STD-DEV of CRES vs. displacement/Pin x versus contactor array for N. FDR(s) mean"; FIG. 39 is a graph showing "Stdev v. Test Z mm"; FIG. 40 is a the chart showing "Raw Cumulative Scatter FDR chart per contactor for N FDR datasets; and FIG. 41 is a graph showing "Mean v. Test Count".

Any other number of charts and graphs can be generated based on the massive amounts of data generated by electrical interconnect testing device 10 that can reveal countless features and properties related to the performance of electrical interconnect 94. Charts like these can be produced for every contact point 100 of electrical interconnect 94 (and there may be thousands or tens of thousands of contact points), for any group of contact points 100 or for all contact points 100. Charts like these can be produced for a wide working range, or down to the sub-micron level were several tests are performed within every micron of stroke 248. The information provided by electrical interconnect testing device 10 is actual performance data of the entire electrical interconnect 94 in an application practically identical to actual-use. As such, the accuracy of this information is substantially better than other testing systems and processes and closely reflects how the electrical interconnect will perform in the manufacturing process.

In addition, this information can be gathered over any number of cycles, from one cycle to several thousand or tens of thousands of cycles. Information gathered by cycle count tests can reveal the durability of electrical interconnect 94 and the dynamic changes in the performance of electrical interconnect 94 over time. This information can be used to establish maintenance procedures, contact point replacement procedures or test and verification procedures.

With the information provided by electrical interconnect testing device 10, the proper or optimum vertical height and/or force can be determined for each electrical interconnect 94. In addition, the performance characteristics of the electrical interconnect 94 can be determined throughout the working range of the contact points 100 and on any level of granularity from an all-point average to each and every point.

From the above discussion, it will be appreciated that a quick change small footprint testing system and method of use is presented that improves upon the state of the art.

Specifically, the quick change small footprint testing system and method of use is presented: quickly converts between configurations for testing different semiconductor chips; easily converts between configurations for testing different semiconductor chips; is easy to use;

provides accurate testing for semiconductor chips; can be used with a wide variety of semiconductor chips; is inexpensive; long useful life; has a small footprint; minimizes the amount of space required to test a variety of semiconductor chips; minimizes the capital cost for testing equipment for testing a variety of semiconductor chips; provides for quick removal of and replacement of DUT PCBs having electrical interconnects thereon; is high quality; and is durable, among countless other advantages and improvements.

It will be appreciated by those skilled in the art that other various modifications could be made to the device without parting from the spirit and scope of this disclosure. All such modifications and changes fall within the scope of the claims and are intended to be covered thereby.

What is claimed:

1. A method of testing an electrical interconnect, the steps comprising:
   providing an electrical interconnect testing device;
   providing an electrical interconnect having a plurality of contact points;
   attaching the electrical interconnect to the electrical interconnect testing device;
   providing a device under test having a plurality of contact points;
   aligning the plurality of contact points of the device under test with the plurality of contact points of the electrical interconnect;
   pressing the device under test into the electrical interconnect with a plurality of different levels of force; and
   taking at least one measurement of at least one electrical property at the plurality of different levels of force.

2. The method of claim 1, further comprising the step of taking a position measurement at the plurality of different levels of force.

3. The method of claim 1, wherein the at least one electrical property is resistance; and
   wherein the measurement of the at least one electrical property is taken on one of the plurality of contact points of the electrical interconnect.

4. The method of claim 1, wherein the measurement of the at least one electrical property is taken on a group of the plurality of contact points of the electrical interconnect.

5. The method of claim 1, wherein the measurement of the at least one electrical property is taken on all of the plurality of contact points of the electrical interconnect.

6. The method of claim 1, further comprising:
   providing an actuator configured to press on the device under test in the electrical interconnect;
   moving the actuator in a plurality of increments thereby pressing the device under test into the electrical interconnect with the plurality of different levels of force;
   wherein the actuator is held within a gantry;
   wherein the actuator facilitates movement in the Z axis or vertical axis to press down upon the device under test; and
   wherein the gantry facilitates movement in the X axis and Y axis.

7. The method of claim 1, further comprising the step of cycling the device under test through the plurality of different levels of force multiple times to provide statistically improved results.

8. The method of claim 1, wherein pressing the device under test into the electrical interconnect with the plurality of different levels of force includes moving the device under test to a plurality of height increments.

9. The method of claim 1, further comprising the step of providing software associated with the electrical interconnect testing device and creating a testing recipe that specifies the plurality of different levels of force and specifies the plurality of contact points of the electrical interconnect that are tested.

10. The method of claim 1, further comprising the step of outputting results of the test and graphing the results.

11. The method of claim 1, further comprising the step of selecting an optimum vertical height for testing based on results of the test.

12. The method of claim 1, further comprising the step of selecting an optimum force for testing based on results of the test.

13. The method of claim 1, wherein the device under test is a shorting device or a reference standard.

14. A test method, the steps comprising:
   providing an electrical interconnect testing device;
   providing an electrical interconnect having a plurality of contact points;
   attaching the electrical interconnect to the electrical interconnect testing device;
   providing a semiconductor chip device having a plurality of contact points;
   aligning the plurality of contact points of the semiconductor chip device with the plurality of contact points of the electrical interconnect after the electrical interconnect has been attached to the electrical interconnect testing device such that the plurality of contact points of the semiconductor chip device connect with the plurality of contact points of the electrical interconnect;
   pressing the semiconductor chip device into the electrical interconnect with a plurality of different levels of force; and
   wherein the electrical interconnect testing device is capable of taking a resistance measurement on one of the plurality of contact points of the electrical interconnect, or a combination of the plurality of contact points of the electrical interconnect at the plurality of different levels of force.

15. The method of claim 14, further comprising taking a position measurement at the plurality of different levels of force.

16. The method of claim 14, wherein the semiconductor chip device is a shorting device or a reference standard.

17. The method of claim 14,
wherein the resistance measurement is taken on one of the plurality of contact points of the electrical interconnect.

18. The method of claim 14, wherein the resistance measurement is taken on a group of the plurality of contact points of the electrical interconnect.

19. The method of claim 14, wherein the resistance measurement is taken on all of the plurality of contact points of the electrical interconnect.

20. The method of claim 14, further comprising:
providing an actuator configured to press on the semiconductor chip device in the electrical interconnect;
moving the actuator in a plurality of increments thereby pressing the semiconductor chip device into the electrical interconnect with the plurality of different levels of force;
wherein the actuator is held within a gantry;
wherein the actuator facilitates movement in the Z axis or vertical axis to press down upon the semiconductor chip device; and
wherein the gantry facilitates movement in the X axis and Y axis.

21. The method of claim 14, wherein pressing the semiconductor chip device into the electrical interconnect with the plurality of different levels of force includes moving the semiconductor chip device to a plurality of height increments.

22. The method of claim 14, further comprising outputting results of the test and graphing the results.

23. The method of claim 14, further comprising the step of selecting an optimum vertical height for testing based on results of the test.

24. The method of claim 14, further comprising the step of selecting an optimum force for testing based on results of the test.

25. An apparatus, comprising:
an electrical interconnect testing device;
an electrical interconnect having a plurality of contact points,
one or more connectors, the connectors configured to attach the electrical interconnect to the electrical interconnect testing device;
wherein the electrical interconnect is configured to receive a device under test;
wherein the electrical interconnect includes a raised peripheral edge configured to align
a plurality of contact points of the device under test with the plurality of contact points of the electrical interconnect;
an actuator;
wherein the actuator is configured to press the device under test into the electrical interconnect with a plurality of different levels of force; and
wherein the electrical interconnect testing device is configured to take at least one resistance measurement at the plurality of different levels of force.

26. The apparatus of claim 25, wherein the electrical interconnect testing device is configured to take a position measurement at the plurality of different levels of force.

27. The apparatus of claim 25, wherein the electrical interconnect testing device is configured to take a resistance measurement on one of the plurality of contact points of the electrical interconnect.

28. The apparatus of claim 25, wherein the electrical interconnect testing device is configured to take a resistance measurement on a group of the plurality of contact points of the electrical interconnect.

29. The apparatus of claim 25, wherein the electrical interconnect testing device is configured to take a resistance measurement on all of the plurality of contact points of the electrical interconnect.

30. The apparatus of claim 25, wherein the actuator is held within a gantry, wherein the actuator facilitates movement in the Z axis or vertical axis to press down upon the device under test, and wherein the gantry facilitates movement in the X axis and Y axis.

31. The apparatus of claim 25, wherein the actuator is configured to cycle through the plurality of different levels of force multiple times to provide statistically improved results.

32. The apparatus of claim 25, wherein the electrical interconnect testing device is configured to output results of a test and graph the results.

33. The apparatus of claim 25, wherein the electrical interconnect testing device is configured to select an optimum vertical height for testing based on results of a test.

34. The apparatus of claim 25, wherein the device under test is a shorting device or a reference standard.

35. A method, the steps comprising:
providing at least one electrical interconnect testing device;
providing at least one electrical interconnect having a plurality of contact points;
attaching the at least one electrical interconnect to the at least one electrical interconnect testing device;
providing at least one device under test having a plurality of contact points;
aligning the plurality of contact points of the at least one device under test with the plurality of contact points of the at least one electrical interconnect;
pressing the at least one device under test into the at least one electrical interconnect with a plurality of different levels of force; and
taking at least one measurement of at least one electrical property at the plurality of different levels of force.

36. The method of claim 35, further comprising the step of taking a position measurement at the plurality of different levels of force.

37. The method of claim 35, wherein the at least one electrical property includes resistance; and
wherein the at least one measurement of the at least one electrical property is taken on one of the plurality of contact points of the at least one electrical interconnect.

38. The method of claim 35, wherein the at least one device under test is a shorting device or a reference standard.

39. A method, the steps comprising:
providing at least one electrical interconnect testing device;
providing at least one electrical interconnect having a plurality of contact points;
attaching the at least one electrical interconnect to the at least one electrical interconnect testing device;
providing at least one device under test having a plurality of contact points;

aligning the plurality of contact points of the at least one device under test with the plurality of contact points of the at least one electrical interconnect;

measuring at least one electrical property while pressing the at least one device under test into the at least one electrical interconnect to determine an effective test range of the at least one electrical interconnect for at least one testing parameter.

40. The method of claim 39, further comprising, using the at least one electrical interconnect, testing a set of devices with the at least one testing parameter in the determined effective test range.

41. The method of claim 39, further comprising determining an optimum value for the at least one testing parameter.

42. The method of claim 39, further comprising determining an optimum value for the at least one testing parameter;

wherein the at least one testing parameter includes height of the at least one device under test relative to the at least one electrical interconnect.

43. The method of claim 39, further comprising determining an optimum value for the at least one testing parameter;

wherein the at least one testing parameter includes a level of force that the at least one device under test is pressed into the at least one electrical interconnect.

44. The method of claim 39, wherein the measuring of the at least one electrical property while pressing the at least one device under test into the at least one electrical interconnect includes pressing the at least one device under test into the at least one electrical interconnect to a plurality of positions.

45. The method of claim 39, wherein the at least one device under test is a shorting device or a reference standard.

46. The method of claim 39, wherein the measurement of the at least one electrical property is taken on a group of the plurality of contact points of the at least one electrical interconnect.

47. The method of claim 39, wherein the measurement of the at least one electrical property is taken on all of the plurality of contact points of the at least one electrical interconnect.

* * * * *